United States Patent
Krajewski et al.

(10) Patent No.: US 12,538,634 B2
(45) Date of Patent: Jan. 27, 2026

(54) MECHANICALLY STRONG CONNECTIONS FOR PEROVSKITE-SILICON TANDEM SOLAR CELLS

(71) Applicant: Swift Solar Inc., San Carlos, CA (US)

(72) Inventors: Todd Krajewski, Mountain View, CA (US); Tomas Leijtens, Redwood City, CA (US)

(73) Assignee: Swift Solar Inc., San Carlos, CA (US)

( * ) Notice: Subject to any disclaimer, the term of this patent is extended or adjusted under 35 U.S.C. 154(b) by 8 days.

(21) Appl. No.: 18/459,175

(22) Filed: Aug. 31, 2023

(65) Prior Publication Data

US 2025/0081712 A1    Mar. 6, 2025

Related U.S. Application Data

(63) Continuation of application No. 18/458,959, filed on Aug. 30, 2023.

(51) Int. Cl.

| | | |
|---|---|---|
| *H10K 39/18* | (2023.01) | |
| *H10K 30/57* | (2023.01) | |
| *H10K 30/89* | (2023.01) | |
| *H10K 39/00* | (2023.01) | |
| *H10K 39/12* | (2023.01) | |
| *H10K 39/15* | (2023.01) | |
| *H10K 71/20* | (2023.01) | |

(Continued)

(52) U.S. Cl.
CPC ............ *H10K 39/18* (2023.02); *H10K 30/57* (2023.02); *H10K 30/89* (2023.02); *H10K 39/12* (2023.02); *H10K 39/15* (2023.02); *H10K 39/601* (2023.02); *H10K 71/20* (2023.02); *H10K 71/60* (2023.02); *H10K 85/50* (2023.02)

(58) Field of Classification Search
CPC ........ H10K 30/57; H10K 39/18; H10K 39/12; H10K 39/601; H10K 39/15; H10K 85/50; H10F 19/40; H10F 77/215; H10F 10/172; H10F 10/19
See application file for complete search history.

(56) References Cited

U.S. PATENT DOCUMENTS 5,620,528 A * 4/1997 Schade ................ H10F 77/211
                                                                    136/244
7,122,398 B1    10/2006 Pichler
(Continued)

FOREIGN PATENT DOCUMENTS

EP        4174961 A1     5/2023
JP     2005038990 A  *  2/2005
(Continued)

OTHER PUBLICATIONS

WO-2023037326-A1 English machine translation (Year: 2023).*
(Continued)

*Primary Examiner* — Andrew J Golden
(74) *Attorney, Agent, or Firm* — Aikin & Gallant, LLP

(57) ABSTRACT

Solar cell modules and methods of fabrication are described. In an embodiment, a pair of tandem solar cells are a step surface or trench within the top subcell of a tandem solar cell is at least partially filled with another material such as an insulator support or electrically conductive support to transfer stress away from the absorber layer of the top subcell of the tandem solar cells when stacked or connected with ribbon.

11 Claims, 42 Drawing Sheets

(51) Int. Cl.
*H10K 71/60* (2023.01)
*H10K 85/50* (2023.01)

(56) References Cited

U.S. PATENT DOCUMENTS

| | | | |
|---|---|---|---|
| 9,397,252 B2 | 7/2016 | Morad et al. | |
| 2008/0053522 A1* | 3/2008 | Basol | H10F 10/167 |
| | | | 257/E31.007 |
| 2010/0206366 A1 | 8/2010 | English | |
| 2018/0040841 A1* | 2/2018 | Asano | H10K 85/50 |
| 2020/0058819 A1 | 2/2020 | Kirner | |
| 2021/0155497 A1 | 5/2021 | Irwin | |
| 2022/0102659 A1* | 3/2022 | Kamino | H10F 10/172 |
| 2022/0278290 A1 | 9/2022 | Sebastien et al. | |
| 2023/0144536 A1 | 5/2023 | Jeong et al. | |
| 2024/0090246 A1* | 3/2024 | Kim | H10K 30/40 |
| 2024/0188311 A1* | 6/2024 | Lee | H10K 39/18 |

FOREIGN PATENT DOCUMENTS

| | | | | |
|---|---|---|---|---|
| JP | 4121603 B2 | | 7/2008 | |
| JP | 4206264 B2 | | 1/2009 | |
| JP | 2016184726 A | * | 10/2016 | ............. H10K 85/50 |
| KR | 2022167085 A | * | 12/2022 | ......... H01L 31/0201 |
| KR | 2023038356 A | * | 3/2023 | ............. H10K 30/40 |
| WO | WO-2004059746 A1 | * | 7/2004 | ............ H10F 77/488 |
| WO | WO-2016152705 A1 | * | 9/2016 | ............. H10K 39/12 |
| WO | 2021/201342 A1 | | 10/2021 | |
| WO | WO-2023037326 A1 | * | 3/2023 | ....... H01L 31/02168 |

OTHER PUBLICATIONS

JP-2005038990-A English machine translation (Year: 2005).*
WO-2004059746-A1 English machine translation (Year: 2004).*
JP-2016184726-A English machine translation (Year: 2016).*
WO-2016152705-A1 English machine translation (Year: 2016).*
Notification of Transmittal of the International Search Report and The Written Opinion of The International Searching Authority, or The Declaration issued for PCT Patent Application No. PCT/US2024/042931, mailed on Dec. 2, 2024, 13 pages.
Notice of Allowance received for U.S. Appl. No. 18/459,154, mailed on May 12, 2025, 9 pages.
Marteau et al., "Passivating Silicon Tunnel Diode for Perovskite on Silicon NIP Tandem Solar Cells, MDPI Energies,"Energies 2023, vol./issue 16, 4346, retrieved online: https://doi.org/10.3390/en16114346; pp. 1-13.

* cited by examiner

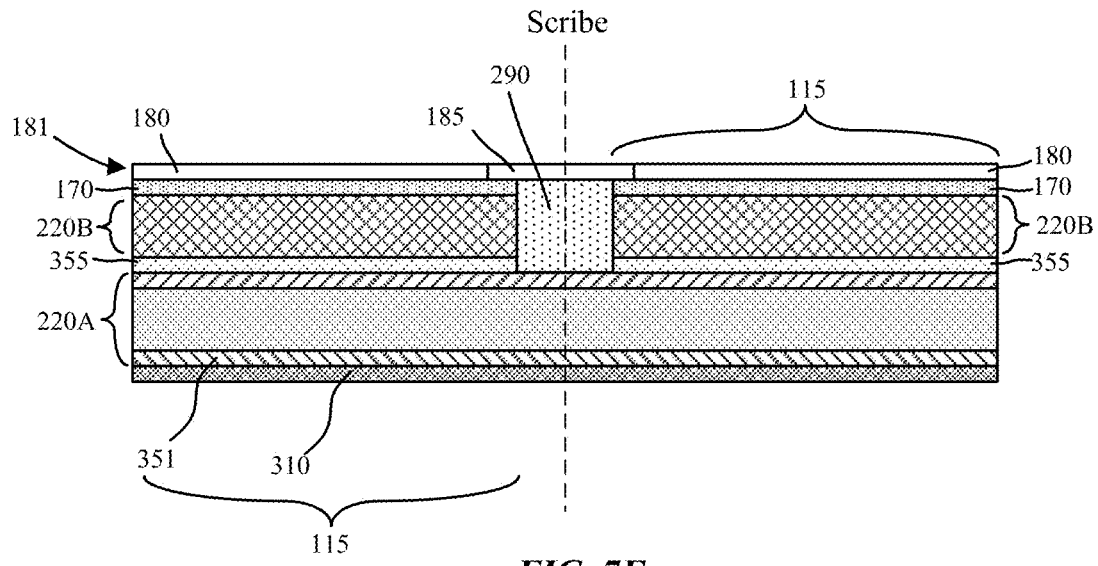
FIG. 7F
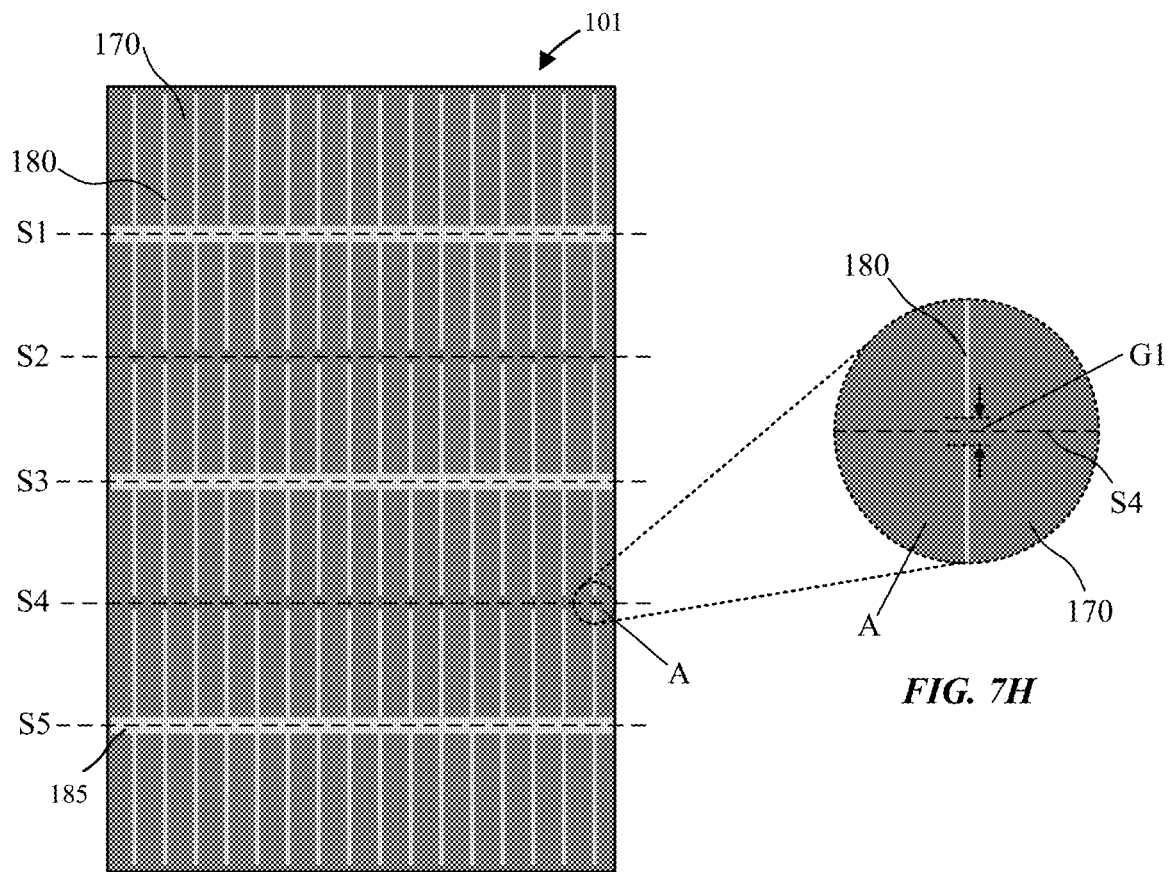
FIG. 7G
FIG. 7H

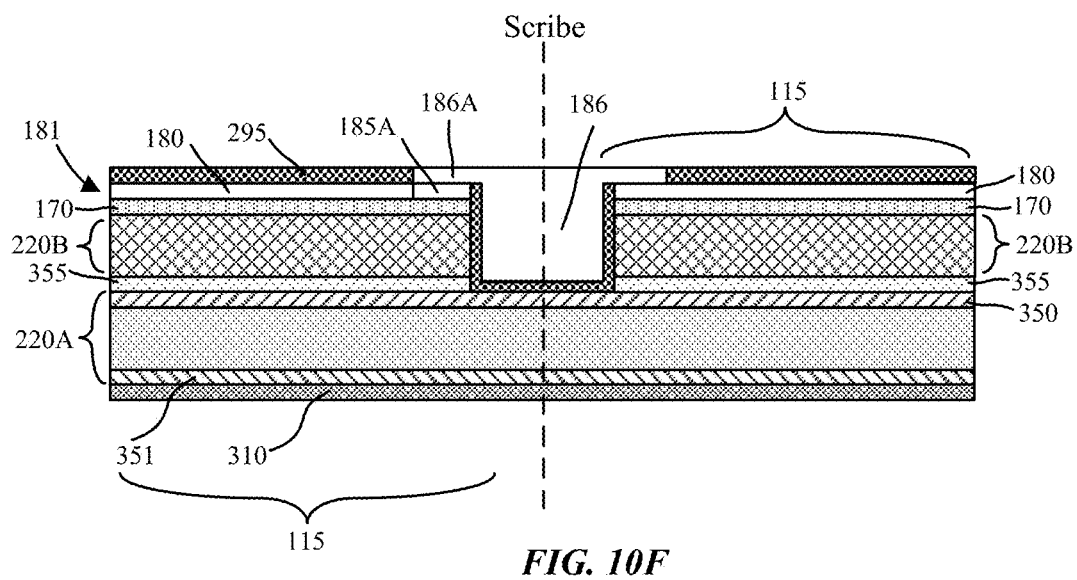
*FIG. 10F*
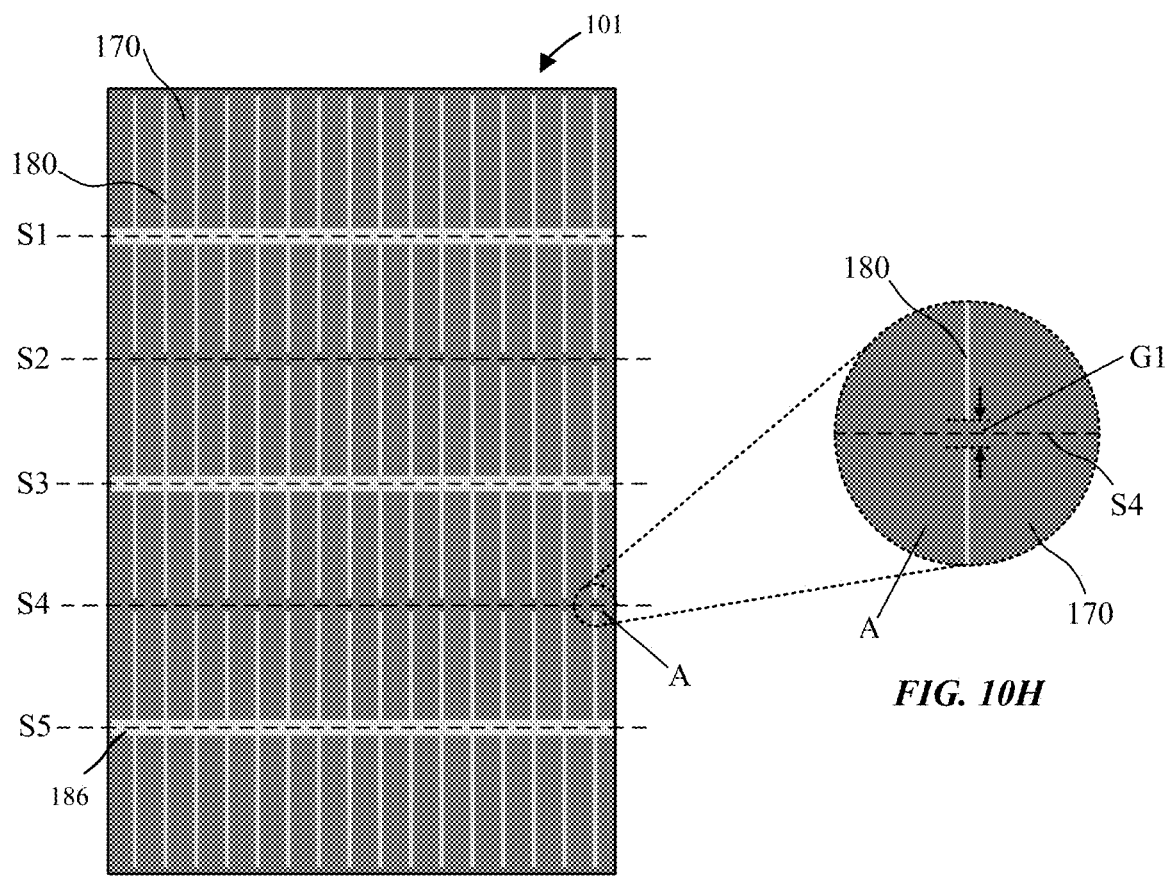
*FIG. 10G*
*FIG. 10H*

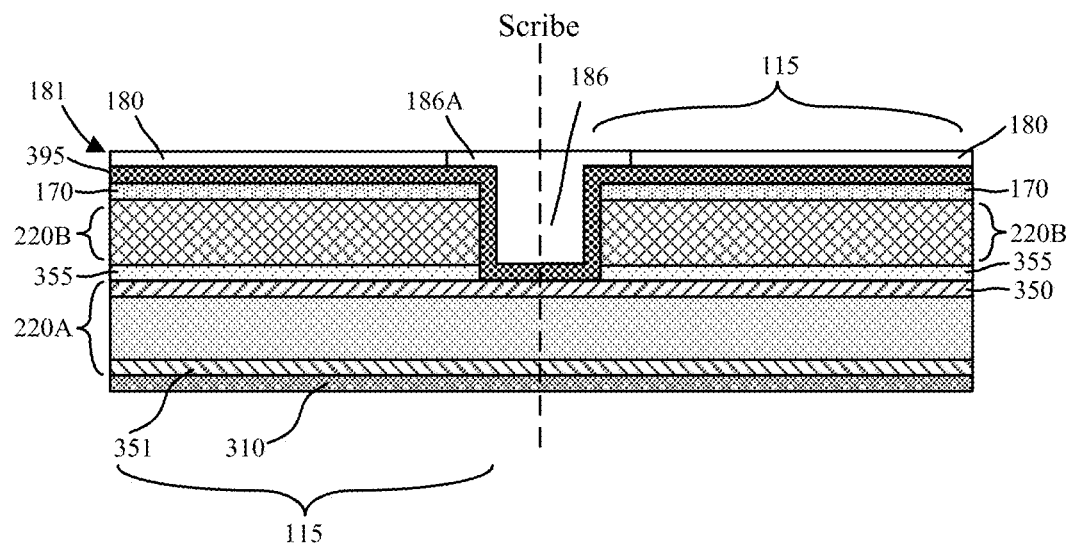
*FIG. 16F*
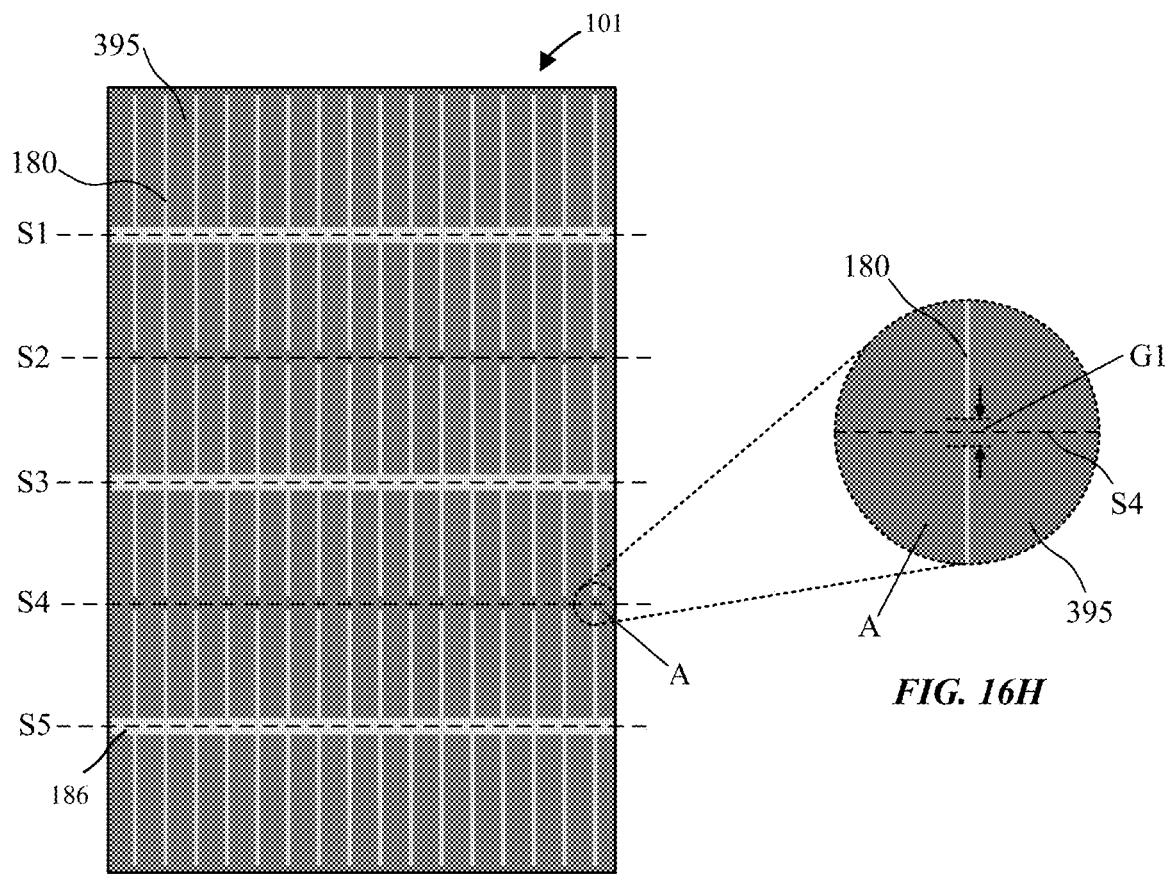
*FIG. 16G*
*FIG. 16H*

MECHANICALLY STRONG CONNECTIONS FOR PEROVSKITE-SILICON TANDEM SOLAR CELLS

RELATED APPLICATIONS

This application is a continuation of co-pending U.S. patent application Ser. No. 18/458,959 filed on Aug. 30, 2023 which is incorporated herein by reference.

BACKGROUND

Field

Embodiments described herein relate to solar cells, and more particularly to mechanical connections between overlapping tandem solar cells.

Background Information

Photovoltaic cells, also referred to as solar cells, are devices that convert radiant photo energy into electrical energy. Multiple solar cells may be integrated into a group to constitute a solar panel, or module, in which some or all of the solar cells are usually connected in series creating an additive voltage.

Conventional silicon solar cells are connected and placed into modules in two main ways. In a first implementation full or half cells are connected by soldering wires or flat busbar ribbons to the front of the solar cell, and specifically to screen printed metal fingers or busbars. The attached busbar is longer than the cell and can make contact to the back of the next cell in a series connection. In another implementation smaller cells are connected in series through a process in which the top of one cell is placed under the next cell and so on using an electrically conducting bond, allowing the positive terminal of one cell to contact the negative terminal of the next cell, or vice versa depending on the type of solar cell used.

SUMMARY

Embodiments describe solar cell modules and methods of fabrication. In an embodiment, a solar cell module includes a first tandem solar cell with an upper perovskite subcell that has been patterned to form a step surface, which is at least partially filled with an insulator support that can act as a support structure for a second tandem solar cell that overlaps the first tandem solar cell. In an embodiment, a solar cell module includes a first tandem solar cell with an upper perovskite subcell that has been patterned to form a step surface, which is at least partially filled with an electrically conductive support that can act as both a busbar and a support structure for a second tandem solar cell that overlaps the first tandem solar cell. In an embodiment, a solar cell module includes a first tandem solar cell with a junction layer that forms a bypass diode and a step surface, which is at least partially filled with an electrically conductive support that can act as both a busbar and a support structure for a second tandem solar cell that overlaps the first tandem solar cell. In an embodiment, a solar cell module includes a tandem solar cell with a junction layer that forms a bypass diode and a trench, which is at least partially filled with an electrically conductive support that can act as both a busbar and a support structure for a wire or ribbon to enable interconnections with other solar cells. In an embodiment, a solar cell module includes a tandem solar cell with a trench, which is at least partially filled with an insulator support that can act as a support structure for a wire or ribbon to enable interconnections with other solar cells.

BRIEF DESCRIPTION OF THE DRAWINGS

FIG. 7F is a schematic cross-sectional side view illustration of a process variation of a method of forming an exemplary solar cell module with a pair of overlapped solar cells in accordance with an embodiment.

FIG. 7G is a schematic top view illustration of an exemplary solar cell wafer in accordance with an embodiment.

FIG. 7H is a closeup view of the exemplary solar cell wafer illustrated in the example of FIG. 7G.

FIG. 10F is a schematic cross-sectional side view illustration of a process variation of a method of forming an exemplary solar cell module with a pair of overlapped solar cells in accordance with an embodiment.

FIG. 10G is a schematic top view illustration of an exemplary solar cell wafer in accordance with an embodiment.

FIG. 10H is a closeup view of the exemplary solar cell wafer illustrated in the example of FIG. 10G.

FIG. 16F is a schematic cross-sectional side view illustration of a process variation of a method of forming an exemplary solar cell module with a pair of overlapped solar cells in accordance with an embodiment.

FIG. 16G is a schematic top view illustration of an exemplary solar cell wafer in accordance with an embodiment.

FIG. 16H is a closeup view of the exemplary solar cell wafer illustrated in the example of FIG. 16G.

DETAILED DESCRIPTION

Figure 1:
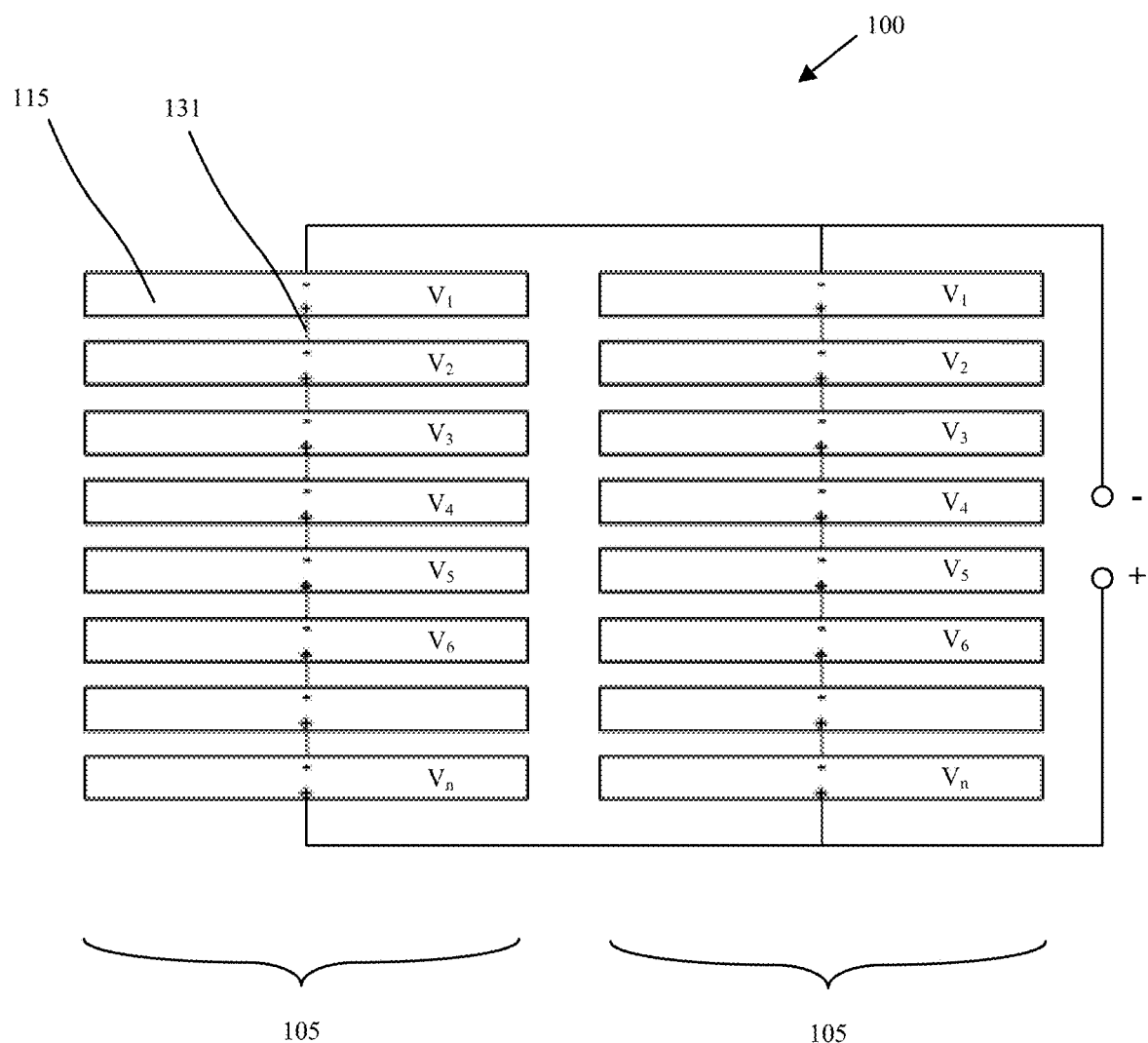
FIG. 1 is a schematic top view illustration and circuit diagram of a solar cell module in accordance with embodiments.

Embodiments describe solar cell modules and methods of fabrication. In an embodiment, a solar cell module includes a first tandem solar cell including a first lower silicon subcell and a first upper perovskite subcell. Further, a back side of a second tandem solar cell can then be bonded to a top side of the first tandem solar cell with an electrically conductive adhesive layer (or other suitable electrically conductive bonding material) positioned substantially over a portion of the first tandem solar cell where the first perovskite subcell had been patterned to include a step surface that is at least partially filled with another material to form a support structure (e.g., insulator support, electrically conductive support, etc.). In this manner, the material and underlying silicon subcell can absorb stress associated with attaching a upper tandem solar cell to the underlying lower solar cell as opposed to having the perovskite subcell of the underlying bottom tandem solar cell absorb the stress, thereby mitigating the risk of mechanical breakage to the perovskite subcell by reducing its exposure to stress. Furthermore, the reduction in perovskite subcell area associated with the step surface may not diminish performance of the solar cell module because area reserved for overlapping tandem solar cells can be considered dead area that is already shaded or obscured. Similar arrangements can also be used for ribbon connection, where a trench is patterned through the perovskite subcell and filled with another material more suitable to handle mechanical and/or thermal loads associated with ribbon attachment. As used herein, the term ribbon is inclusive of at least round wires, as well as flat wire-type materials more commonly associated with busbar attachment and other suitable construction.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a schematic top view illustration is provided of a solar cell module in accordance with embodiments. As shown, the solar cell module 100 includes a plurality of cells 115 (also referred to as solar cells) coupled in series with interconnects 131, with the front of one cell connected to the rear of the next cell so that their voltages ($V_1 \ldots V_n$) add. The plurality of cells 115 may be arranged into one or more subsets 105 (e.g., strings) coupled in parallel, which may have the effect of decreasing total module voltage. Other arrangements, in which the second row of cells are aligned half a cell length off-center of the first row, the third row a half cell length from the second, etc., are also possible. In the latter, an entire row of several cells will be connected in parallel. This layout is sometimes referred to as a "matrix" or "brickwork" array.

Figure 2A:
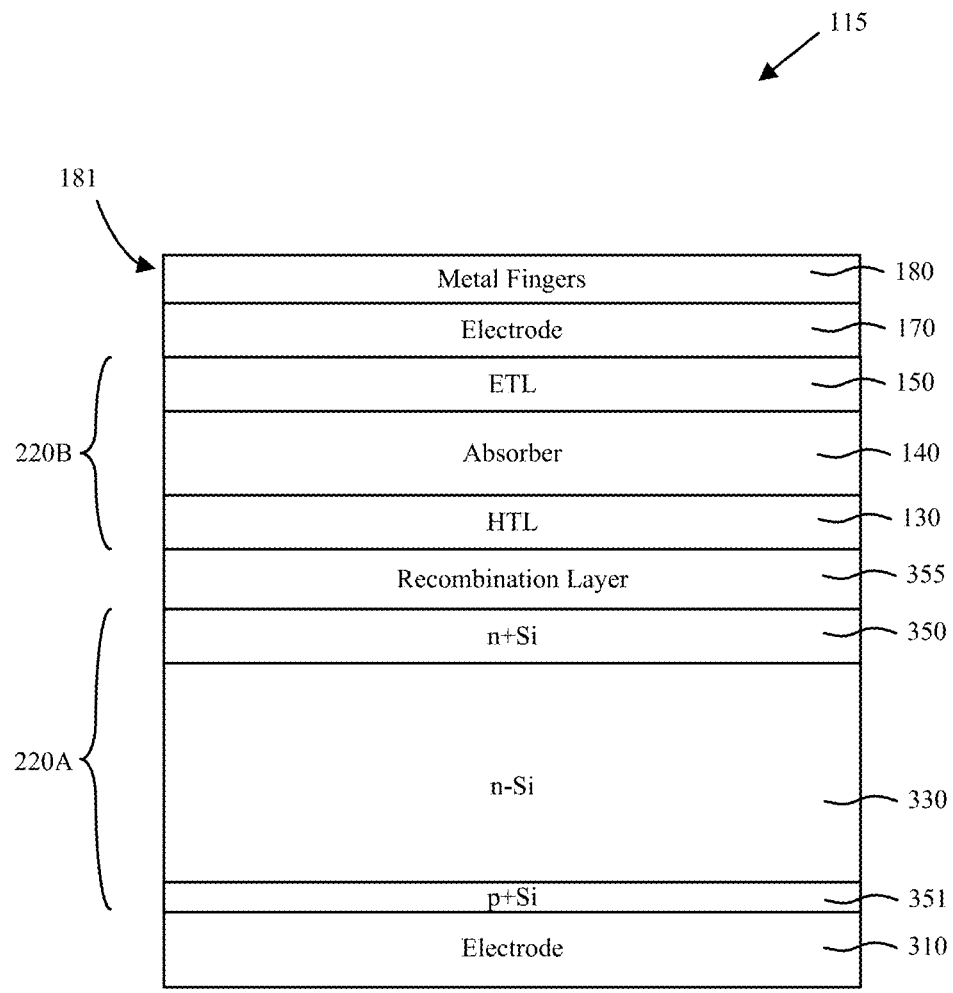
FIG. 2A is an illustrative diagram of solar cell stack-up in accordance with an embodiment.
Figure 2B:
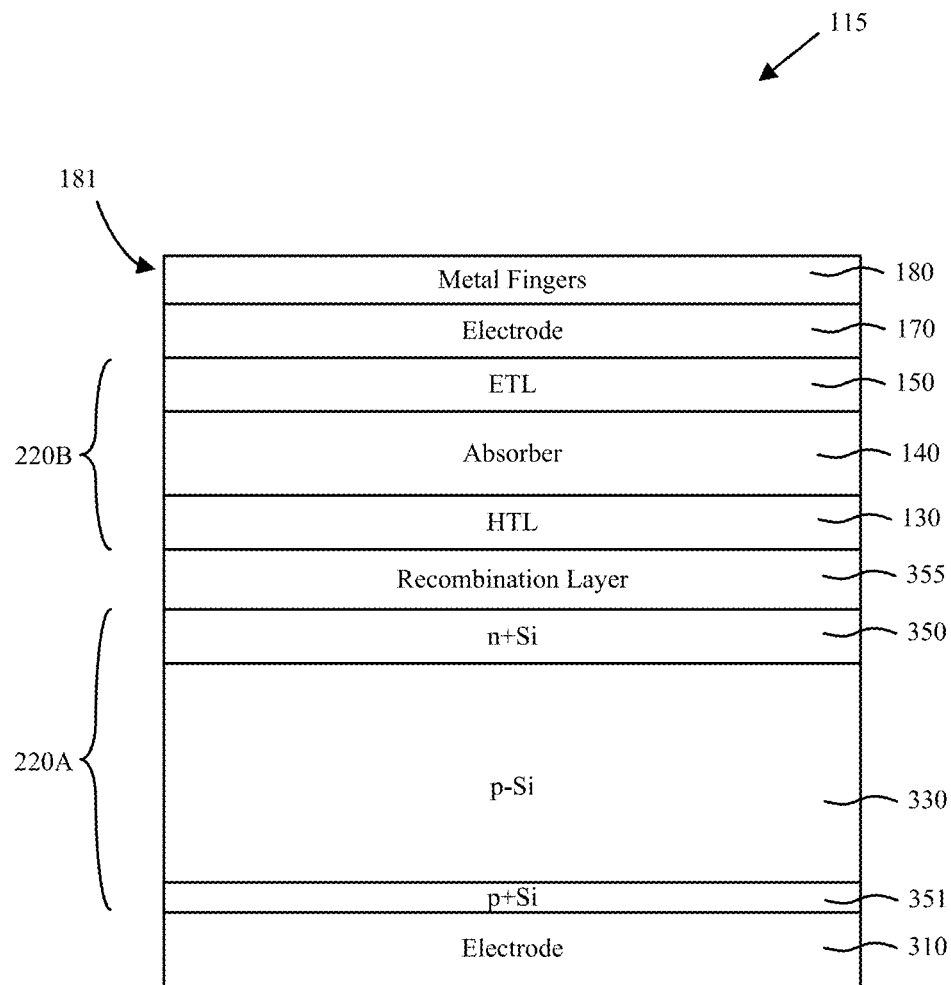
FIG. 2B is an illustrative diagram of a tandem solar cell stack-up in accordance with an embodiment.

Referring now to FIGS. 2A-2B, FIG. 2A is a silicon-perovskite tandem solar cell stack-up based on an n-type silicon substrate in accordance with embodiments; FIG. 2B is a silicon-perovskite tandem solar cell stack-up based on a p-type silicon substrate in accordance with embodiments. In the following description various layers and compositions are described for the solar cell stack-ups. It is to be appreciated that each layer may include a single layer, or multiple layers. Furthermore, reference to bottom or top layers herein is relative and may not be reflective of actual orientation in product.

In the particular embodiments illustrated in FIGS. 2A-2B, the solar cells 115 may absorb light from the top side of the illustrated stack-ups. Referring to FIG. 2A, the tandem structure may include an upper perovskite subcell 220B formed over a lower silicon subcell 220A including a doped silicon substrate 330 (e.g., n-doped substrate), a p-doped silicon layer 351 (e.g., p+ doped), and optionally an n-doped silicon layer 350 (e.g., n+ doped). A back side contact 310 may also be formed underneath the p-doped silicon layer 351. Back side contact 310 may be formed of a suitable material such as Ag, Cr, Au, Cu, Al, etc. It is to be appreciated that the exemplary silicon subcells 220A and contacts can include a variety of configurations in accordance with all embodiments, including heterojunction (HJT) design, tunnel oxide passivated contacts (TOPCon), passivated rear contact solar cell (PERC), etc.

The n-doped silicon layer 350 (e.g., n+ doped) and p+ doped silicon layer 351 may be crystalline, polycrystalline such as with TOPCon design, or amorphous, such as with an HJT design. In such an HJT design additional intrinsic layers (e.g., intrinsic silicon) may be formed between the doped silicon substrate 330 and the p-doped silicon layer 351 and n-doped silicon layer 350. For example, the intrinsic layers may be formed by treating the doped silicon substrate 330, such as with hydrogen plasma. The intrinsic layer(s) may also be crystalline or amorphous. A recombination layer 355 can be located between the subcells 220. The recombination layer 355 may be formed of a transparent conducting material such as a TCO or ITO specifically. In addition, the recombination layer 355 may be laterally or vertically conductive.

The upper perovskite subcell 220B includes an absorber layer 140 and one or more transport layers. In the embodiment illustrated, the upper perovskite subcell 220B includes a hole transport layer (HTL) 130 over the optional recombination layer 355, an absorber layer 140 over the HTL 130, and an electron transport layer (ETL) 150 over the absorber layer 140. The HTL 130 may include one or more layers formed of a metal oxide such as nickel oxide (NiOx) or vanadium oxide ($V_2O_5$), an organic polymer such as poly (triaryl amine) (PTAA), small molecules such as 2,2',7,7'-Tetrakis[N,N-di(4-methoxyphenyl)amino]-9,9'-spirobifluorene (spiro-MeOTAD), or a "self assembled monolayer" in which molecular assemblies can be formed spontaneously on surfaces by adsorption and then organized into large ordered domains. In one example, self-assembled monolayers can be formed where hole transporting moieties are attached to the underlying TCO or HTL layer via an acid binder group such as a phosphonic acid or carboxylic acid, although other compositions and methods of formation are contemplated. The HTL 130 may additionally be doped to increase conductivity, and may include a bi-layer of a metal oxide (e.g., NiOx) and an organic layer such as PTAA or on top.

The absorber layer 140 in accordance with embodiments may be formed of a perovskite material. Perovskite materials may be characterized by the formula $ABX_3$, with A representing a large atomic or molecular cation (e.g., Cs, methylammonium, formamidinium, etc.), with B representing a positively charged cation (e.g., metal, lead, plumbate, Sn), and X representing a negatively charged anion (e.g., halide, I, Br, Cl). Perovskite materials can also include a mixture of 2D and 3D structures in the family of $A^1_m A_n B_{n-1} X3_{n-1}$ where $A^1$ represents a positively charged cation (e.g., butylammonium, phenethylammonium, guanidinium, etc.) Alternative materials such as organic materials can also be used as the absorber layer.

ETL 150 in accordance with embodiments can be formed of fullerenes, metal halides, tin oxide, titanium oxide, napthalene diimide and related derivatives, etc. An additional buffer layer may be included as part of or on top of the ETL 150. For example, the buffer layer can physically separate the electrode layer, or top metal pattern, from the subcell, and more specifically the absorber layer. In an embodiment, the buffer layer is formed of a metal oxide material such as tin oxide, titanium diode, or aluminum zinc oxide (AZO) over a fullerene ETL 150. The buffer layer can function as a barrier layer as well as a charge transport layer. In a specific embodiment, the top electrode layer 170 is formed of a transparent conducting material. Since the lower silicon subcell 220A may be opaque, the top electrode layer 170 may be formed of a transparent conducting layer such as poly(3,4-ethylenedioxythiophene) polystyrene sulfonate (PEDOT:PSS), transparent conductive oxides (TCOs) such as indium tin oxide (ITO), fluorine doped tin oxide (FTO), indium zinc oxide (IZO), aluminum doped zinc oxide (AZO), cadmium stannate, etc. A top metal pattern 181 may then be formed over the transparent top electrode layer 170, for example to facilitate charge transport. In an embodiment, the top metal pattern 181 is formed of a suitable material such as Ag, Cr, Au, Cu, Al, etc. The top metal pattern 181 may be formed in the shape of a plurality of metal finger 180 electrodes and optionally busbar connecting the plurality of metal finger 180 electrodes so as to transport charge without overly blocking light transmission.

Referring to FIG. 2B, the tandem structure may include an upper perovskite subcell 220B formed over a lower silicon subcell 220A including a doped silicon substrate 330 (e.g., p-doped substrate), an n-doped silicon layer 350 (e.g., n+ doped), and optionally a p-doped silicon layer 351 (e.g., p+ doped). Thus, the lower silicon subcell 220A of FIG. 2B may be based upon a p-doped silicon substrate rather than the n-doped silicon substrate of FIG. 2A. In such an embodiment the p-doped silicon layer 351 may be optional as opposed to the n-doped silicon layer 350 being optional. It is to be appreciated that the exemplary silicon subcells 220A and contacts can include a variety of configurations in accordance with all embodiments, including heterojunction (HJT) design, tunnel oxide passivated contacts (TOPCon), passivated rear contact solar cell (PERC), etc.

In each of the previous embodiments described with regard to FIGS. 2A-2B specific perovskite sub-cell stack-ups are described and illustrated with a n-p, p-n, n-i-p, or p-i-n orientations are described. These changes in order of layer formation can additionally change materials selection of some layers without straying from the principles of the embodiments. Thus, reference to ETL or HTL and n-doped layer or p-doped layer may be reversed in accordance with embodiments.

In one aspect, it has been observed that conventional silicon solar cells are connected to each other by soldering metal busbars (usually 0.5-2 mm flat metal ribbons) to the front of the solar cell. Specifically, the busbar ribbons are soldered to the screen-printed metal finger electrodes and busbars (e.g., of a top metal pattern 181). The attached busbar is generally longer than the solar cell and can make contact to the next solar cell in a series connection. It has been observed however, that perovskite solar cells (and subcells) are sensitive to heat (e.g., temperatures greater than 150° C. are likely to cause damage, while soldering is usually done at >200° C.) as well as pin-point pressure, so the soldering process is likely to damage perovskite-silicon tandem solar cells. Furthermore, having the connection to the solar cell occur only at a few solder joints also reduces the mechanical stability of the solar cell. It has been observed that each joint is one of the most common sources of failure in a silicon solar cell.

In accordance with embodiments, these problems may be overcome or mitigated by using an electrically conductive bonding material to bond serial solar cells or bond ribbons to the solar cells. In accordance with some embodiments, the electrically conductive bonding material can include electrically conducting adhesives (ECAs) that are liquid during application and then cured to form the bond. In accordance with other embodiments, the electrically conductive bonding material can include solid electrically conductive tapes. These tapes may include a polymer matrix adhesive (e.g., acrylic, silicone, butyl rubber, etc.) in which electrically conductive particles (such as those made of metals such as silver, copper, aluminum, nickel or those made of carbon) and/or wires or pins (depending on whether only Z or XYZ conductivity is desired), metal-coated ceramic or polymer conductive particles, or other metal-coated particles are embedded. When laminated under pressure, the particles and/or wires or pins transport current directly between the two materials the tape is placed between. In other embodiments still, the electrically conductive bonding material can include low-temperature solder or solder pastes.

Figure 3A:
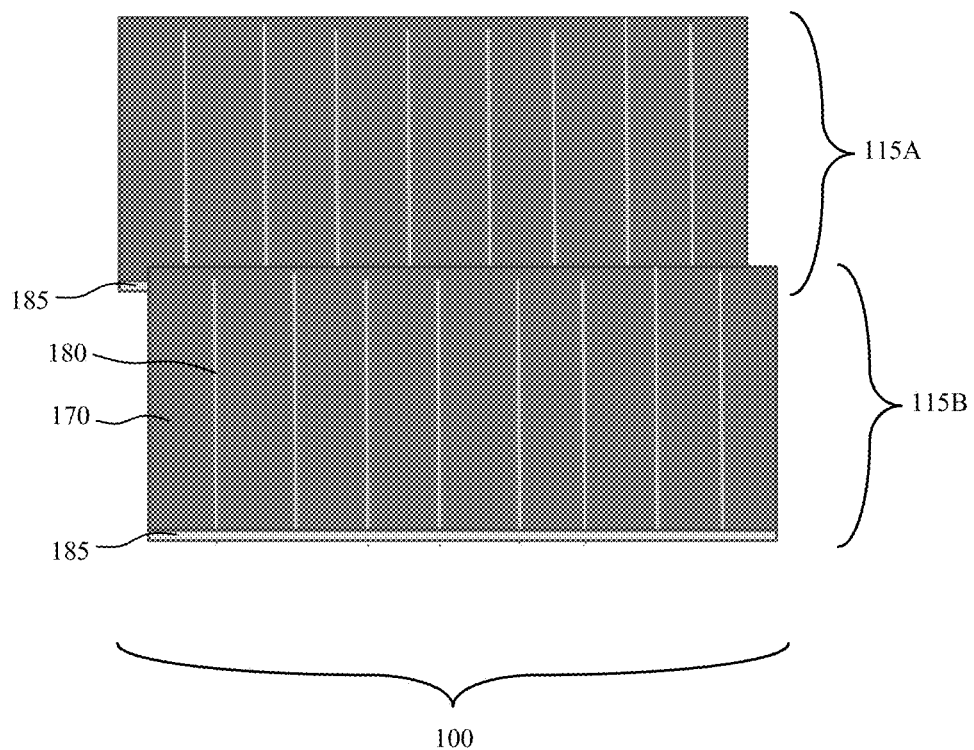
FIG. 3A is schematic top view illustration of a pair of overlapped solar cells in accordance with an embodiment.
Figure 3B:
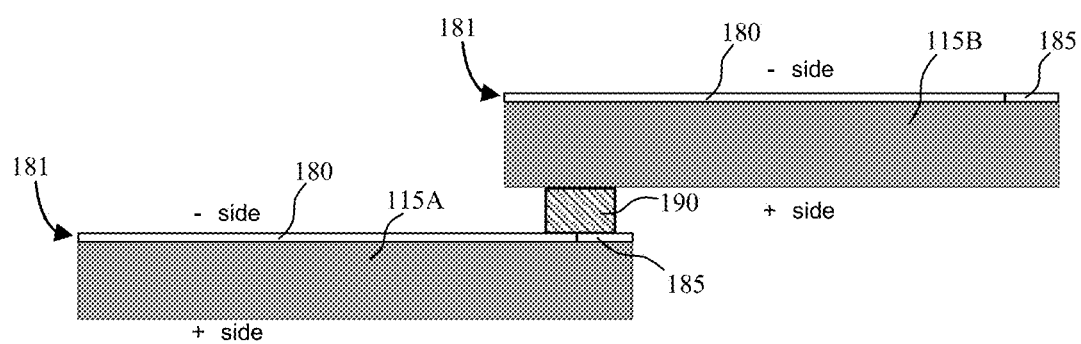
FIG. 3B is a schematic side view illustration of a pair of overlapped solar cells in accordance with an embodiment.

Referring now to FIGS. 3A-3B schematic top view and cross-sectional side view illustrations are provided for a pair of overlapped tandem solar cells 115 in accordance with an embodiment. As shown, a back side of a second tandem solar cell 115B (upper solar cell) can be bonded to a first tandem solar cell 115A (lower solar cell) with an electrically conductive bonding material 190. Specifically, the electrically conductive bonding material 190 may be applied as a solid conductive tape rather than as a liquid adhesive. The tape may also provide improved mechanical properties since the mechanical connection between cells relies on a polymer adhesive. This is especially important for modules that may have to withstand vibrations or be curved in shape. Still referring to FIGS. 3A-3B, bonding may optionally be made to a busbar 185 formed on the first tandem solar cell 115A (lower solar cell). The busbar 185 may be formed as part of a top metal pattern 181, which can include metal finger 180 electrodes spanning over the first tandem solar cell 115A (lower solar cell). The busbar and fingers can however be omitted at locations where light transmission is preferred.

In the particular embodiment illustrated in FIGS. 3A-3B, the second tandem solar cell 115B (upper solar cell) can be bonded to the first tandem solar cell 115A (lower solar cell) at a variety of locations. For example, referring briefly back to FIGS. 2A-2B, the back side contact 310 (electrode) of the upper tandem solar cell 115B can be bonded to the metal finger 180 electrodes (or busbar) or electrode layer 170 of the lower tandem solar cell 115A with the electrically conductive bonding material 190. As described in further detail herein, the upper subcell 220B of the lower tandem solar cell 115A can be patterned to form a step surface which is at least partially filled with another material to form a support structure (e.g., insulator support, electrically conductive support, etc.) to transfer stress away from the absorber layer 140 of the upper subcell 220B of the lower tandem solar cell 115A, which can help avoid shorting and mechanical breakage when a threshold bonding pressure is exceeded or during installation and operation of the eventual module that comprises the solar cell strings described herein.

Figure 4:
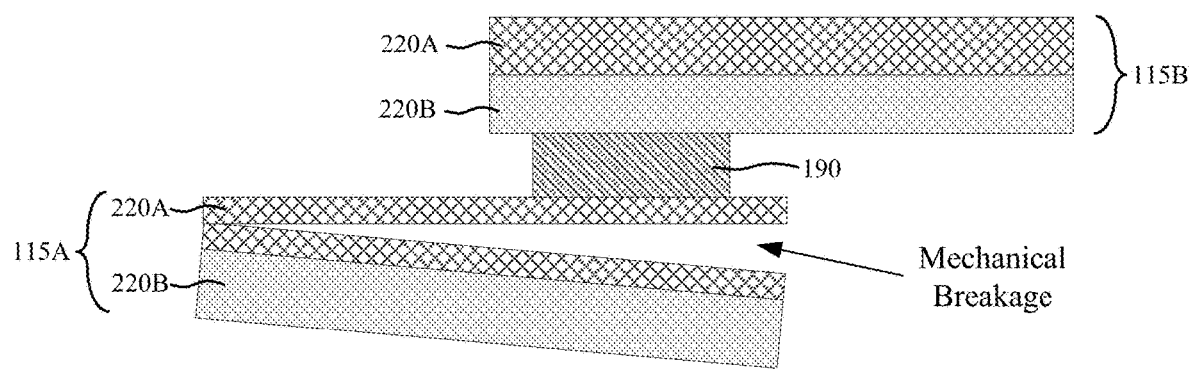
FIG. 4 is a schematic cross-sectional side view illustration of mechanical breakage in a perovskite subcell.

As shown in FIGS. 3A-3B, connecting two single junction cells in series by overlapping them can be straightforward. It has been observed that connecting tandem cells, however, can be challenging for several reasons. In particular, the force exerted by the back side of the second tandem solar cell on the top side of the first tandem solar cell during assembly and handling of the solar cell module can place additional stress on the first upper perovskite subcell of the first tandem solar cell. As shown in FIG. 4, pressure at the junction between the perovskite front and the silicon back of two tandem cells can cause mechanical breakage within a mechanically weak top subcell 220B, such as a perovskite subcell, when the cells or modules are placed under mechanical stress such as that experienced during manufacturing or module installation and operation.

In accordance with some embodiments, a portion of the first upper perovskite subcell 220B can be patterned to form a step surface that includes a step ledge and a step floor. For example, patterning can be done by lithography or shadow masking during deposition, or by laser patterning post deposition, etc. and combinations thereof. Another material (e.g., insulator support, electrically conductive support, etc.) can be deposited in the step surface, at least partially, to form a support structure to provide a mechanical support for the upper tandem solar cell 115B, and to facilitate electrical connection with the back side of the upper tandem solar cell 115B. In this way, the force exerted by the back side of the second tandem solar cell on the top side of the first tandem solar cell during assembly, handling, etc., can be absorbed by the replacement material deposited in the step surface rather than by the comparatively weaker perovskite subcell, which can mitigate potential mechanical breakage of the perovskite subcell. Further, the second or upper tandem solar cell can be positioned so there is minimal overlap with the first or lower tandem solar cell so as to not obscure the solar cells of the first or lower tandem solar cell.

In the following description of FIGS. 5-23 various connected (e.g., overlapping, ribbon) tandem solar cell arrangements and methods of fabrication and assembly are described. In particular, the tandem solar cell arrangements described and illustrated are similar to that illustrated and described with regard to FIG. 2A. As such, specific layers or compositions may not be separately described again. Furthermore, while embodiments are described with regard to the specific arrangement illustrated in FIG. 2A, which is based upon an n-silicon substrate, embodiments are not so limited, and may be employed using tandem solar cells based upon a p-silicon substrate, or other materials not including silicon. Embodiments may additionally be employed with any materials system in which the top subcell is mechanically weaker than the bottom subcell, and therefore are also not limited to perovskite top subcells, or a silicon-perovskite tandem solar cell.

Figure 5A:
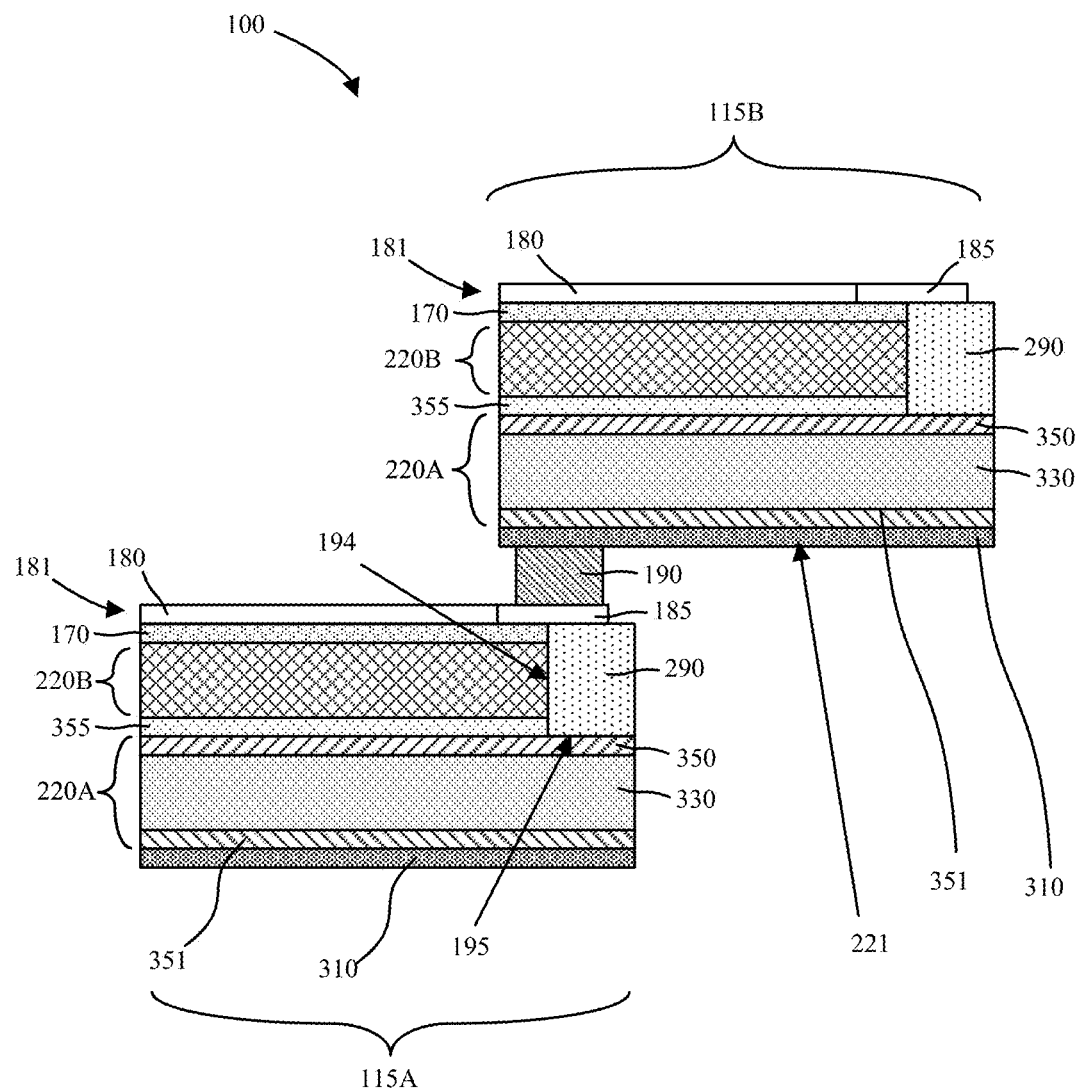
FIG. 5A is a schematic cross-sectional side view illustration of an exemplary solar cell module with a pair of overlapped solar cells in accordance with an embodiment.

Referring now to FIG. 5A, a schematic cross-sectional side view illustration is provided for a pair of overlapped solar cells in accordance with an embodiment. In the embodiment, a portion of the upper perovskite subcell has been patterned to form a step surface which is at least partially filled with an insulator support that can act as the support structure and absorb the stress placed on the lower solar cell by the upper solar cell. As shown, solar cell module 100 can include a first tandem solar cell 115A (lower solar cell) and a second tandem solar cell 115B (upper solar cell). As described in examples, multiple tandem solar cells 115 can be formed from the same full tandem solar cell wafer by scribing or otherwise cutting the full solar cell (e.g., half-cut solar cells, etc.), though the overlapping solar cells in accordance with embodiments can also be assembled from different tandem solar cell wafers. The tandem solar cells can then be assembled as shown in FIG. 5A which shows a first tandem solar cell 115A (lower solar cell) and second tandem solar cell 115B (upper solar cell) in accordance with the embodiments. Multiple tandem solar cells 115 can be assembled in this serial overlapping manner, such as with the solar cell module of FIG. 1. In the descriptions and embodiments below, it is contemplated that the first tandem solar cell 115A (lower solar cell) and the second tandem solar cell 115B (upper solar cell) are substantially similar, so that any reference to the first tandem solar cell 115A (lower solar cell) can also be inclusive of the second tandem solar cell 115B (upper solar cell) unless otherwise noted. Furthermore, it is to be appreciated that the left sides of the tandem solar cells 115, opposite the right sides with the step surface, can have somewhat different configurations than those illustrated based upon the particular scribing location. For example, residual insulator support material, dielectric layer material, top metal pattern, and/or step surface may be present.

In further reference to FIG. 5A, first tandem solar cell 115A (lower solar cell) includes a first lower silicon subcell 220A, a first upper perovskite subcell 220B, a step surface that includes a step edge 194 and a step floor 195, and an insulator support 290 at least partially filling the step surface. The step surface in accordance with embodiments may assume a variety of configurations, including a trench or ledge within an upper perovskite subcell. In addition, step edge 194 can extend from a step floor 195 across a thickness of the upper perovskite subcell. In some embodiments, the step floor 195 can be patterned to expose a transport layer located below the perovskite absorber layer 140 (e.g., HTL 130). In other embodiments, the step floor can be patterned to expose additional layers below the perovskite subcell (e.g., recombination layer 355, n-doped silicon layer 350, etc.). In the illustrated embodiment of FIG. 5A, the step floor 195 exposes the n-doped silicon layer 350 of the lower silicon subcell 220A. In all such embodiments, the step floor 195 originates at a location below the perovskite subcell. The insulator support 290 can be deposited over the step floor 195 and laterally adjacent to the step edge 194. The insulator support 290 can be a 1 or 2-part thermoset adhesive (e.g., reactive, thermal, UV, etc.), dissolved polymer/oligomer or other material that may not degrade the perovskite layers. In accordance with embodiments the insulator support 290 can be printed or deposited (e.g., jet, needle, screen, etc.) and is at least as thick as the perovskite absorber layer 140 (see FIG. 2B) or thicker. In an embodiment, the insulator support 290 is as thick as the upper perovskite subcell 220B, and may also be as thick as the step edge 194 height.

Further, as shown in the particular embodiment illustrated in FIG. 5A, the first tandem solar cell 115A (lower solar cell) includes a first conductive recombination layer 355 located below the first upper perovskite subcell 220B, and a first transparent top electrode layer 170 located over the first upper perovskite subcell 220B. In addition, the first tandem solar cell 115A (lower solar cell) includes a first top metal pattern 181 that can be formed over the first transparent top electrode layer 170. The first top metal pattern 181 can include a plurality of metal finger 180 electrodes that span over the top side of the first tandem solar cell 115A as well a metal busbar 185. A busbar as described herein can include any component or combination of components that provide an interconnection between metal finger 180 electrodes. In some embodiments, a busbar can include a metal component that runs orthogonally to the metal finger 180 electrodes and spans over/across a solar cell, such as the example described in FIG. 3A (e.g., busbar 185). In other embodiments, a support structure (e.g., electrically conductive support 186, etc.) can itself act as a busbar where an aspect of the support structure provides an interconnection between the metal finger 180 electrodes. In other embodiments still, a busbar variation (e.g., busbar 185A, etc.) can underlie an aspect of the support structure where, in conjunction, the busbar variation and the support structure can function as a busbar by providing an interconnection between metal finger 180 electrodes. In such instances, these busbar embodiments and the metal finger 180 electrodes of the top metal pattern 181 may be formed (e.g., printed, deposited, etc.) in the same process/operation or in multiple processes/operations.

In the example of FIG. 5A, the metal busbar 185 is substantially located over the insulator support 290 and step floor 195. In other embodiments, the busbar 185 can be located in other positions relative to the insulator support 290 and step floor 195 so as to further reduce the amount of stress placed on the perovskite subcell (e.g., busbar 185 completely over step floor 195, etc.). In addition, the first tandem solar cell 115A (lower solar cell) also includes the first lower silicon subcell 220A. The first lower silicon subcell 220A can include an n-doped silicon layer 350 located above a p-doped silicon substrate 330, and p+ doped backside layer 351 located below the p-doped silicon substrate 330. It is to be appreciated that this arrangement of doped layers is exemplary, and that doping may be reversed, or that the n-doped silicon layer 350 is on top of another n-doped silicon layer equivalent to the doped silicon substrate 330. Further, a back side contact 310, such as a silver electrode contact, may also be formed underneath the p-doped silicon substrate 330 by printing or sputtering, for example. In the illustrated embodiment, the first conductive recombination layer 355, the first upper perovskite subcell 220B and the first transparent top electrode layer 170 do not span the entirety of the first tandem solar cell 115A (lower solar cell) but rather terminate at step edge 194. As shown, the back side 221 of the second lower silicon subcell 220A (which may optionally be back side contact 310 of FIG. 2B) can be bound to the busbar 185 with the electrically conductive bonding material 190.

In examples, a back side 221 of the second tandem solar cell 115B (upper solar cell) is bonded to a top side of the first tandem solar cell 115A (lower solar cell) with an electrically conductive bonding material 190. As shown, the electrically conductive bonding material 190 is positioned substantially over the insulator support 290. In this way, the electrically conductive bonding material 190 and its position relative to insulator support 290 can provide a more robust mechanical connection between tandem solar cells and can also reduce/absorb any stress placed on the perovskite subcell during the assembly and handling of the solar module. In other embodiments, the electrically conductive bonding material 190 can be placed in other positions relative to the insulator support so as to further reduce the amount of stress placed on the perovskite subcell (e.g., electrically conductive bonding material 190 completely over insulator support 290, etc.).

Figure 5B:
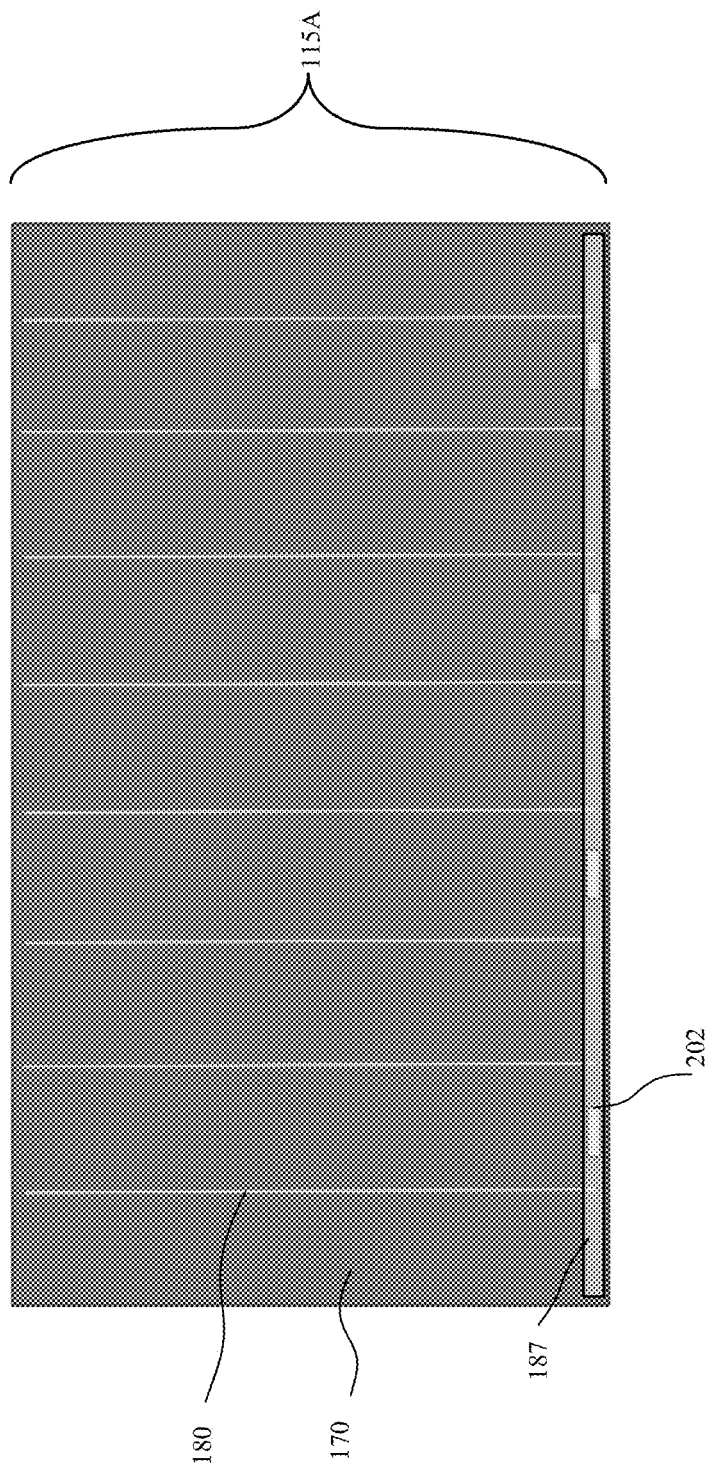
FIG. 5B is a schematic top view illustration of an exemplary solar cell module in accordance with a variation.
Figure 5C:
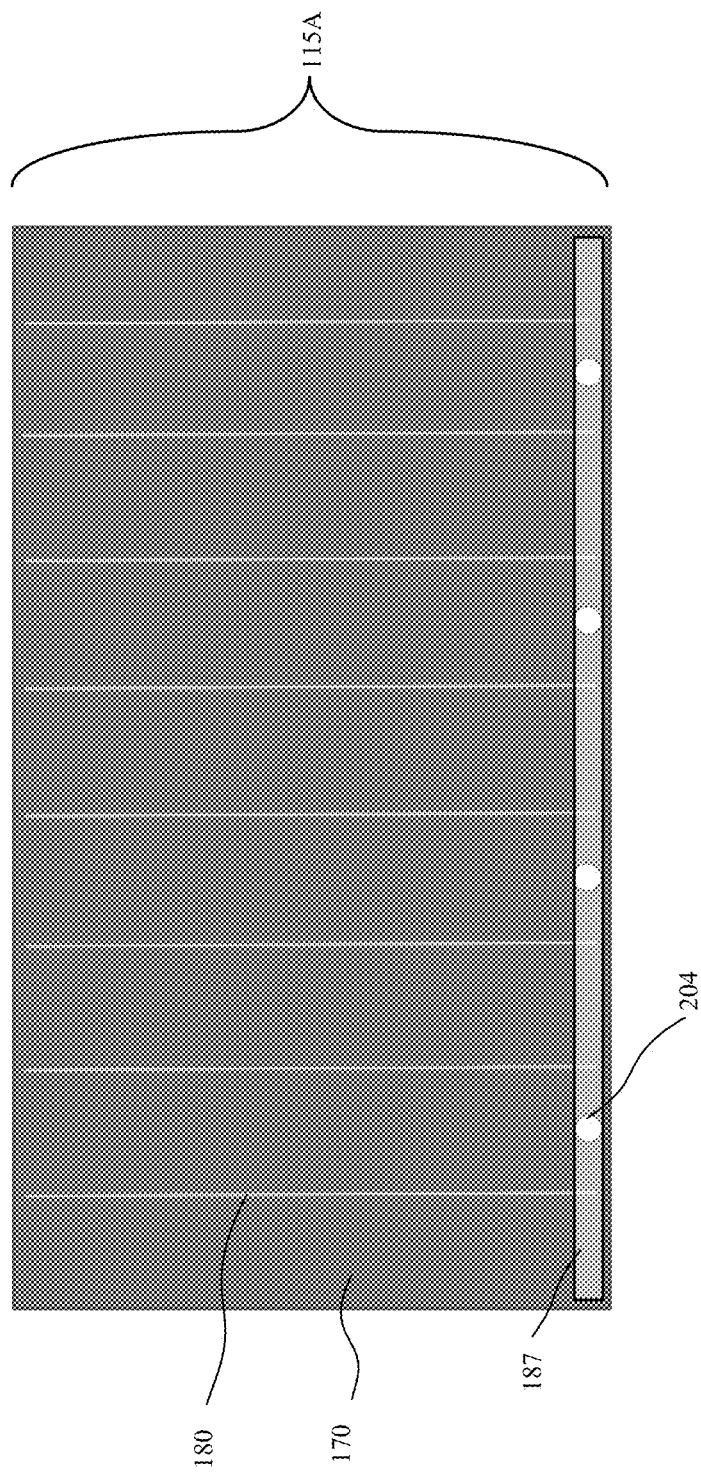
FIG. 5C is a schematic top view illustration of an exemplary solar cell module in accordance with another variation.

In reference to FIGS. 5B-5C, FIG. 5B illustrates a schematic top view of a first tandem solar cell 115A with a plurality of slits/slots; FIG. 5C illustrates a schematic top view of a first tandem solar cell 115A with a plurality of vias. The embodiments described in FIGS. 5B-5C are similar to the embodiments described in FIG. 3A and FIG. 5A in that a top side of the first tandem solar cell 115A can be bonded to a back side of a second tandem solar cell (e.g., second tandem solar cell 115B) to form a solar cell module. However, rather than a step surface and its corresponding support structure (e.g., insulator support 290, etc.) that continuously spans a step surface of the solar cell as depicted in FIG. 3A, FIGS. 5B-5C include a plurality of slits/slots and vias, respectively, that can be intermittently positioned at various intervals along an edge of the solar cell. In this way, the embodiments depicted in FIGS. 5B-5C can provide the same or an even greater amount of structural support as the embodiments depicted in FIG. 3A and FIG. 5A, but also introduce fewer shorting paths to the back side of the silicon subcell. In reference to FIGS. 5B-5C, the plurality of slits/slots 202 or vias 204 can be formed to approximate the dimensions of the step edge 194 and step floor 195 described in FIG. 5A and can then be filled with the same insulators and metallizations described therein to form their respective support structures (e.g., insulator support 290, etc.). Further, an additional busbar, busbar 187, can be applied (e.g., screen-printed, sputtered, etc.) to an area over the slits/slots 202 or vias 204 as depicted in FIGS. 5B-5C in order to facilitate an electrical connection between the individual slits/slots 202 and vias 204 to the fingers on the solar cell.

Figure 6:
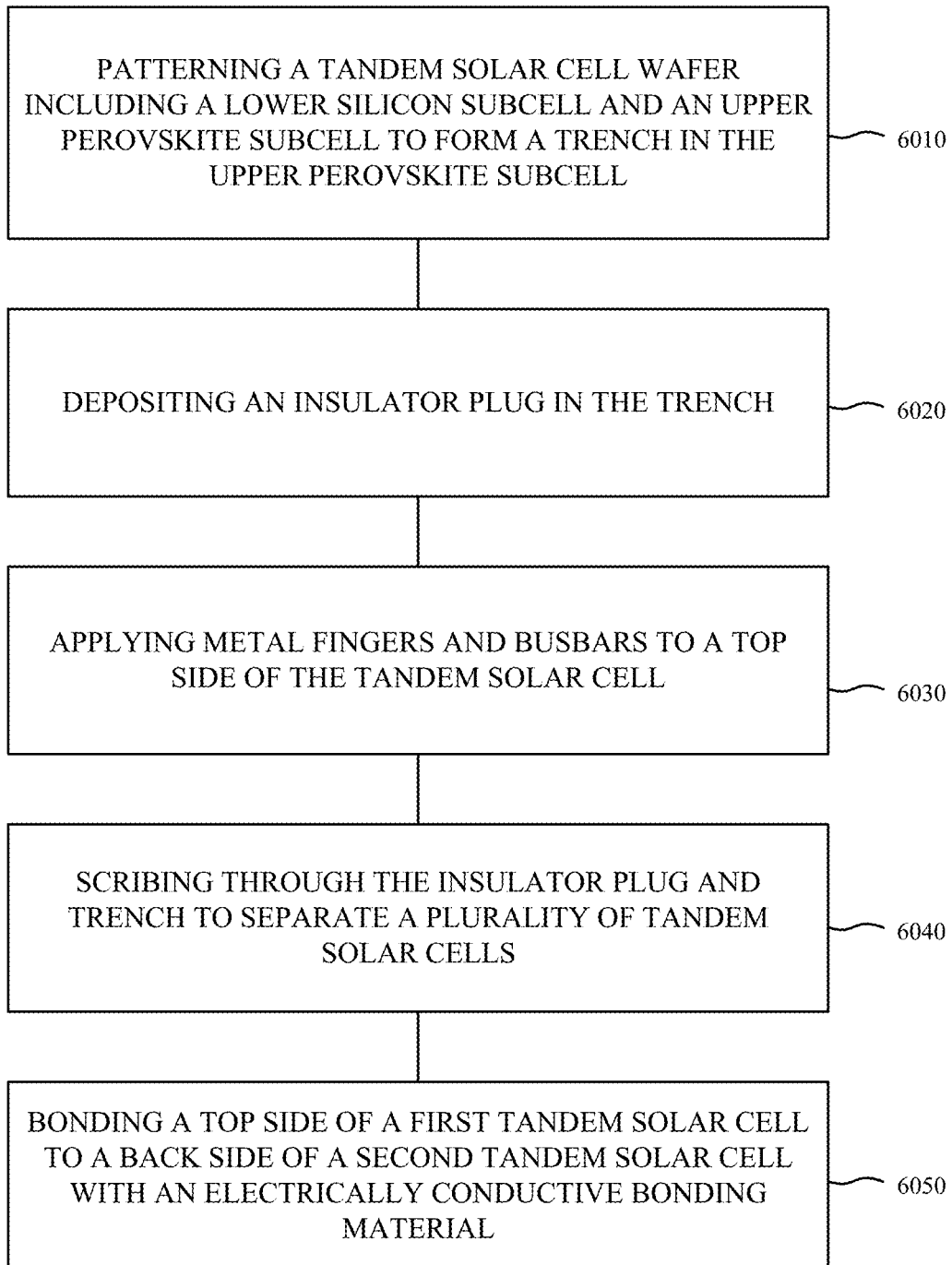
FIG. 6 is a flow chart of a method of forming an exemplary solar cell module with a pair of overlapped solar cells in accordance with an embodiment.
Figure 7A:
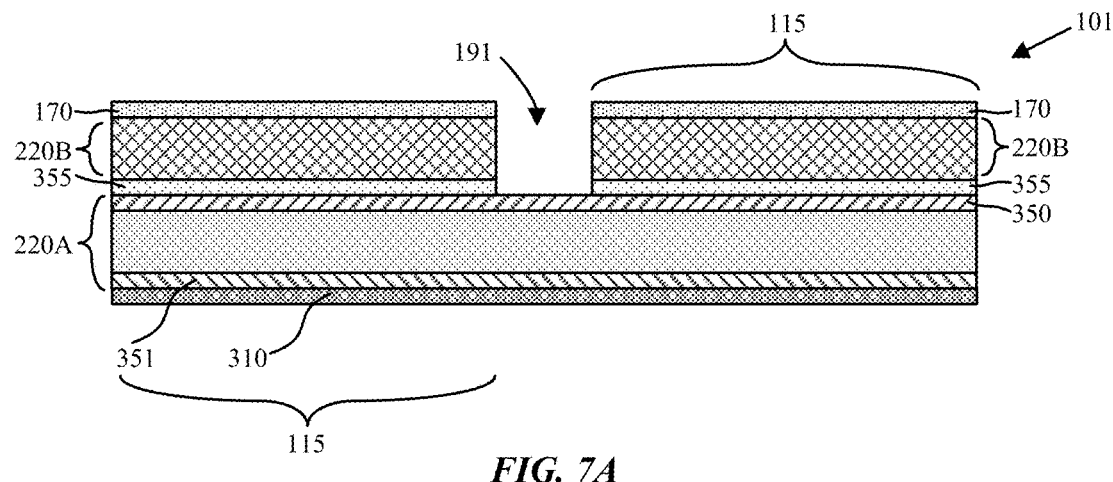
FIGS. 7A-7E are schematic cross-sectional side view illustrations of a method of forming an exemplary solar cell module with a pair of overlapped solar cells in accordance with an embodiment.
Figure 7B:
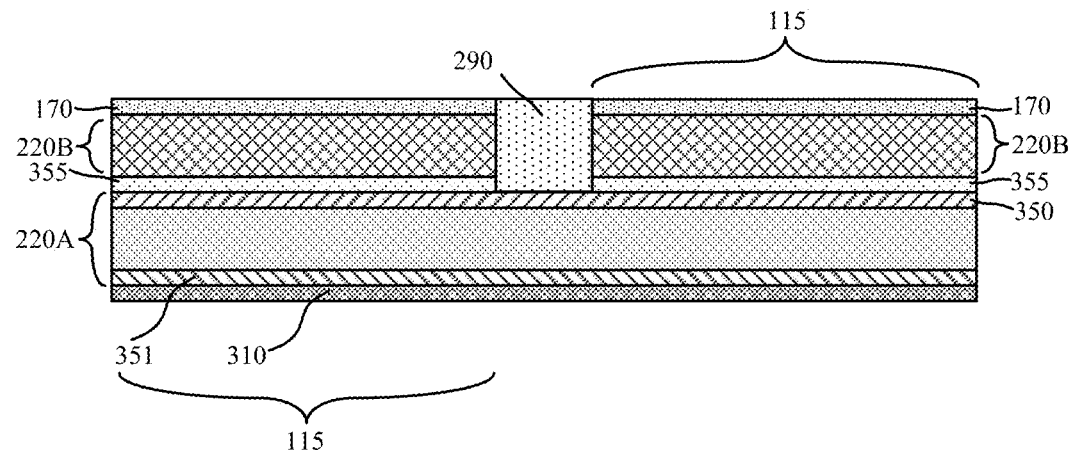

FIG. 6 is a flow chart and FIGS. 7A-7E are schematic cross-sectional side view illustrations of a method for forming exemplary solar cell module 100 according to the embodiment in FIG. 5A. In the interest of clarity and conciseness, the method of FIG. 6 is described concurrently with the illustrations of FIGS. 7A-7E. As shown in FIG. 7A, the process sequence can begin at operation 6010 with a portion of the conductive recombination layer 355, the upper perovskite subcell 220B and the transparent top electrode layer 170 patterned to form a trench 191, exposing the lower silicon subcell 220A so that the insulator support 290 can adhere to the lower silicon subcell 220. For example, patterning can be done by lithography or shadow masking during deposition, or by laser patterning post deposition, etc. and combinations thereof. As shown in FIG. 7B, in operation 6020 an insulator support 290 can be printed or deposited in the trench 191 (e.g., jet, needle, etc.). In such instances, the insulator support 290 can be deposited so that a thickness of the insulator support covers the perovskite absorber layer 140 (see FIG. 2B) or higher. Further, the thickness of the insulator support 290 can vary depending on the origin of the step floor 195. For example, the step floor 195 can be patterned to expose various layers of the tandem solar cell 115, such a transport layer located below the perovskite absorber layer 140 (e.g., HTL 130), a recombination layer (e.g., recombination layer 355), a silicon substrate layer (e.g., n-doped silicon layer 350), etc. In some embodiments, the insulator support 290 can include a thickness from the exposed layer below the perovskite absorber layer 140 to cover at least the perovskite absorber layer 140. In other embodiments, the thickness of the insulator support 290 can further cover additional layers, such as a transport layer located above the perovskite absorber layer 140 (e.g., ETL 150), an electrode layer (e.g., top electrode layer 170), etc. In this way, the insulator support can fill only a portion of trench 191 or an entirety of trench 191. In the embodiment illustrated in FIG. 7B, the insulator support 290 fills the entirety of trench 191 to cover top electrode layer 170.

Figure 7C:
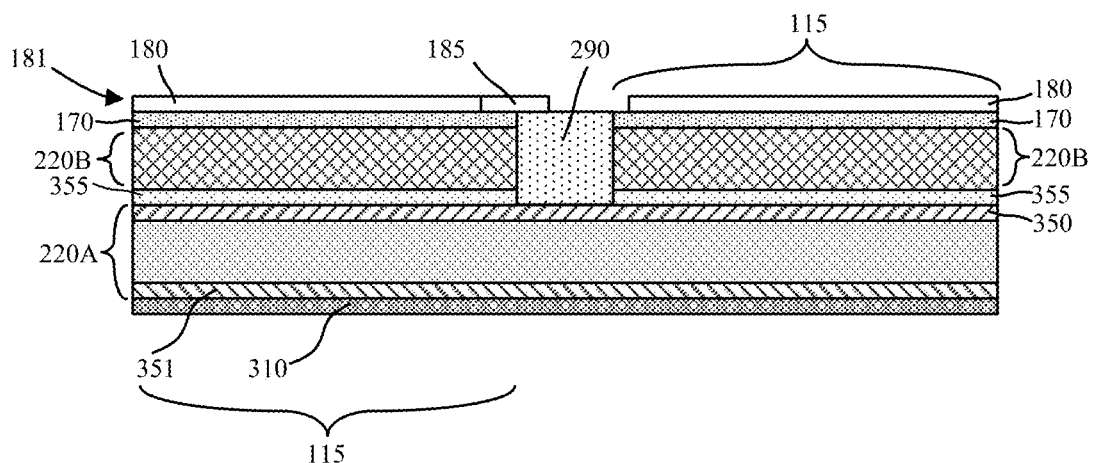
Figure 7D:
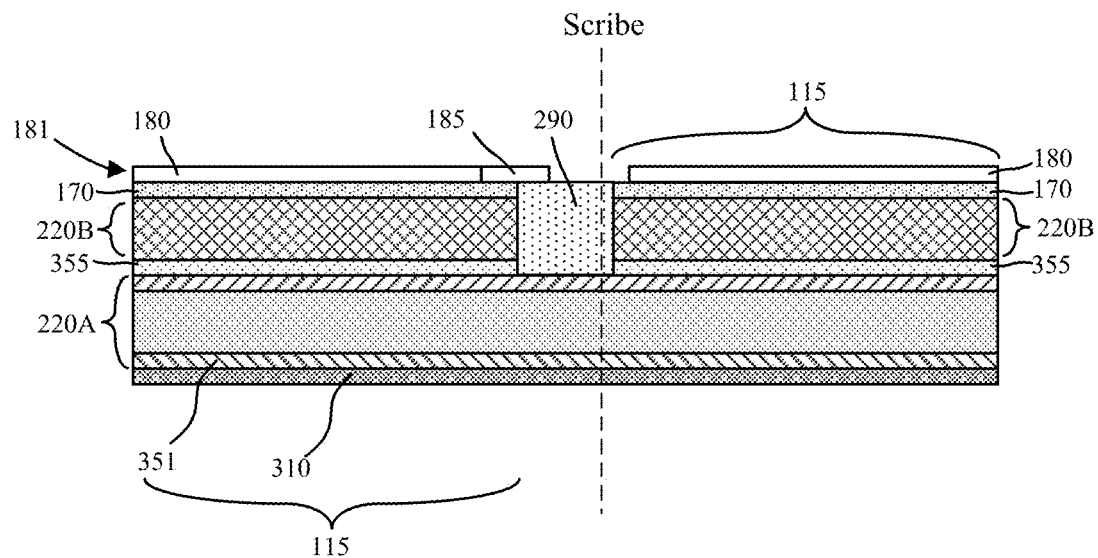

In operation 6030, FIG. 7C shows the top metal pattern 181 (e.g., metal finger 180 electrodes, busbar 185, etc.) applied to a top side of the solar cell. In such instances, the metal finger 180 electrodes and busbar 185 of the top metal pattern 181 can be printed or deposited in one or multiple operations. Note, the metal busbar 185 may at least partially cover the insulator support 290 but not fully cover the insulator support so as to leave room for scribing. Referring now to FIG. 7D in operation 6040 the full tandem solar cell wafer can be scribed/broken or otherwise caused to separate (e.g., thermal laser separation, etc.) along an axis that passes through the insulator support 290 within trench 191, which becomes the step surface with step edge 194 and step floor 195 after separation. As a result, the full tandem solar cell wafer separates into the multiple tandem solar cells 115. While only two tandem solar cells 115 are shown in the process flow, this is exemplary and it is understood a plurality of tandem solar cells can be formed from a single wafer. At operation 6050, FIG. 7E shows a top side of a first tandem solar cell 115A (lower solar cell) and a back side of a second tandem solar cell 115B (upper solar cell) bonded with an electrically conductive bonding material 190, for example as part of the solar module of FIG. 1.

Figure 7E:
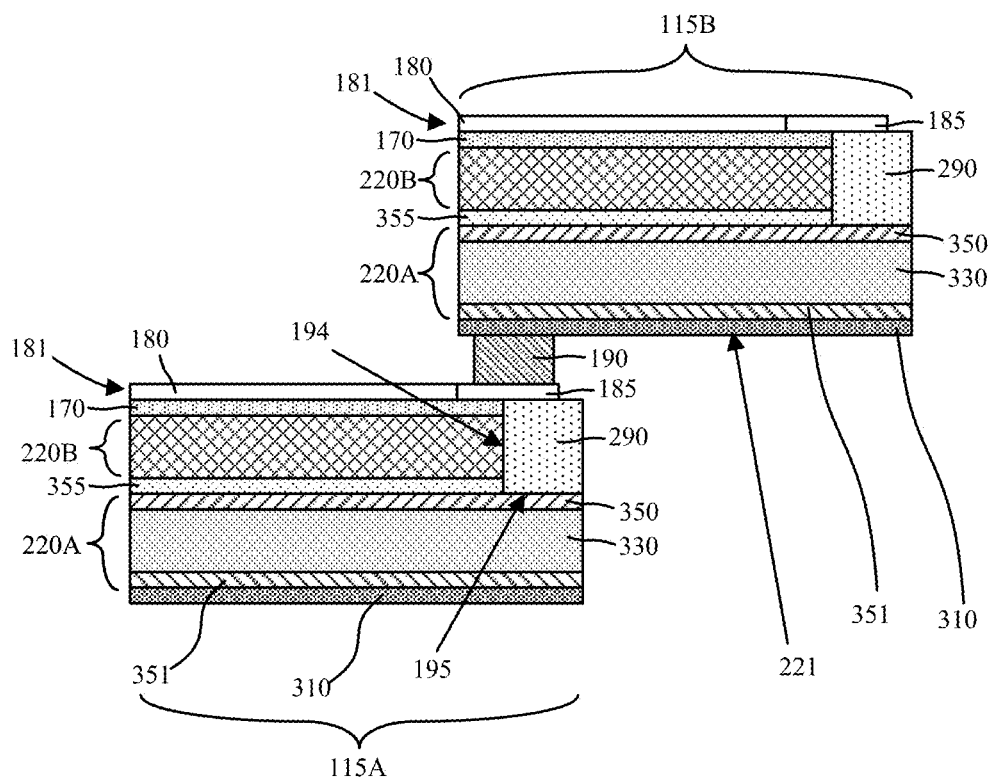

Referring briefly back to the scribe line of FIG. 7D and the overlapping tandem solar cells of FIG. 7E it is to be appreciated that location of the scribe line may have an impact on the structure of the left sides of the tandem solar cells 115. For example, if the scribe line were to proceed through a center of the insulator support 290 and trench 191 it is foreseeable that a step surface, and insulator support 290, can also exist on the left-hand side of the tandem solar cells 115.

FIG. 7F illustrates a process variation of the method for forming an exemplary solar cell module 100 according to the embodiment of FIG. 5A. The example of FIG. 7F is similar to operation 6020 (as illustrated in FIG. 7B) in that the insulator support 290 fills the entirety of trench 191. However, FIG. 7F differs from operation 6030 (as illustrated in FIG. 7C) in that the process variation illustrated in FIG. 7F includes a busbar that spans across the entirety of trench 191 so that the busbar comes into contact with both sets of metal finger 180 electrodes on either side of trench 191. In addition, FIG. 7F differs from operation 6040 (as illustrated in FIG. 7D) in that the process variation illustrated in FIG. 7F includes a scribe centered on trench 191 to create a step surface and its corresponding support structure on either side of the scribe.

FIG. 7G illustrates a full tandem solar cell wafer 101 that includes top electrode layer 170, metal finger 180 electrodes, busbar 185, as well as scribes S1-S5. In the example of FIG. 7G, scribes S1, S3 and S5 cut through the center of busbar 185 in a manner similar to the example illustrated in FIG. 7F.

In addition, metal finger 180 electrodes can be patterned to include a gap so that additional scribes (e.g., scribe S2, scribe S4, etc.) can pass through the gap. For example, FIG. 7H illustrates a closeup view of section A of FIG. 7G, in which metal pattern 181 includes gap G1 so that scribe S4 can cut through gap G1.

Figure 8A:
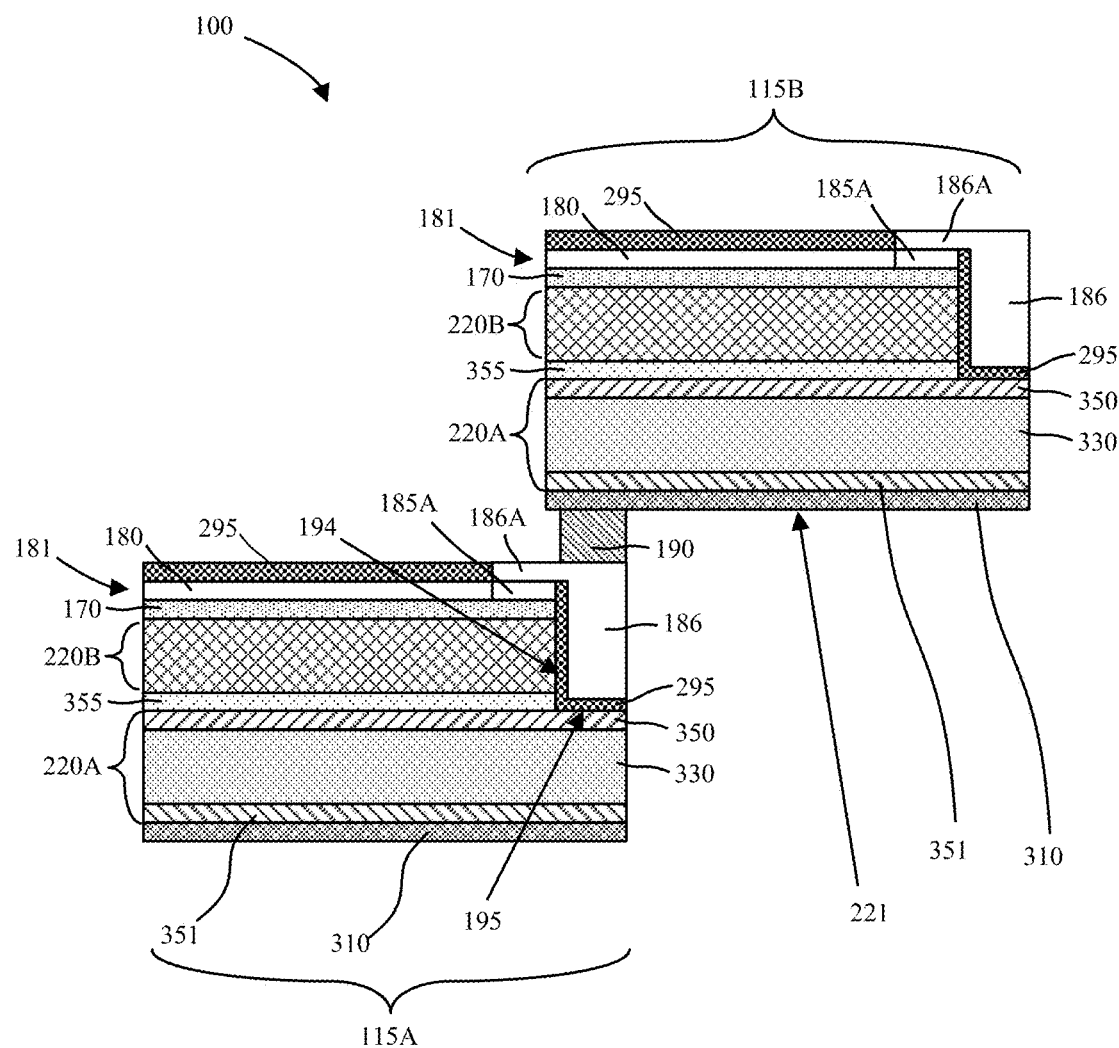
FIG. 8A is a schematic cross-sectional side view illustration of an exemplary solar cell module with a pair of overlapped solar cells in accordance with an embodiment.

Referring now to FIG. 8A, a schematic cross-sectional side view illustration is provided for a pair of overlapped solar cells in accordance with an embodiment. The embodiment described in FIG. 8A is substantially similar to the embodiment described in FIG. 5A, with one difference being that electrically conductive support 186 functions as the support structure, which can similarly serve to absorb the stress placed on the (lower) first tandem solar cell 115A by the (upper) second tandem solar cell 115B. In addition, a top portion 186A of the electrically conductive support 186 can contact busbar 185A of top metal pattern 181 so that the top portion 186A and busbar 185A (which underlies top portion 186A), in conjunction, can span across/over the tandem solar cells and provide an interconnection between metal finger 180 electrodes to effectively function as a busbar. Further, the embodiment described in FIG. 8A also includes a dielectric layer 295 for surface passivation and to prevent shorting by the electrically conductive support 186.

As shown, solar cell module 100 can include a first tandem solar cell 115A (lower solar cell) and a second tandem solar cell 115B (upper solar cell). The first tandem solar cell 115A (lower solar cell) includes a first lower silicon subcell 220A, a first upper perovskite subcell 220B, a step surface that includes a step edge 194 and a step floor 195, a busbar 185A, an electrically conductive support 186 and a dielectric layer 295 (e.g., oxide layer, etc.). The dielectric layer 295 can be deposited in a single layer by a single process (e.g., atomic layer deposition, sputtering, plasma-enhanced chemical vapor deposition, etc.) or in multiple layers by one process or any combination of processes. In an embodiment, the dielectric layer 295 is an oxide barrier layer. The step surface can include a trench or ledge within an upper perovskite subcell. In addition, step edge 194 can extend from a step floor 195 across a thickness of the upper perovskite subcell as previously described. The dielectric layer 295 can be deposited to coat the step edge 194 and step floor 195 in order to provide surface passivation for electrically conductive support 186. The electrically conductive support 186 can be deposited to fill the trench/ledge either completely or partially in order to absorb the stress exerted on the first tandem solar cell 115A (lower solar cell) by the second tandem solar cell 115B (upper solar cell).

In further reference to FIG. 8A, the first tandem solar cell 115A (lower solar cell) includes a first conductive recombination layer 355 located below the first upper perovskite subcell 220B, and a first transparent top electrode layer 170 located over the first upper perovskite subcell 220B. Like the example of FIG. 5A in which the plurality of metal finger 180 electrodes and the busbar 185 of the first top metal pattern 181 can be formed in the same operation, in the example of FIG. 8A, the plurality of metal finger 180 electrodes and the busbar 185A can similarly be formed in the same operation. However, unlike the example of FIG. 5A, the example of FIG. 8A further includes electrically conductive support 186 with top portion 186A that contacts busbar 185A to provide the interconnection between the metal finger 180 electrodes. As such, these separate busbar components (busbar 185A and top portion 186A) are formed separately in multiple operations but combine to function as a busbar by providing an interconnection between metal finger 180 electrodes. In other embodiments, the solar cell module may not include busbar 185A. In such embodiments, electrically conductive support 186 (including top portion 186A) can itself function as a busbar by providing the interconnection between metal finger 180 electrodes while also absorbing the stresses associated with attaching an upper tandem solar cell.

Referring to the example of FIG. 8A, the plurality of metal finger 180 electrodes of the first top metal pattern 181 can be formed over the first transparent top electrode layer 170 of the first tandem solar cell 115A (lower solar cell). Further, the dielectric layer 295 can be deposited over the plurality of metal finger 180 electrodes and busbar 185A of the first top metal pattern 181 as well the step edge 194 and step floor 195 to provide surface passivation for electrically conductive support 186 to be subsequently deposited. The dielectric layer 295 can then be patterned to form an opening that exposes busbar 185A of the top metal pattern 181. The electrically conductive support 186 can then be deposited within the opening in the dielectric layer 295 so that top portion 186A of the electrically conductive support 186 makes electrical contact with busbar 185A. As shown, the electrically conductive support 186 can also be deposited to fill the trench/ledge completely or partially in order for the electrically conductive support 186 to absorb the stress exerted on the first tandem solar cell (lower solar cell) by the second tandem solar cell (upper solar cell). In the example of FIG. 8A, the electrically conductive support 186 is deposited to completely fill the trench and additionally to span a top surface of the first tandem solar cell 115A so that the top portion 186A of electrically conductive support 186 contacts busbar 185A of the top metal pattern 181 and consequently comes into contact with the multiple metal finger 180 electrodes of the top metal pattern 181. In this way, top portion 186A of the electrically conductive support 186 and busbar 185A of the top metal pattern 181 combine to act as a busbar that interconnects the multiple metal finger 180 electrodes. Further, the first tandem solar cell 115A (lower solar cell) includes the first lower silicon subcell 220A, which can include an n-doped silicon layer 350 located above a p-doped silicon substrate 330, and p+ doped backside layer 351 located below the p-doped silicon substrate 330. It is to be appreciated that this arrangement of doped layers is exemplary, and that doping may be reversed. Further, a back side contact 310 may also be formed underneath the p-doped silicon substrate 330.

In further reference to FIG. 8A, the back side 221 of the second lower silicon subcell 220A can be bound to the electrically conductive support 186 of the first tandem solar cell 115A with the electrically conductive bonding material 190. As shown, the electrically conductive bonding material 190 is positioned directly over a portion of the electrically conductive support 186. In this way, the electrically conductive bonding material 190 and its position relative to electrically conductive support 186 can provide a more robust mechanical connection between solar cells and can also reduce/absorb any stress placed on the perovskite subcell during the assembly and handling of the solar module. In other embodiments, the electrically conductive bonding material 190 can be placed in other positions relative to the electrically conductive support so as to further reduce the amount of stress placed on the perovskite subcell (e.g., electrically conductive bonding material 190 positioned substantially over electrically conductive support 186, etc.).

Figure 8B:
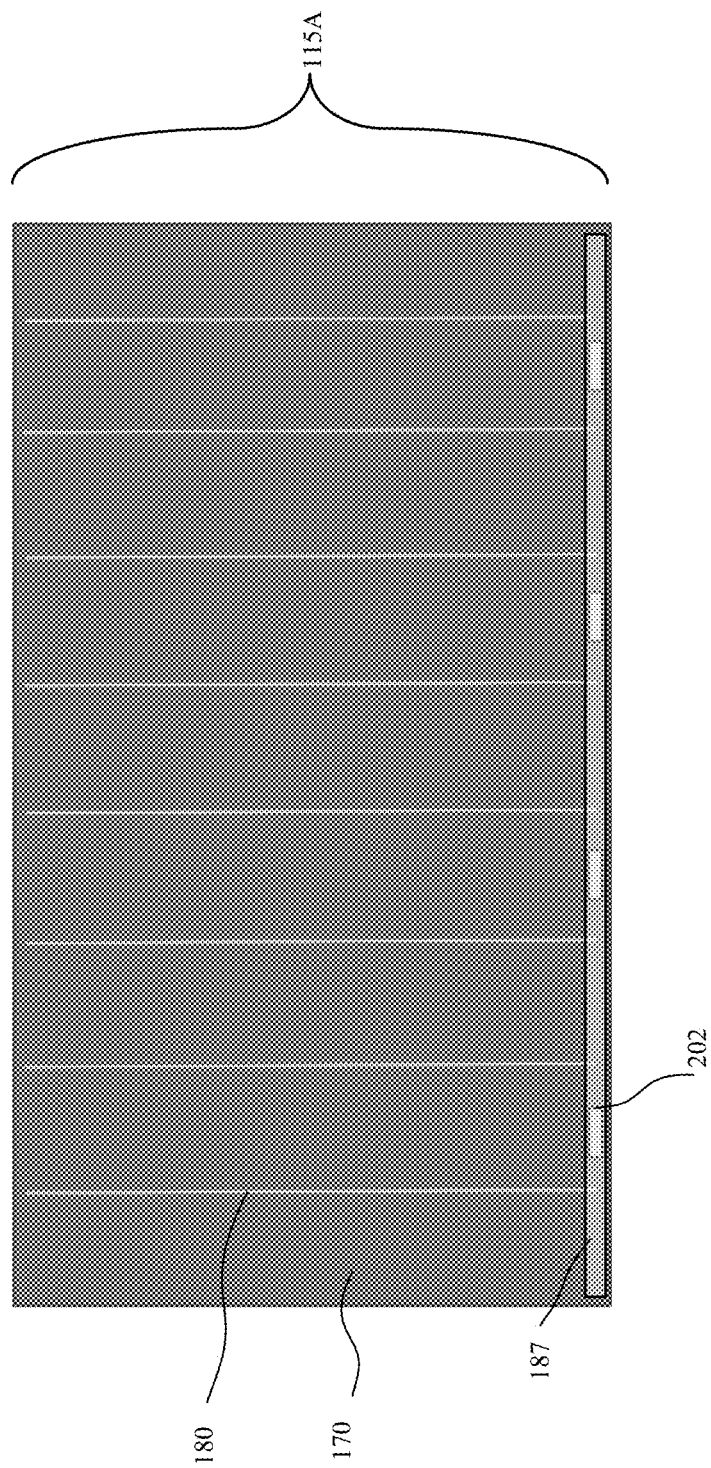
FIG. 8B is a schematic top view illustration of an exemplary solar cell module in accordance with a variation.
Figure 8C:
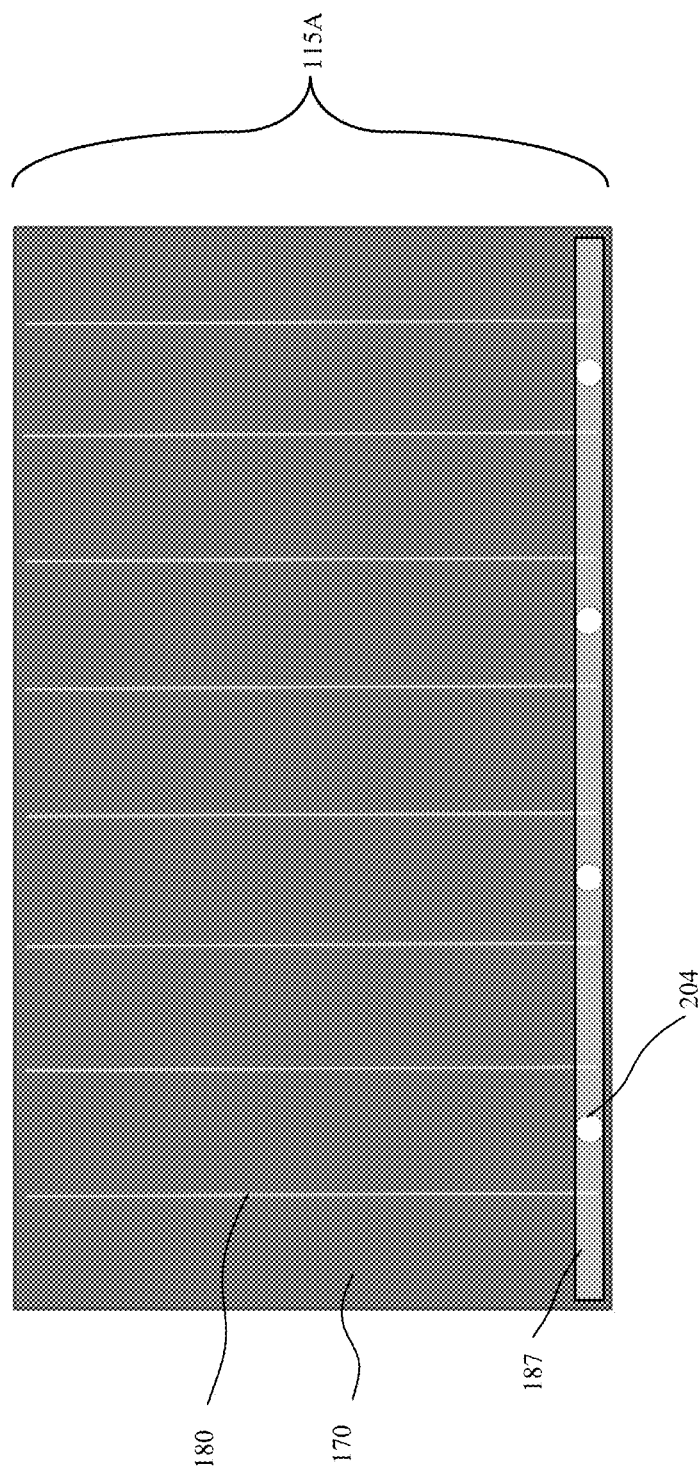
FIG. 8C is a schematic top view illustration of an exemplary solar cell module in accordance with another variation.

In reference to FIGS. 8B-8C, FIG. 8B illustrates a schematic top view of a first tandem solar cell 115A with a plurality of slits/slots; FIG. 8C illustrates a schematic top view of a first tandem solar cell 115A with a plurality of vias. For clarity, dielectric layer 295 has been omitted from FIGS. 8B-8C so that the features described can be made visible in the illustration. The embodiments described in FIGS. 8B-8C are similar to the embodiments described in FIG. 3A and FIG. 8A in that a top side of the first tandem solar cell 115A can be bonded to a back side of a second tandem solar cell (e.g., second tandem solar cell 115B) to form a solar cell module. However, rather than a step surface and its corresponding support structure (e.g., electrically conductive support 186, etc.) that continuously spans a step surface of the solar cell as depicted in FIG. 3A, FIGS. 8B-8C include a plurality of slits/slots and vias, respectively, that can be intermittently positioned at various intervals along an edge of the solar cell. In this way, the embodiments depicted in FIGS. 8B-8C can provide the same or an even greater amount of structural support as the embodiments depicted in FIG. 3A and FIG. 8A, but also introduce less shorting paths to the back side of the silicon subcell. In reference to FIGS. 8B-8C, the plurality of slits/slots 202 or vias 204 can be formed to approximate the dimensions of the step edge 194 and step floor 195 described in FIG. 8A and can then be filled with the same insulators and metallizations described herein to form the support structures (e.g., electrically conductive support 186, etc.). Further, an additional busbar, busbar 187, can be applied (e.g., screen-printed, sputtered, etc.) to an area over the slits/slots 202 or vias 204 as depicted in FIGS. 8B-8C in order to facilitate an electrical connection between the individual slits/slots 202 and vias 204 to the fingers on the solar cell.

Figure 9:
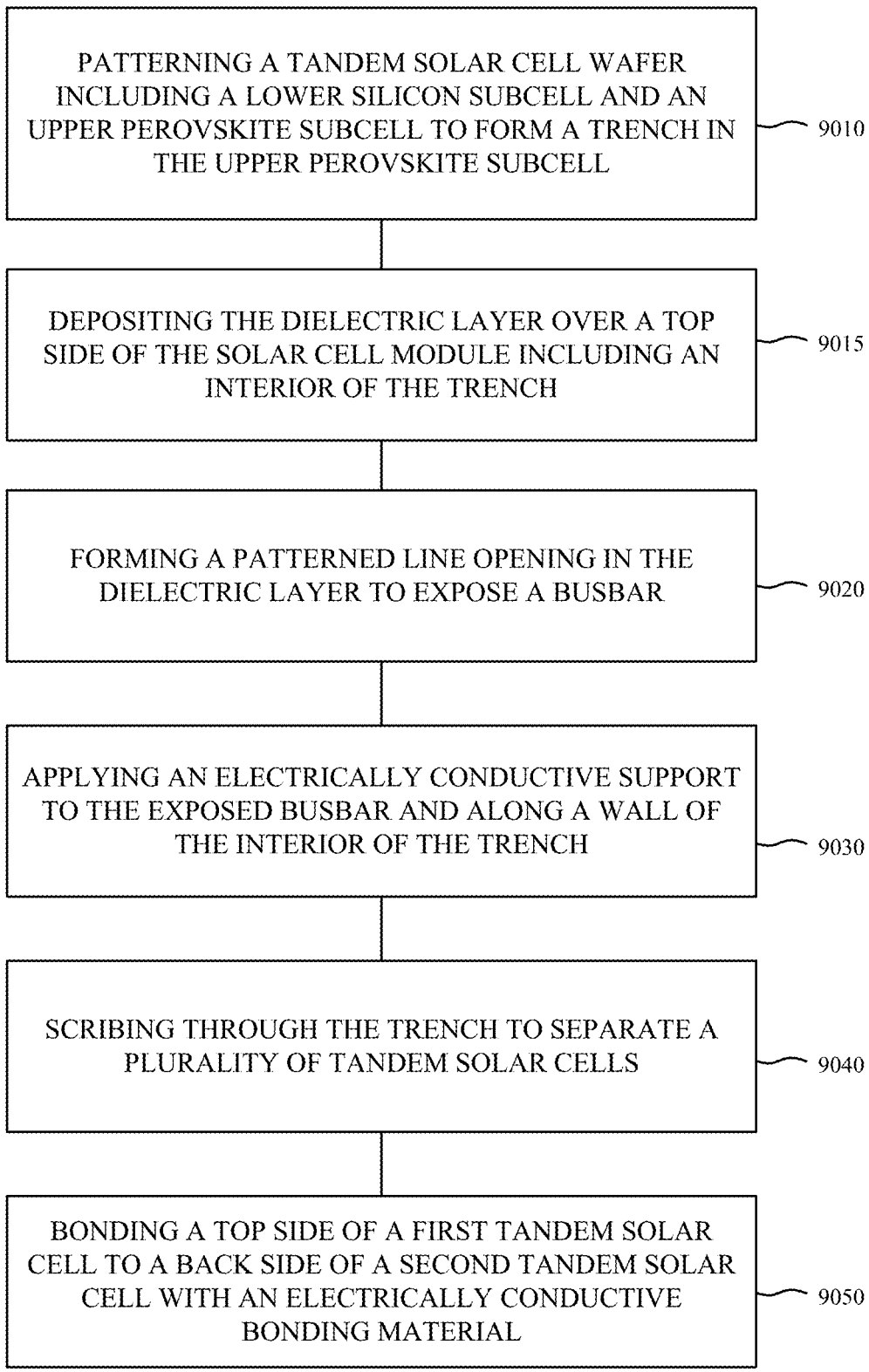
FIG. 9 is a flow chart of a method of forming an exemplary solar cell module with a pair of overlapped solar cells in accordance with an embodiment.
Figure 10A:
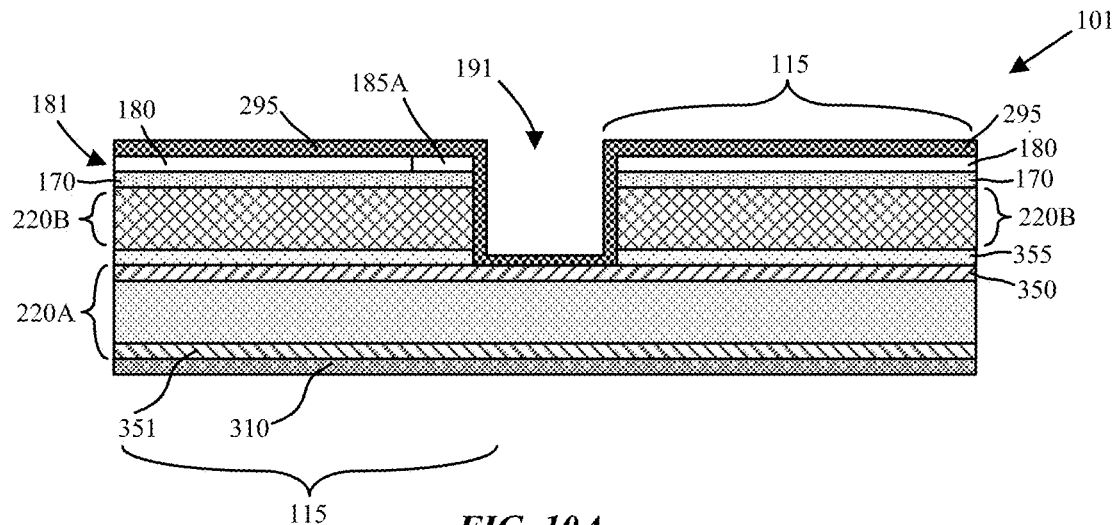
FIGS. 10A-10E are schematic cross-sectional side view illustrations of a method of forming an exemplary solar cell module with a pair of overlapped solar cells in accordance with an embodiment.
Figure 10B:
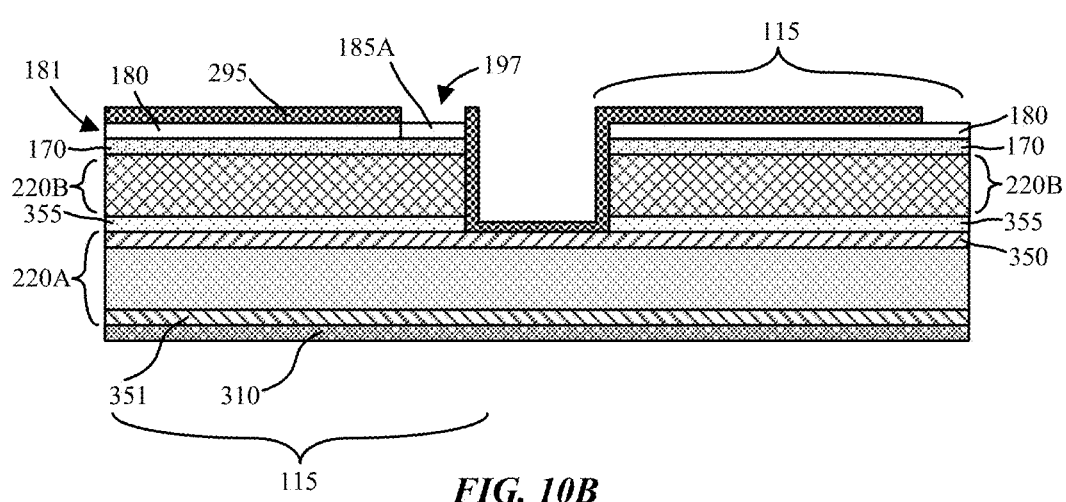
Figure 10C:
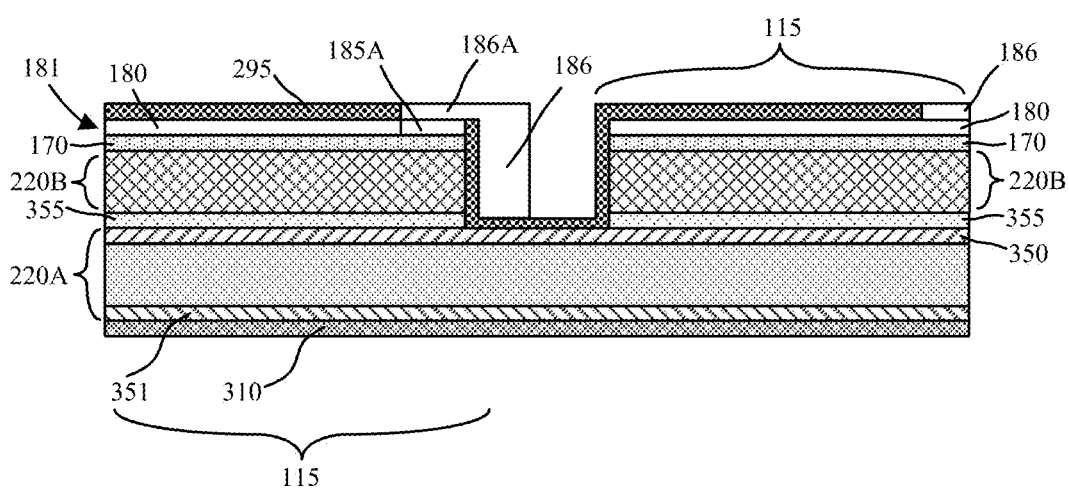
Figure 10D:
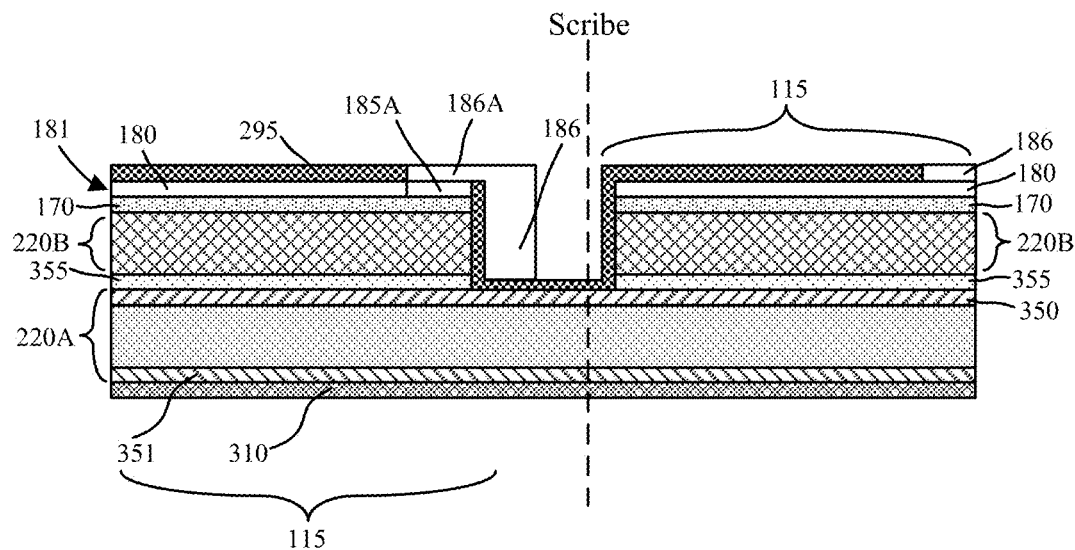
Figure 10E:
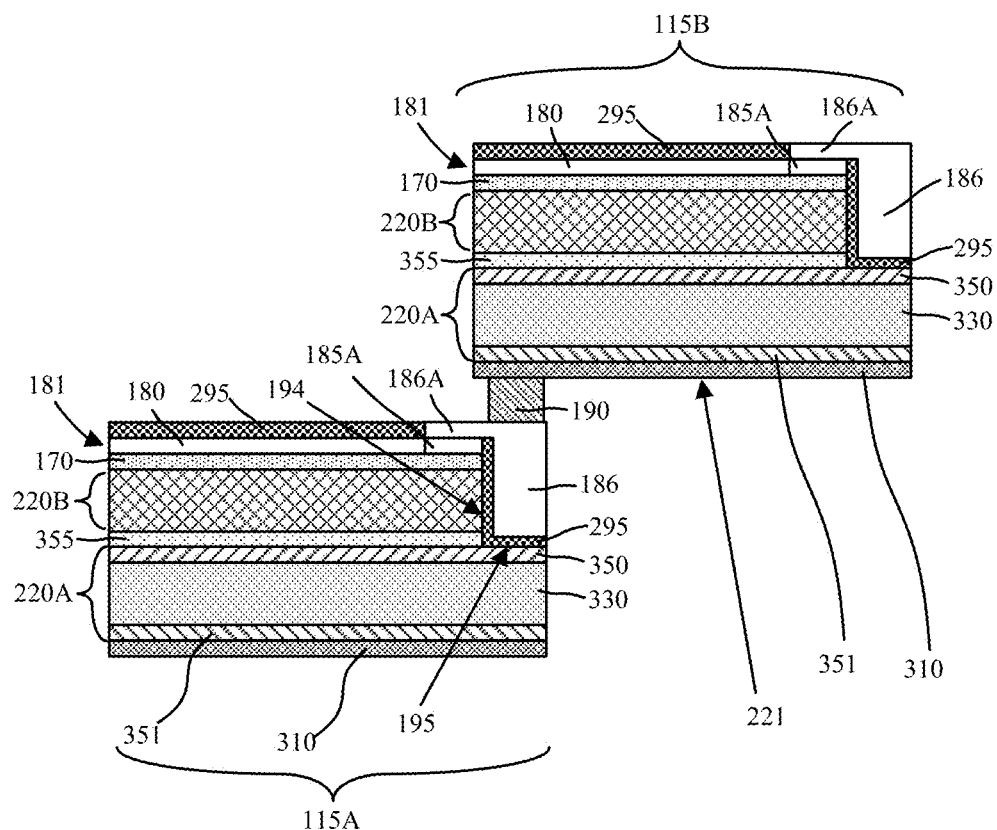

FIG. 9 is a flow chart and FIGS. 10A-10E are schematic cross-sectional side view illustrations of a method of forming exemplary solar cell module 100 according to the embodiment in FIG. 8A. In the interest of clarity and conciseness, the method of FIG. 9 is described concurrently with the illustrations of FIGS. 10A-10E. As shown in FIG. 10A, the process sequence can begin at operation 9010 with patterning a portion of the conductive recombination layer 355, the upper perovskite subcell 220B and the transparent top electrode layer 170 to form a trench 191, applying the metal finger 180 electrodes and busbar 185A of the top metal pattern 181, and then depositing a conformal dielectric layer 295 (e.g., oxide layer) to coat a top side of the solar cell wafer 101 as well as an interior of the trench 191 at operation 9015. Further, relative to busbar 185 depicted in the example of FIG. 5A, busbar 185A depicted here may be thinner (e.g., ~100-500 microns wide, etc.). Referring now to FIG. 10B, at operation 9020 a patterned line opening 197 is then formed through the dielectric layer 295 to expose busbar 185A of the top metal pattern 181. In accordance with embodiments, the patterned line openings 197 may have a longitudinal length (into the drawings page) that is parallel to a longitudinal length of the trenches 191. For operation 9030, FIG. 10C shows electrically conductive support 186 printed over the exposed portion (185A) of the metal finger 180 electrodes and also printed/deposited into the trench 191 coated by the dielectric layer 295. In other embodiments in which busbar 185A is not present, electrically conductive support 186 can be printed directly onto the exposed portion of the metal finger 180 electrodes and also printed/deposited into the trench 191 so that the electrically conductive support 186 (including top portion 186A) can itself function as a busbar without the aid of an underlying busbar, such as busbar 185A. The portion of the electrically conductive support 186 within the trench may completely span the depth of the trench 191 not already partially filled by the dielectric layer 295. The electrically conductive support 186 may completely fill the trench 191 width, or preferably be located along a single sidewall that will become the step edge 194 of the step surface. In an embodiment the electrically conductive support 186 is printed with a silver ink/paste which can be the same or different material used to form the metal finger 180 electrodes. A thixotropic paste can be used to prevent slumping and provide accurate placement within the trench 191. For operation 9040, FIG. 10D shows the full tandem solar cell 115 being scribed/broken or otherwise separated (e.g., thermal laser separation, etc.) along an axis that passes through the trench. As a result, the full tandem solar cell wafer 101 separates into a plurality of tandem solar cells. At operation 9050, FIG. 10E shows a top side of a first tandem solar cell 115A (lower solar cell) and a back side of a second tandem solar cell 115B (upper solar cell) bonded with an electrically conductive bonding material 190.

Similar to the previous description of FIGS. 7D-7E, location of the scribe line may have an impact on the structure of the left sides of the tandem solar cells 115. For example, if the scribe line were to proceed through a center of the trench 191 it is foreseeable that a step surface, and dielectric layer 295 (and even a portion of the electrically conductive support 186) can also exist on the left-hand side of the tandem solar cells 115.

FIG. 10F illustrates a process variation of the method for forming an exemplary solar cell module 100 according to the embodiment of FIG. 8A. The example of FIG. 10F differs from operation 9030 (as illustrated in FIG. 10C) in that the process variation illustrated in FIG. 10F includes an electrically conductive support that fills the entirety of trench 191 and spans across the entirety of trench 191 so that electrically conductive support 186 comes into contact with both sets of metal finger 180 electrodes on either side of trench 191. In addition, FIG. 10F differs from operation 9040 (as illustrated in FIG. 10D) in that the process variation illustrated in FIG. 10F includes a scribe centered on trench 191 to create a step surface and its corresponding support structure on either side of the scribe.

FIG. 10G illustrates a full tandem solar cell wafer 101 that includes top electrode layer 170, metal finger 180 electrodes, electrically conductive support 186, as well as scribes S1-S5. For clarity, dielectric layer 295 has been omitted from FIG. 10G so that metal finger 180 electrodes can be made visible in the illustration. In the example of FIG. 10G, scribes S1, S3 and S5 cut through the center of electrically conductive support 186 in a manner similar to the example illustrated in FIG. 10F. In addition, metal finger 180 electrodes can be patterned to include a gap so that additional scribes (e.g., scribe S2, scribe S4, etc.) can pass through the gap. For example, FIG. 10H illustrates a closeup view of section A of FIG. 10G, in which top metal pattern 181 includes gap G1 so that scribe S4 can cut through gap G1.

Figure 11A:
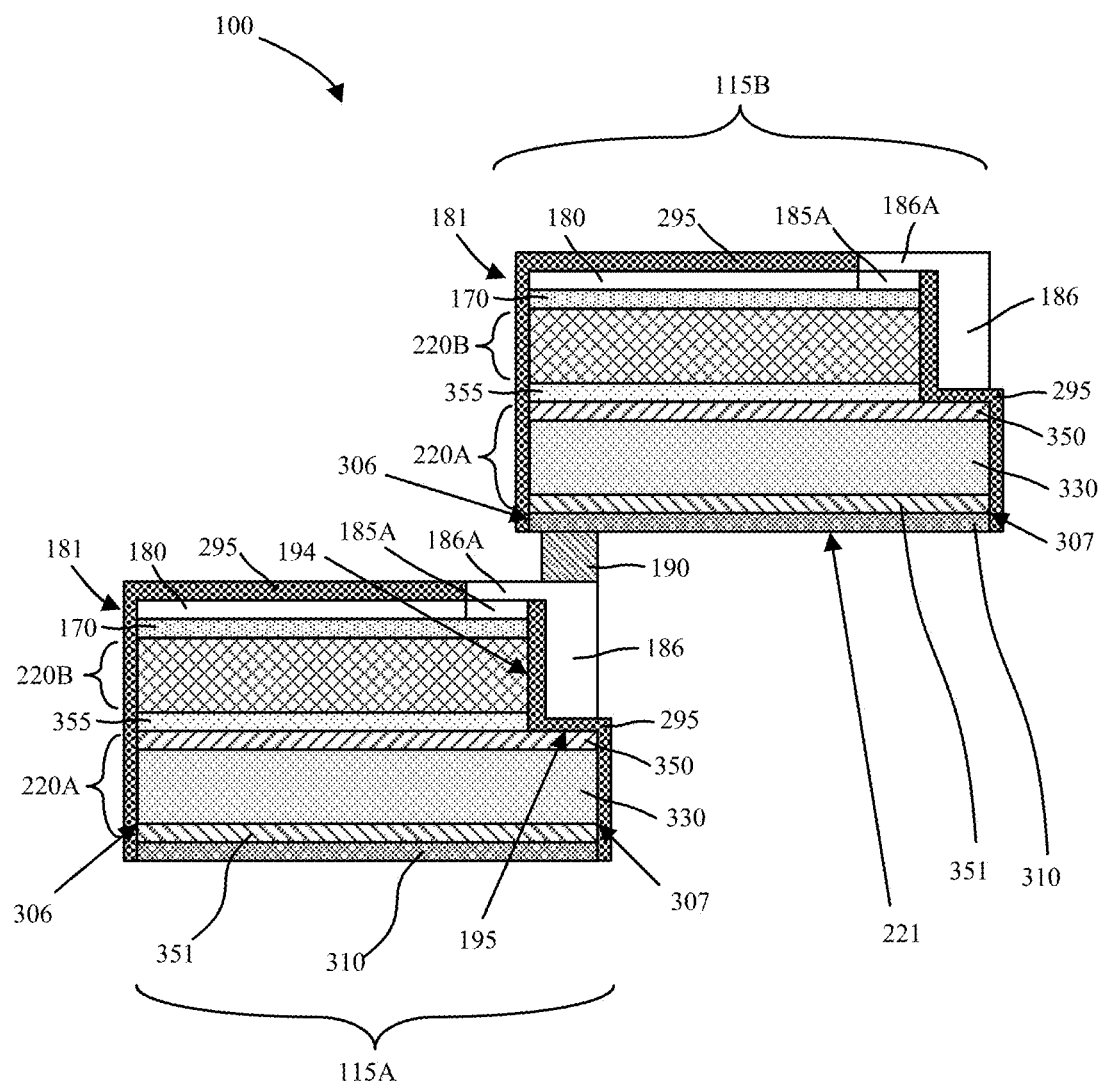
FIG. 11A is a schematic cross-sectional side view illustration of an exemplary solar cell module with a pair of overlapped solar cells in accordance with an embodiment.

Referring now to FIG. 11A, a schematic cross-sectional side view illustration is provided for a pair of overlapped solar cells in accordance with an embodiment. The embodiment described in FIG. 11A is substantially similar to the embodiment described in FIG. 8A, except procedurally in that the tandem solar cell wafer is scribed before the application of the dielectric layer 295, which allows the dielectric layer 295 to not only coat a top surface and an interior of the trench as described in FIG. 8A, but also to coat the outer edges 306, 307 of the first and second tandem solar cells.

As shown, solar cell module 100 can include a first tandem solar cell 115A (lower solar cell) and a second tandem solar cell 115B (upper solar cell). The first tandem solar cell 115A (lower solar cell) includes a first lower silicon subcell 220A, a first upper perovskite subcell 220B, a step surface that includes a step edge 194 adjacent to the first upper perovskite subcell 220B and a step floor 195 over the first lower silicon subcell 220A, and a dielectric layer 295 (e.g., oxide layer, etc.) spanning the step floor and the step edge of the step surface. The step surface can include a trench or ledge within an upper perovskite subcell. In addition, step edge 194 can extend from a step floor 195 across a thickness of the upper perovskite subcell as previously described. Unlike the example of FIG. 8A, in the example of FIG. 11A the dielectric layer 295 can be deposited after scribing the solar cell wafer, so that the dielectric layer 295 not only coats a top layer and a step surface of the scribed tandem solar cells 115, but also outer edges 306, 307 of the scribed tandem solar cells 115. Similar to FIG. 8A, the electrically conductive support 186 can be deposited to fill the remainder of the trench/ledge completely or partially in order to function as the support structure and aid in absorbing the stress exerted on the first tandem solar cell (lower solar cell) by the second tandem solar cell (upper solar cell).

In further reference to FIG. 11A, the first tandem solar cell 115A (lower solar cell) includes a first conductive recombination layer 355 located below the first upper perovskite subcell 220B, and a first transparent top electrode layer 170 located over the first upper perovskite subcell 220B. In addition, a plurality of metal finger 180 electrodes and busbar 185A of the first top metal pattern 181 can be formed over the transparent top electrode layer 170 of the tandem solar cell wafer. Then, after scribing the plurality of tandem solar cell 115, the dielectric layer 295 can be deposited over the plurality of metal finger 180 electrodes and busbar 185A of the first top metal pattern 181, the step edge 194 and step floor 195, and also the outer edges 306, 307 of the tandem solar cells 115. The electrically conductive support 186 can then be deposited to fill the step surface completely or partially so that the electrically conductive support 186 can act as a support to absorb the stress exerted on the first tandem solar cell (lower solar cell) by the second tandem solar cell (upper solar cell) when assembled. In the example of FIG. 11A, the electrically conductive support 186 is deposited to at least partially fill the step surface width and additionally so that top portion 186A spans busbar 185A of the top metal pattern 181 that also includes the multiple metal finger 180 electrodes. Like FIG. 8A, the top metal pattern 181 is applied in multiple operations before and after formation of the dielectric layer 295. Further, the tandem solar cells 115 can each include a first lower silicon subcell, which can include an n-doped silicon layer 350 located above a p-doped silicon substrate 330, and p+ doped backside layer 351 located below the p-doped silicon substrate 330. It is to be appreciated that this arrangement of doped layers is exemplary, and that doping may be reversed. Further, a back side contact 310 may also be formed underneath the p-doped silicon substrate 330. In further reference to FIG. 11A, the back side 221 of the second lower silicon subcell 220A can be bound to the electrically conductive support 186 with electrically conductive bonding material 190. As shown, the electrically conductive bonding material 190 can be positioned substantially over a portion of the electrically conductive support 186 and step floor 195 in order to provide a more robust mechanical connection and to protect the first upper perovskite subcell 220B.

Figure 11B:
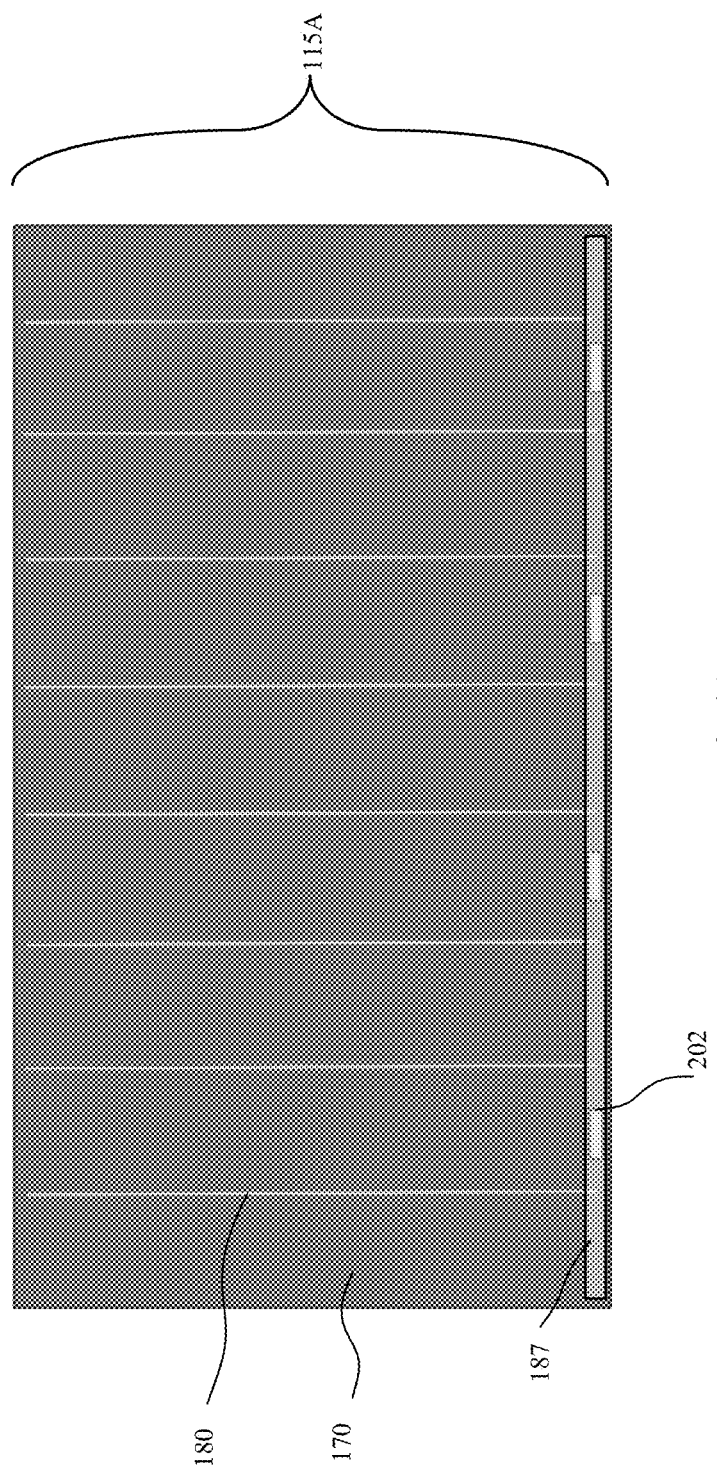
FIG. 11B is a schematic top view illustration of an exemplary solar cell module in accordance with a variation.
Figure 11C:
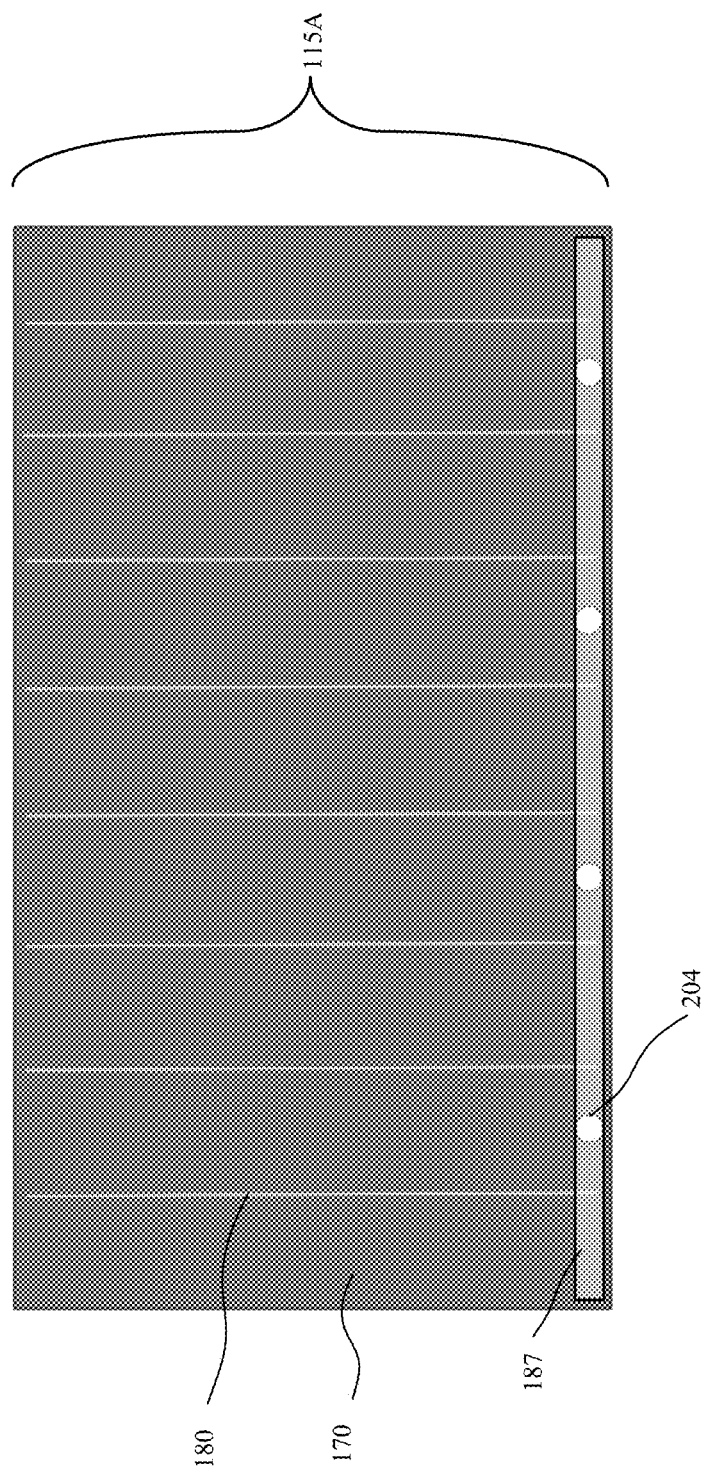
FIG. 11C is a schematic top view illustration of an exemplary solar cell module in accordance with another variation.

In reference to FIGS. 11B-11C, FIG. 11B illustrates a schematic top view of a first tandem solar cell 115A with a plurality of slits/slots; FIG. 11C illustrates a schematic top view of a first tandem solar cell 115A with a plurality of vias. For clarity, dielectric layer 295 has been omitted from FIGS. 11B-11C so that the features described can be made visible in the illustration. The embodiments described in FIGS. 11B-11C are similar to the embodiments described in FIG. 3A and FIG. 11A in that a top side of the first tandem solar cell 115A can be bonded to a back side of a second tandem solar cell (e.g., second tandem solar cell 115B) to form a solar cell module. However, rather than a step surface and its corresponding support structure (e.g., electrically conductive support 186, etc.) that continuously spans a step surface of the solar cell as depicted in FIG. 3A, FIGS. 11B-11C include a plurality of slits/slots and vias, respectively, that can be intermittently positioned at various intervals along an edge of the solar cell. In this way, the embodiments depicted in FIGS. 11B-11C can provide the same or an even greater amount of structural support as the embodiments depicted in FIG. 3A and FIG. 11A, but also introduce less shorting paths to the back side of the silicon subcell. In reference to FIGS. 11B-11C, the plurality of slits/slots 202 or vias 204 can be formed to approximate the dimensions of the step edge 194 and step floor 195 described in FIG. 11A and can then be filled with the same insulators and metallizations described herein to form the support structures (e.g., electrically conductive support 186, etc.). Further, an additional busbar, busbar 187, can be applied (e.g., screen-printed, sputtered, etc.) to an area over the slits/slots 202 or vias 204 as depicted in FIGS. 11B-11C in order to facilitate an electrical connection between the individual slits/slots 202 and vias 204 to the fingers on the solar cell.

Figure 12:
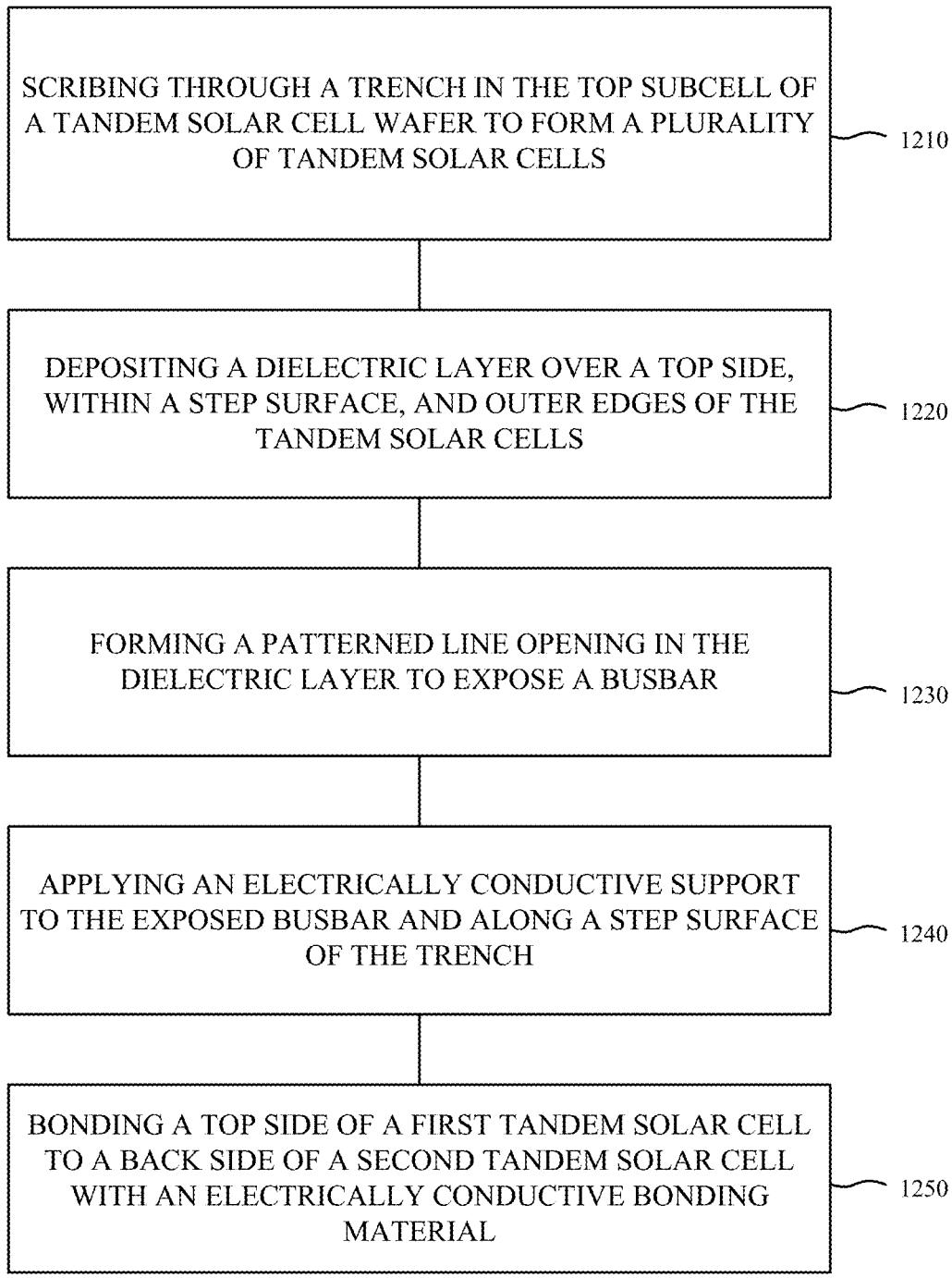
FIG. 12 is a flow chart of a method of forming an exemplary solar cell module with a pair of overlapped solar cells in accordance with an embodiment.
Figure 13A:
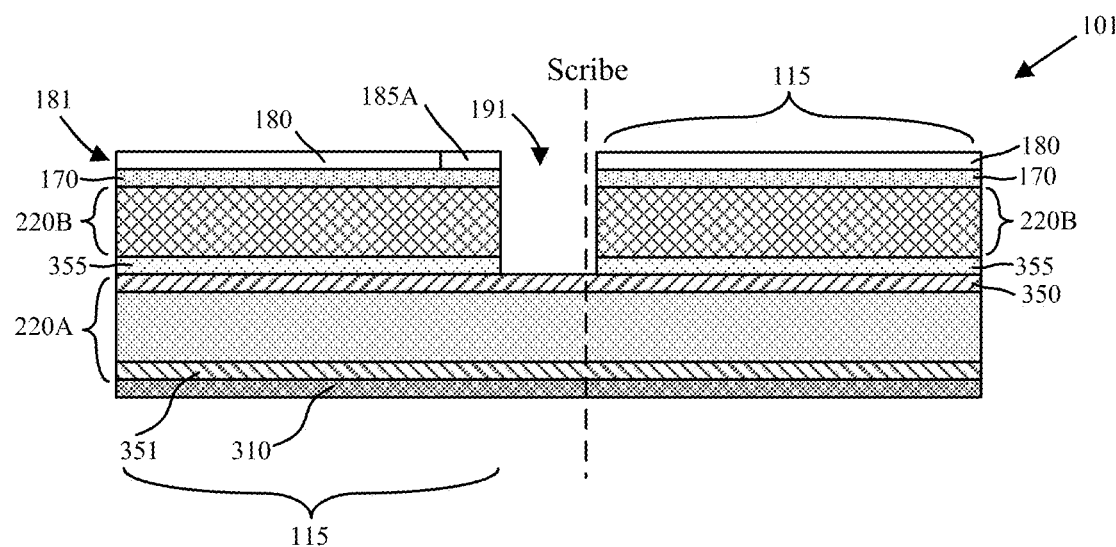
FIGS. 13A-13E are schematic cross-sectional side view illustrations of a method of forming an exemplary solar cell module with a pair of overlapped solar cells in accordance with an embodiment.

FIG. 12 is a flow chart and FIGS. 13A-13E are schematic cross-sectional side view illustrations of a method of forming exemplary solar cell module 100 according to the embodiment in FIG. 11. In the interest of clarity and conciseness, the method of FIG. 12 is described concurrently with the illustrations of FIGS. 13A-13E. At operation 1210, FIG. 13A shows the full tandem solar cell wafer 101 being scribed/broken or otherwise caused to separate (e.g., thermal laser separation, etc.) along an axis that passes through a trench 191 patterned through the conductive recombination layer 355, the upper perovskite subcell 220B, transparent top electrode layer 170, and optionally a portion of the top metal pattern 181 forming the metal finger 180 electrodes and busbar 185A. As a result of the scribing/breaking, the full tandem solar cell wafer 101 separates into multiple tandem solar cells 115. Similar to the previous description of FIGS. 7D-7E, location of the scribe line may have an impact on the structure of the left sides of the tandem solar cells 115. For example, if the scribe line were to proceed through a center of the trench 191 it is foreseeable that a step surface can also exist on the left-hand side of the tandem solar cells 115.

Figure 13B:
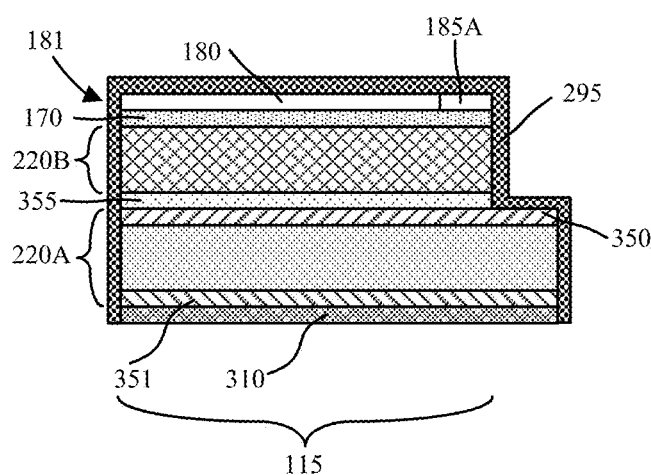
Figure 13C:
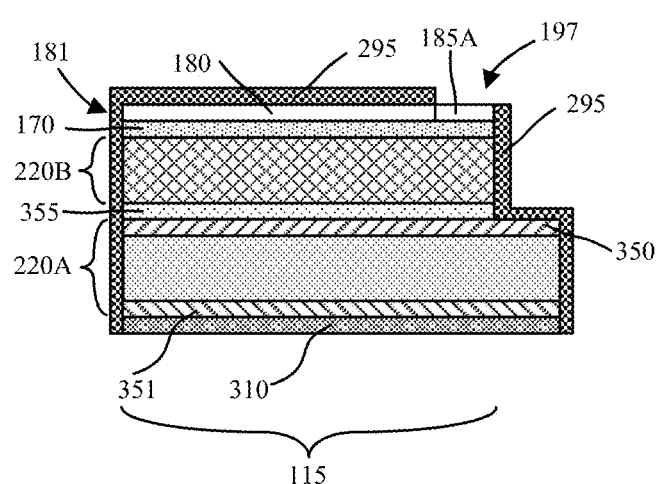
Figure 13D:
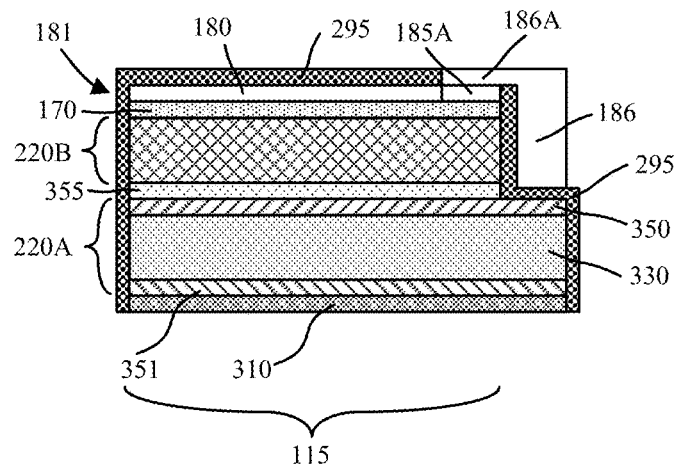
Figure 13E:
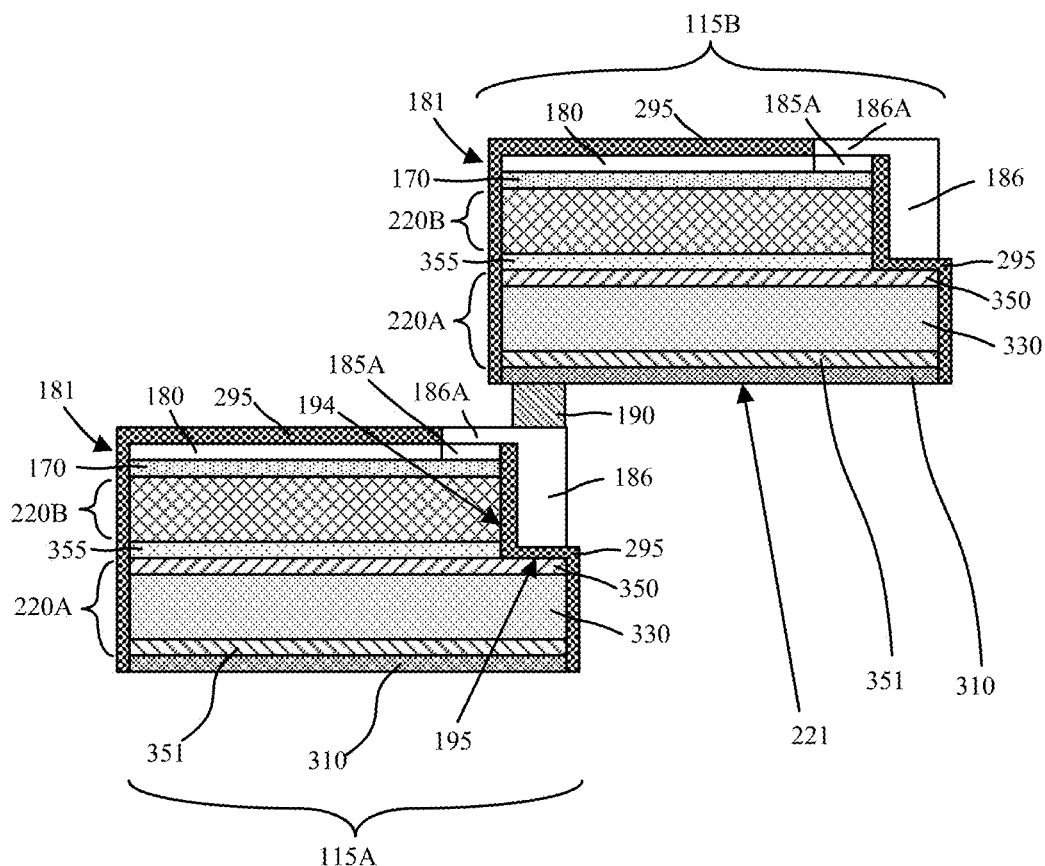

At operation 1220, FIG. 13B shows the dielectric layer 295 deposited over a plurality of metal finger 180 electrodes and busbar 185A of the top metal pattern 181, the step edge 194, step floor 195, as well as outer edges 306, 307 of the tandem solar cell. In operation 1230, FIG. 13C shows a patterned line opening 197 formed through a portion of the dielectric layer 295 to expose busbar 185A of the top metal pattern 181. In operation 1240, FIG. 13D shows the electrically conductive support 186 printed over the exposed busbar 185A as well as over the step edge 194 and the step floor 195 to at least partially fill the step surface. In operation 1250, FIG. 13E shows a top side of a first tandem solar cell 115A (lower solar cell) and a back side of a second tandem solar cell 115B (upper solar cell) bonded with an electrically conductive bonding material 190.

Figure 14A:
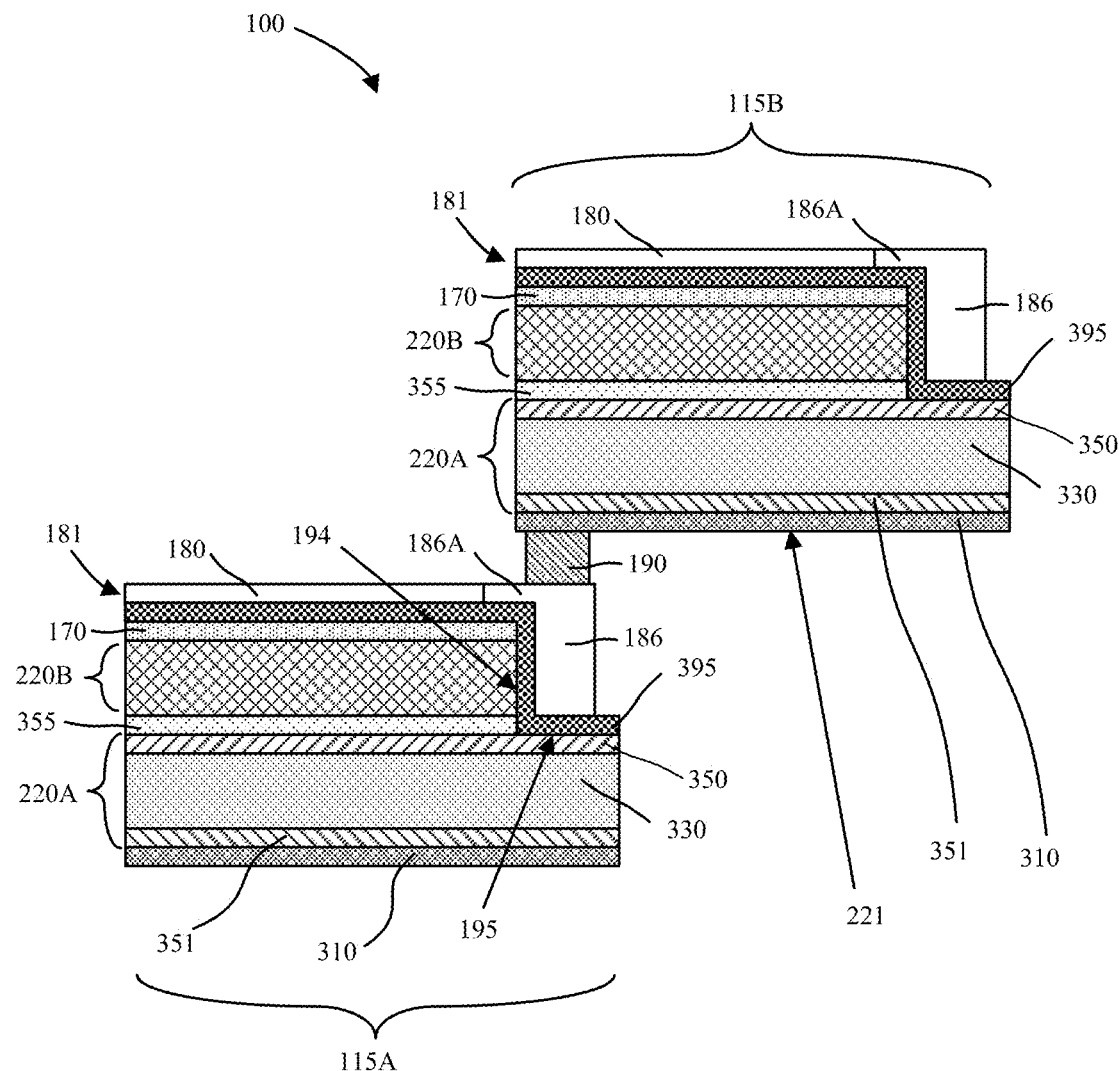
FIG. 14A is a schematic cross-sectional side view illustration of an exemplary solar cell module with a pair of overlapped solar cells in accordance with an embodiment.

Referring now to FIG. 14A, a schematic cross-sectional side view illustration is provided for a pair of overlapped solar cells in accordance with an embodiment. The embodiment described in FIG. 14A is substantially similar to the embodiments described in FIGS. 5A, 8A and 11A, with the addition of a junction layer that forms a bypass diode to create a resistive contact and prevent shunts through the electrically conductive support to the underlying silicon subcell. As shown, solar cell module 100 can include a first tandem solar cell 115A (lower solar cell) and a second tandem solar cell 115B (upper solar cell). The first tandem solar cell 115A (lower solar cell) includes a first lower silicon subcell 220A, a first upper perovskite subcell 220B, a conductive recombination layer 355 between the first lower silicon subcell 220A and the first upper perovskite subcell 220B, a first transparent top electrode layer 170 located over the first upper perovskite subcell 220B, a junction layer 395 of a first conductivity type (e.g., p-type or n-type) spanning over a top side of the first tandem solar cell 115A and directly on a portion of the first lower silicon subcell 220A, a first step surface including a first step edge 194 adjacent to the first upper perovskite subcell 220B and a step floor 195 over the junction layer where the junction layer is directly on the first lower silicon subcell 220A, and a first electrically conductive support 186 adjacent to the first step edge 194 and at least partially filling the first step surface. In accordance with embodiments a bypass diode is formed at the interface of the junction layer 395 and the first lower silicon subcell 220A to create a resistive contact preventing shunts through the electrically conductive support 186 to the lower silicon subcell 220A.

In further reference to FIG. 14A, the first tandem solar cell 115A (lower solar cell) additionally includes a first transparent top electrode layer 170 located over the first upper perovskite subcell 220B, and a first top metal pattern 181 that can be formed over the first transparent top electrode layer 170. The first top metal pattern 181 can include a plurality of metal finger 180 electrodes, which contact a top portion 186A of the electrically conductive support 186 so that the electrically conductive support 186 can function as a busbar as well as a support structure to provide mechanical support for the second tandem solar cell 115B (upper solar cell). In the example of FIG. 14A, the metal finger 180 electrodes of the first top metal pattern 181 and the top portion 186A of the electrically conductive support 186 can be simultaneously formed over the first transparent top electrode layer 170 where the electrically conductive support 186 can be additionally deposited to fill the trench/ledge either completely or partially.

The junction layers 395 in accordance with embodiments may have intrinsic conductivity types, be doped to obtain the conductivity type, or both. In an embodiment, the junction layers 395 are formed of a metal oxide semiconductor. For example, the metal oxide semiconductor can be intrinsically n-type or p-type, and may also be doped. In a particular embodiment the junction layer in an intrinsically p-type metal oxide such as NiO, V2O3, MoO3, or SnO, and may also be doped with a p-dopant. In such an embodiment, the junction layer may be formed directly on a doped silicon layer of the lower silicon subcell 220A, such as an n-doped silicon layer 350 (see FIG. 2B). In this way, the diode formed by the p-type metal oxide junction layer 395 and n-doped silicon layer 350 can prevent shunting to the underlying silicon subcell.

In the illustrated embodiment, the top portion 186A of the electrically conductive support 186 can be deposited simultaneously with the metal finger 180 electrodes of the first top metal pattern 181 or in multiple steps, where, in the example of FIG. 14A, the electrically conductive support 186 at least partially fills the trench/ledge adjacent to the upper perovskite subcell 220B. As shown, the back side 221 of the second lower silicon subcell 220A can be bound to the electrically conductive support 186 with the electrically conductive bonding material 190, where the electrically conductive bonding material 190 is positioned substantially over the electrically conductive support 186.

Figure 14B:
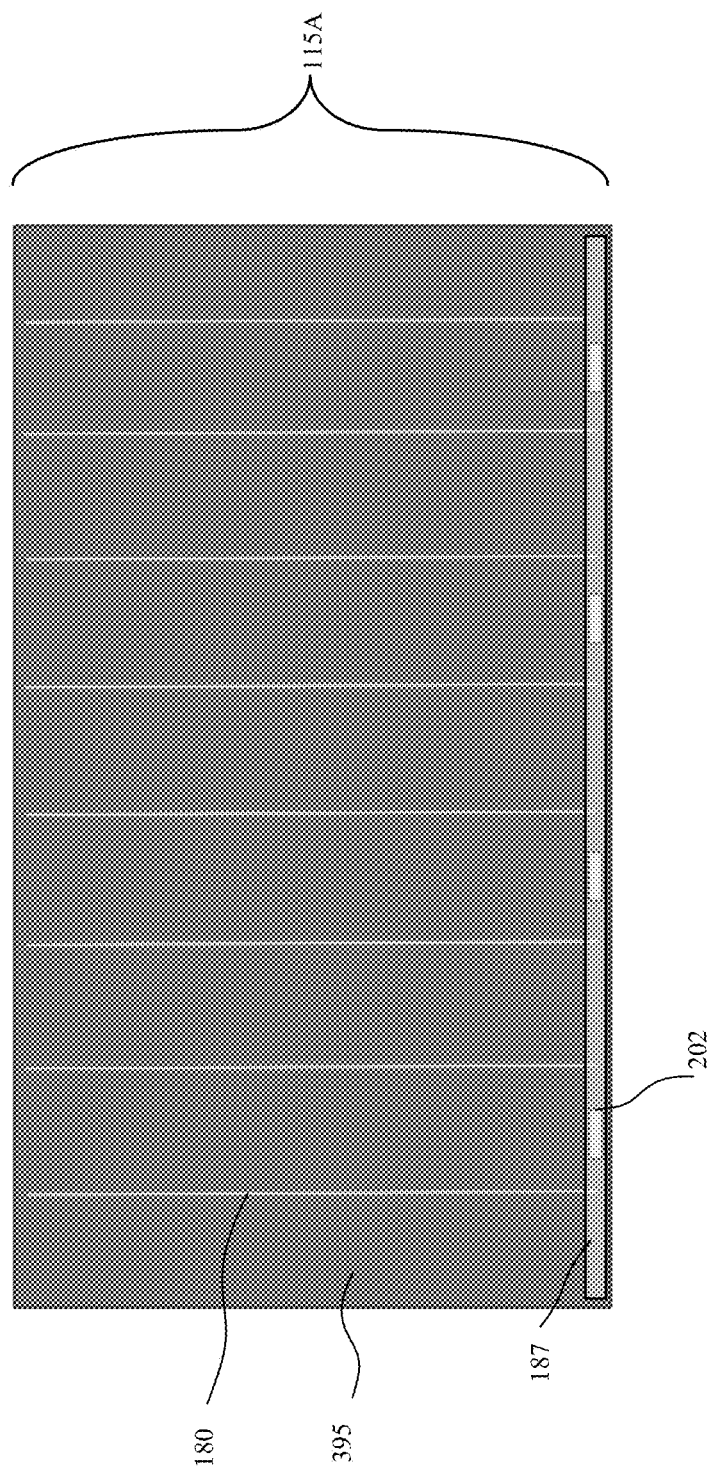
FIG. 14B is a schematic top view illustration of an exemplary solar cell module in accordance with another variation.
Figure 14C:
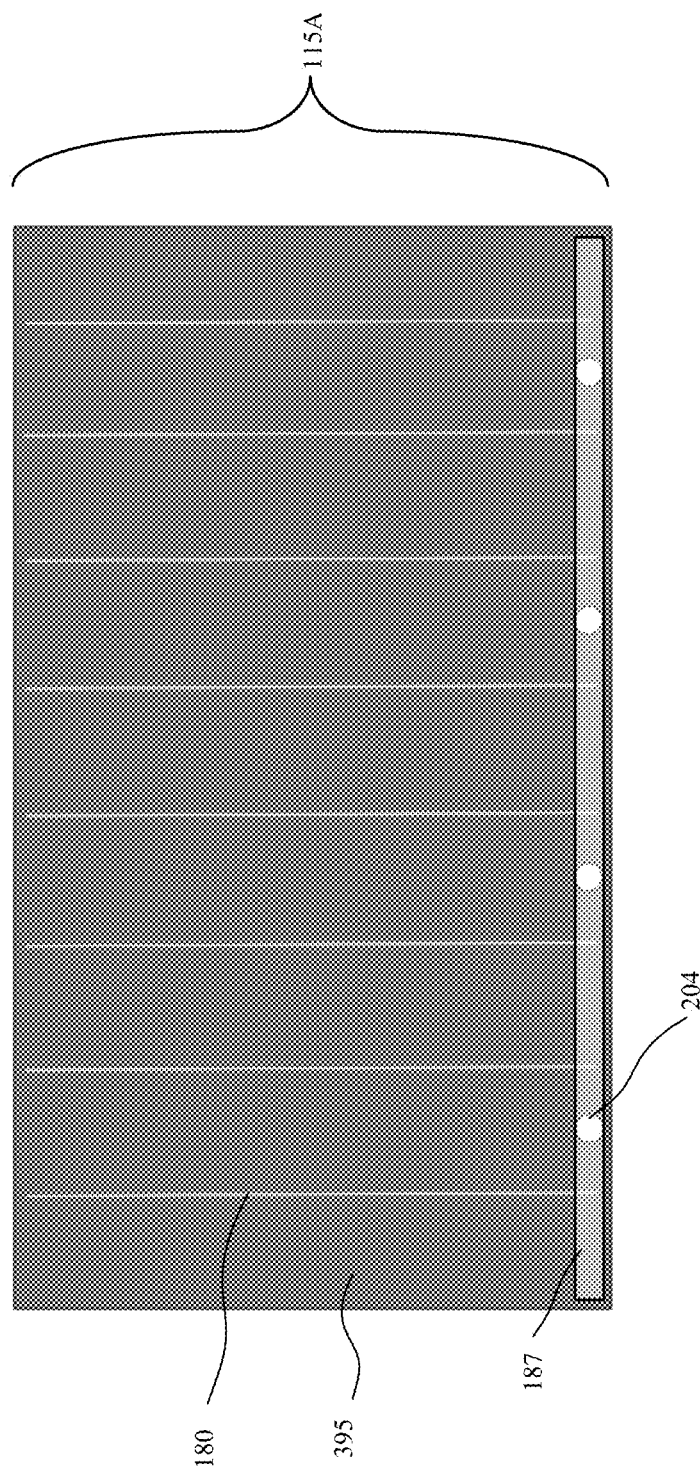
FIG. 14C is a schematic top view illustration of an exemplary solar cell module in accordance with another variation.

In reference to FIGS. 14B-14C, FIG. 14B illustrates a schematic top view of a first tandem solar cell 115A with a plurality of slits/slots; FIG. 14C illustrates a schematic top view of a first tandem solar cell 115A with a plurality of vias. The embodiments described in FIGS. 14B-14C are similar to the embodiments described in FIG. 3A and FIG. 14A in that a top side of the first tandem solar cell 115A can be bonded to a back side of a second tandem solar cell (e.g., second tandem solar cell 115B) to form a solar cell module. However, rather than a step surface and its corresponding support structure (e.g., electrically conductive support 186, etc.) that continuously spans a step surface of the solar cell as depicted in FIG. 3A, FIGS. 14B-14C include a plurality of slits/slots and vias, respectively, that can be intermittently positioned at various intervals along an edge of the solar cell. In this way, the embodiments depicted in FIGS. 14B-14C can provide the same or an even greater amount of structural support as the embodiments depicted in FIG. 3A and FIG. 14A, but also introduce less shorting paths to the back side of the silicon subcell. In reference to FIGS. 14B-14C, the plurality of slits/slots 202 or vias 204 can be formed to approximate the dimensions of the step edge 194 and step floor 195 described in FIG. 14A and can then be filled with the same insulators and metallizations described herein to form the support structures (e.g., electrically conductive support 186, etc.). Further, an additional busbar, busbar 187, can be applied (e.g., screen-printed, sputtered, etc.) to an area over the slits/slots 202 or vias 204 as depicted in FIGS. 14B-14C in order to facilitate an electrical connection between the individual slits/slots 202 and vias 204 to the fingers on the solar cell.

Figure 15:
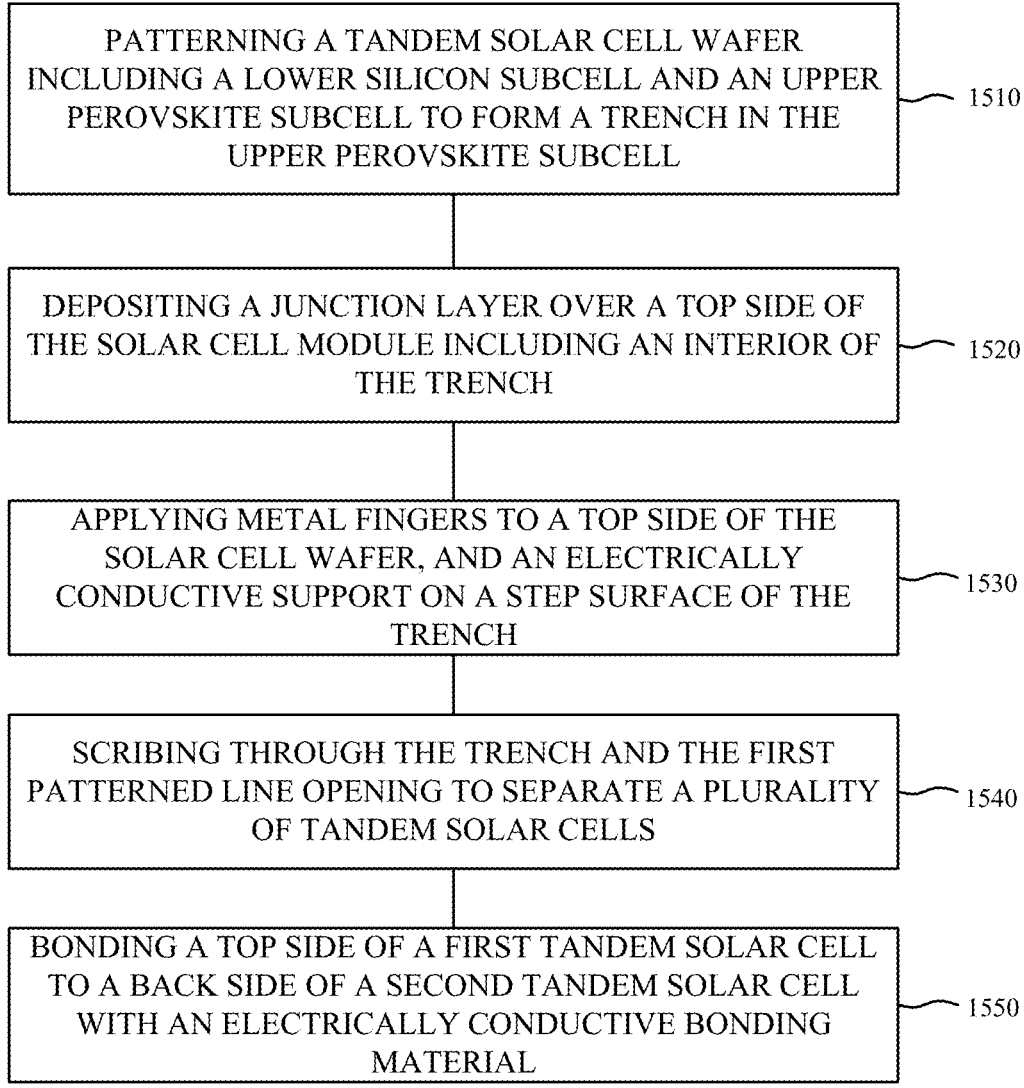
FIG. 15 is a flow chart of a method of forming an exemplary solar cell module with a pair of overlapped solar cells in accordance with an embodiment.
Figure 16A:
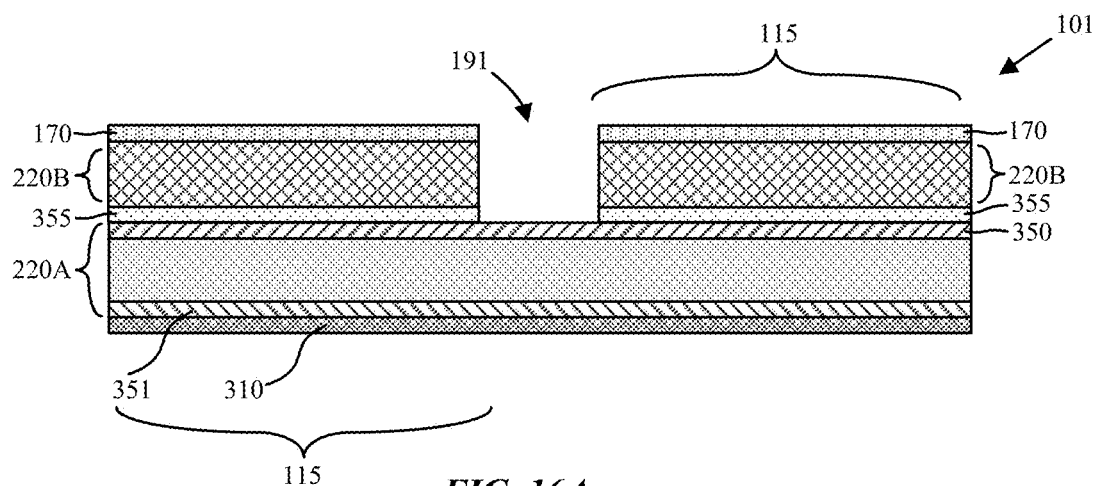
FIGS. 16A-16E are schematic cross-sectional side view illustrations of a method of forming an exemplary solar cell module with a pair of overlapped solar cells in accordance with an embodiment.
Figure 16B:
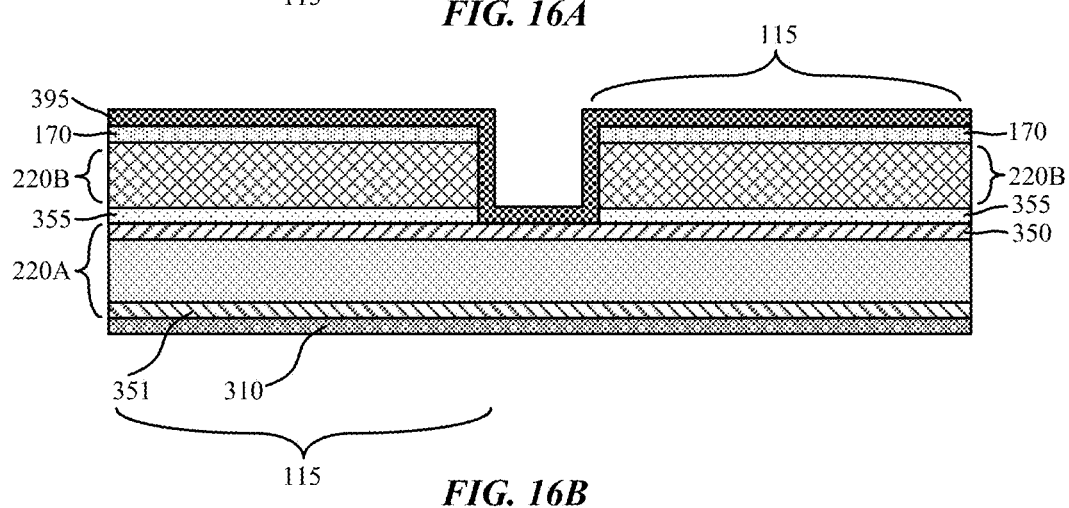
Figure 16C:
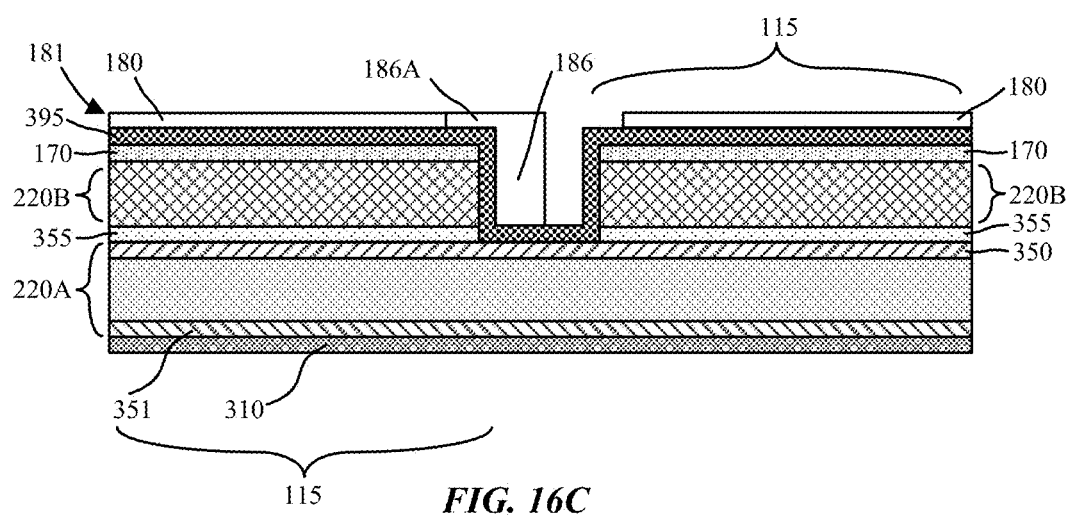
Figure 16D:
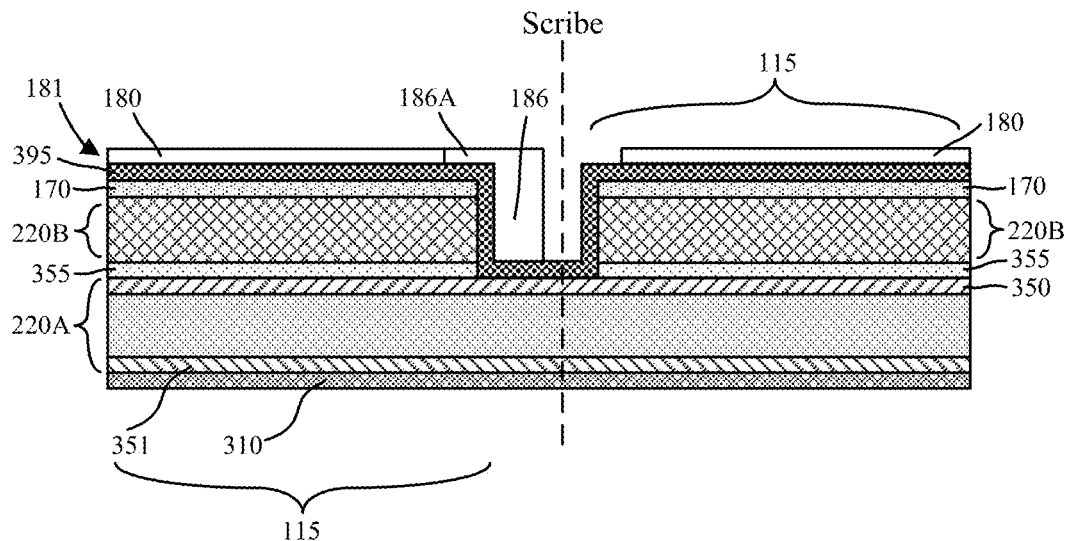
Figure 16E:
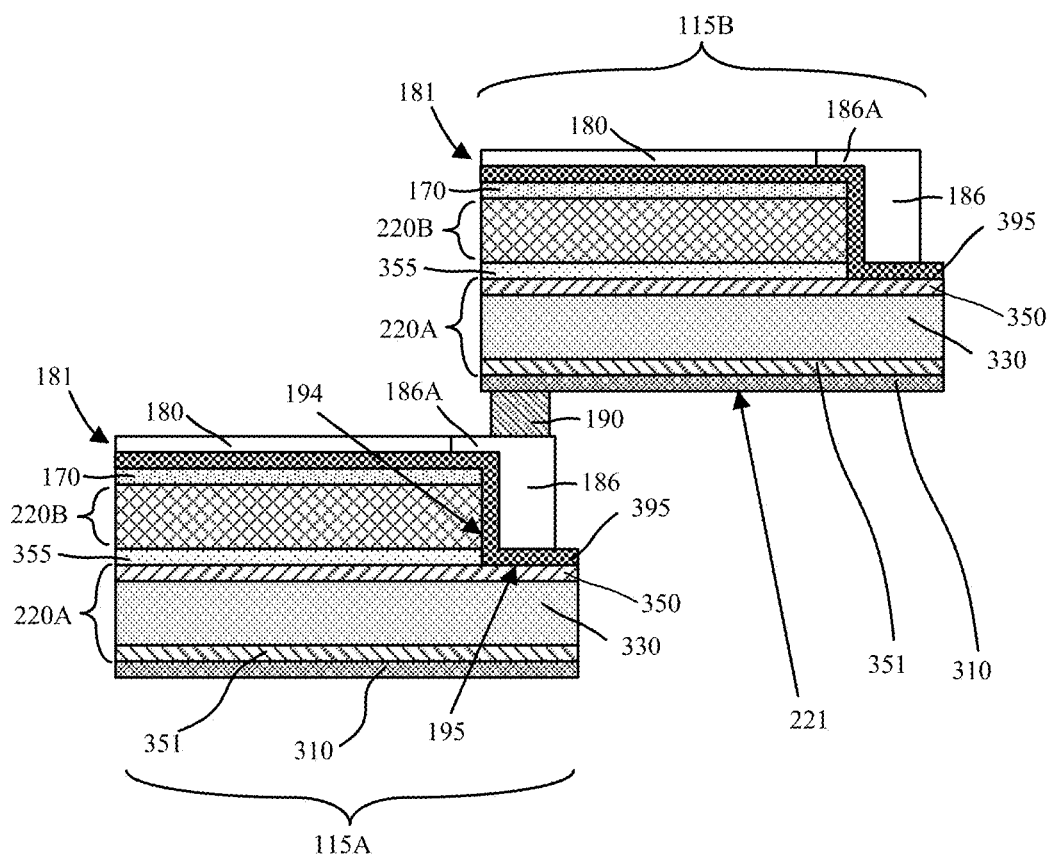

FIG. 15 is a flow chart and FIGS. 16A-16E are schematic cross-sectional side view illustrations of a method of forming exemplary solar cell module 100 according to the embodiment in FIG. 14A. In the interest of clarity and conciseness, the method of FIG. 15 is described concurrently with the illustrations of FIGS. 16A-16E. As shown in FIG. 16A, the process sequence can begin at operation 1510 with a portion of the conductive recombination layer 355, the upper perovskite subcell 220B and the transparent top electrode layer 170 patterned to form a trench 191, exposing a portion of a lower silicon subcell 220A, and in particular the n-doped silicon layer 350 of the lower silicon subcell 220A, which may be wafer-scale. For example, patterning can be done by lithography or shadow masking during deposition, or by laser patterning post deposition, etc. and combinations thereof. At operation 1520, FIG. 16B shows the deposition of a junction layer 395, such as a p-type oxide layer, to coat a top side of the solar cell wafer 101 as well as an interior of the trench 191. More specifically, the junction layer 395 may be formed directly on the n-type silicon layer 350 of the lower silicon subcell 220A. In operation 1530, FIG. 16C shows the formation of a top metal pattern 181 including a plurality of metal finger 180 electrodes spanning over a top side of the solar cell wafer 101, a top portion 186A of the electrically conductive support 186 that connects the metal finger 180 electrodes of the top metal pattern 181, and the electrically conductive support 186 along a sidewall of the trench 191, which will become the step edge 194 of the step surface. As previously described the electrically conductive support 186 may completely or partially fill a width of the trench 191, and may preferably be formed along the sidewall that will become the step edge 194. In operation 1540, FIG. 16D shows the tandem solar cell wafer 101 being scribed/broken or otherwise caused to separate (e.g., thermal laser separation, etc.) along an axis that passes through the trench. As a result of the scribing/breaking, the full tandem solar cell wafer 101 separates into multiple tandem solar cells 115. Similar to the previous description of FIGS. 7D-7E, the location of the scribe line may have an impact on the structure of the left sides of the tandem solar cells 115. For example, if the scribe line were to proceed through a center of the trench 191 it is foreseeable that a step surface can also exist on the left-hand side of the tandem solar cells 115. At operation 1550, a top side of a first tandem solar cell 115A (lower solar cell) and a back side of a second tandem solar cell 115B (upper solar cell) are bonded with an electrically conductive bonding material 190, as shown in FIG. 16E.

FIG. 16F illustrates a process variation of the method for forming an exemplary solar cell module 100 according to the embodiment of FIG. 14A. The example of FIG. 16F differs from operation 1530 (as illustrated in FIG. 16C) in that the process variation illustrated in FIG. 16F includes an electrically conductive support 186 that fills the entirety of trench 191 and spans across the entirety of trench 191 so that electrically conductive support 186 comes into contact with both sets of metal finger 180 electrodes on either side of trench 191. In addition, FIG. 16F differs from operation 1540 (as illustrated in FIG. 16D) in that the process variation illustrated in FIG. 16F includes a scribe centered on trench 191 to create a step surface and its corresponding support structure on either side of the scribe.

FIG. 16G illustrates a full tandem solar cell wafer 101 that includes junction layer 395, metal finger 180 electrodes, electrically conductive support 186, as well as scribes S1-S5. In the example of FIG. 16G, scribes S1, S3 and S5 cut through the center of electrically conductive support 186 in a manner similar to the example illustrated in FIG. 16F. In addition, metal finger 180 electrodes can be patterned to include a gap so that additional scribes (e.g., scribe S2, scribe S4, etc.) can pass through the gap. For example, FIG. 16H illustrates a closeup view of section A of FIG. 16G, in which top metal pattern 181 includes gap G1 so that scribe S4 can cut through gap G1.

Figure 17:
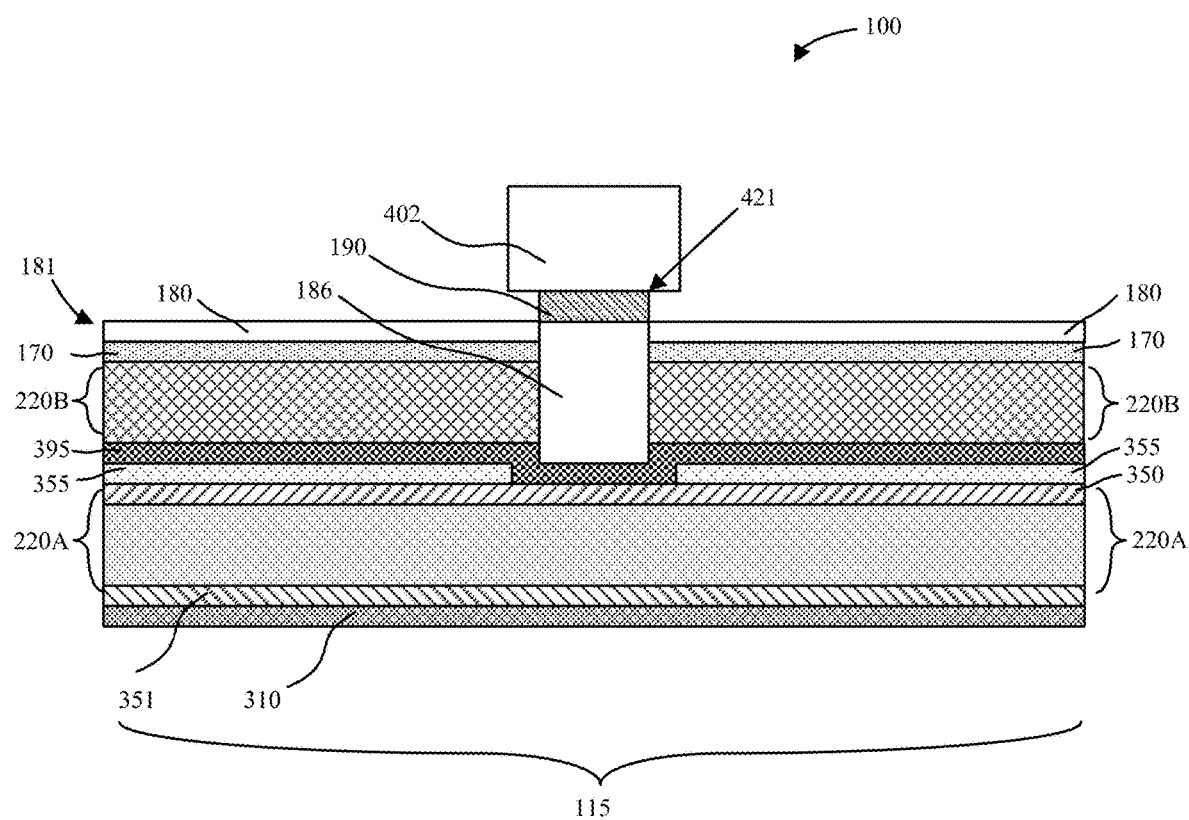
FIG. 17 is a schematic cross-sectional side view illustration of an exemplary solar cell module with a ribbon connection in accordance with an embodiment.

Referring now to FIG. 17, a schematic cross-sectional side view illustration is provided for a solar cell 115 in accordance with an embodiment. The embodiment is similar to other embodiments described herein in that a portion of the upper perovskite subcell is patterned to form a trench which is then at least partially filled with an electrically conductive support in order to provide a more robust mechanical connection between solar cells where solar cells are connected by metal ribbon or wiring. In some aspects, as the number of interconnects between cells increases, wire connections may be more advantageous than ribbon connections. In addition, wired connections may also reduce losses off angle. In addition, the embodiment described in FIG. 17 is substantially similar to the embodiment described in FIG. 14A in that both embodiments include bypass diodes to reduce shunting.

As shown, solar cell module 100 includes ribbon/wire 402 bonded to a top side of tandem solar cell 115 with an electrically conductive bonding material 190. Further, tandem solar cell 115 includes a lower silicon subcell 220A and an upper perovskite subcell 220B. The recombination layer 355 is patterned with a first patterned line opening through the recombination layer to expose the lower silicon subcell 220A. In the illustrated embodiment, a junction layer 395 of a first conductivity type spans over the recombination layer 355 and is directly on a portion of the lower silicon subcell 220A exposed by the patterned line opening. The upper perovskite subcell 220B is formed over the junction layer and patterned to form a trench that exposes the junction layer. As shown, an electrically conductive support 186 is formed within the trench and on the junction layer 395. In an embodiment, the ribbon/wire 402 is bonded to the electrically conductive support 186 with an electrically conductive bonding material 190. In the illustrated embodiment, the electrically conductive support may be completely laterally inside the opening of the first patterned line opening (when viewed from above).

Similar to the description of FIG. 14A, a diode is formed at the interface of the junction layer 395 and the lower silicon subcell 220A, or more particularly to n-doped layer 350 of the lower silicon subcell 220A. In such an arrangement, the junction layer 395 may then be an n-type material, though the conductivity/dopant types of the layers may be reversed.

Still referring to FIG. 17, the tandem solar cell 115 may additionally include a transparent top electrode layer 170 located over the upper perovskite subcell 220B, and a top metal pattern 181 that includes a plurality of metal finger 180 electrodes and the electrically conductive support 186, which can be formed simultaneously or separately in multiple operations over the transparent top electrode layer 170. In this way, the electrically conductive support 186 can function as a busbar in that the electrically conductive support 186 spans across/over the tandem solar cells and provides an interconnection between metal finger 180 electrodes of the top metal pattern 181. Further, the back side 421 of ribbon/wire 402 can be bound to the top metal pattern 181, or more particularly to the electrically conductive support 186, with the electrically conductive bonding material 190. In this way, rather than "stacking" solar cells, the ribbon/wire connection described can leverage the robust mechanical connection between the electrically conductive support 186 and the electrically conductive bonding material 190, which is positioned directly above the electrically conductive support 186, so as to reduce or absorb any stress placed on the perovskite subcells during assembly or handling.

Figure 18:
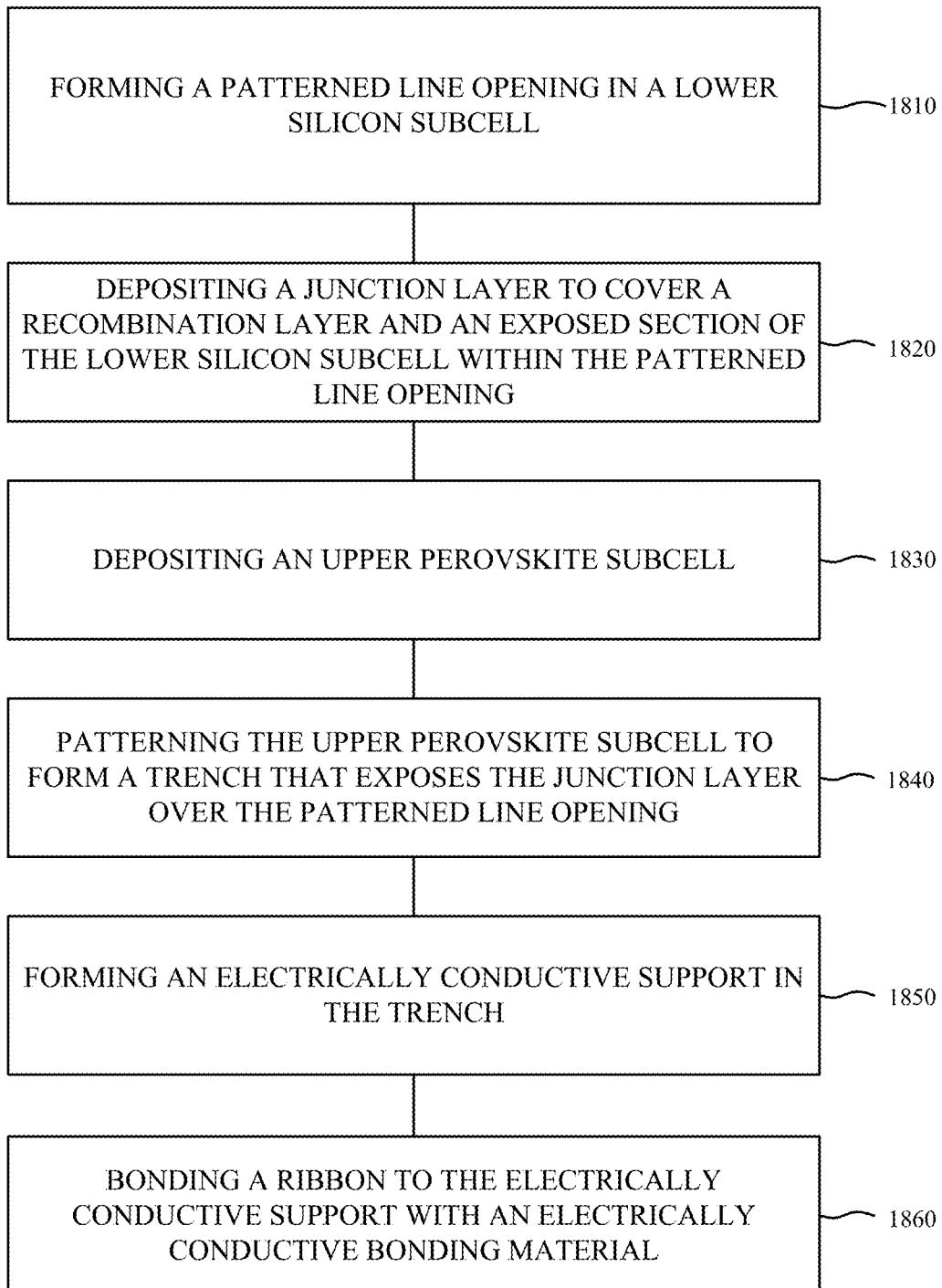
FIG. 18 is a flow chart of a method of forming an exemplary solar cell module with a ribbon connection in accordance with an embodiment.
Figure 19A:
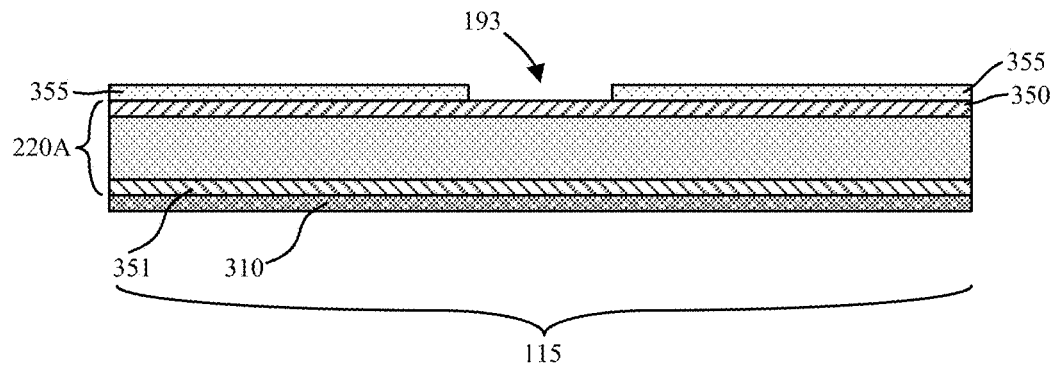
FIGS. 19A-19F are schematic cross-sectional side view illustrations of a method of forming an exemplary solar cell module with a ribbon connection in accordance with an embodiment.
Figure 19B:
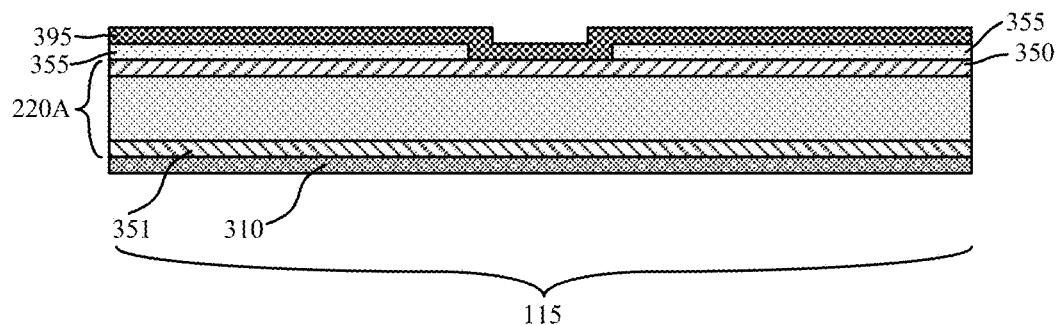
Figure 19C:
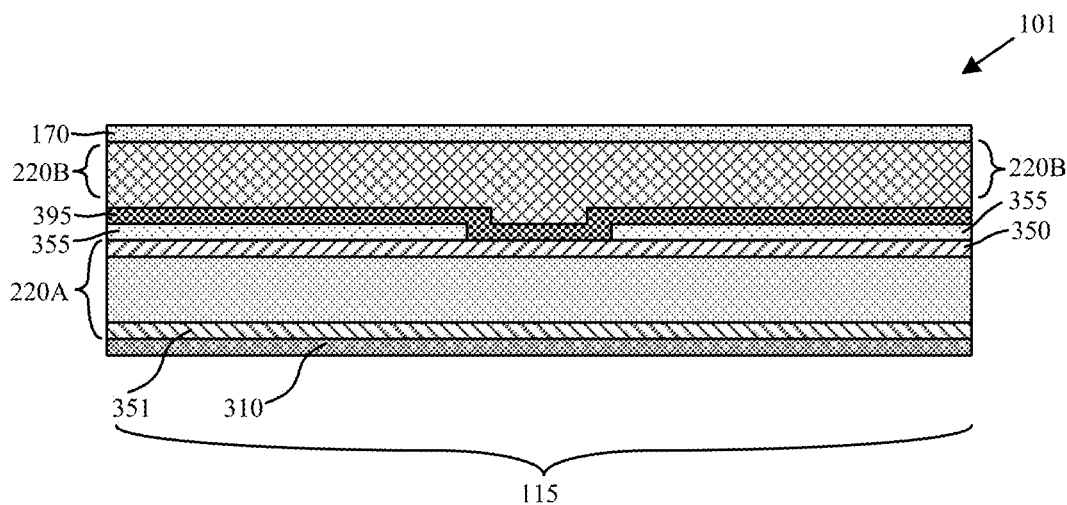
Figure 19D:
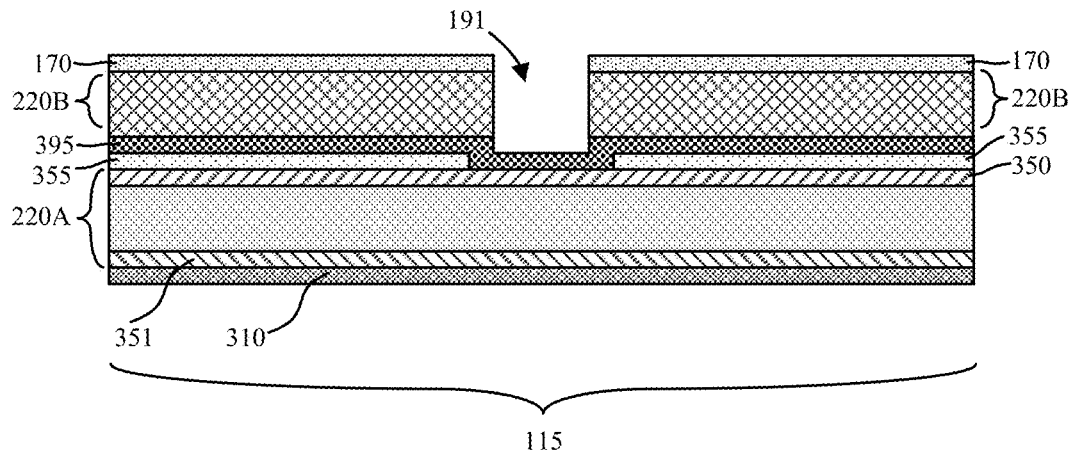
Figure 19E:
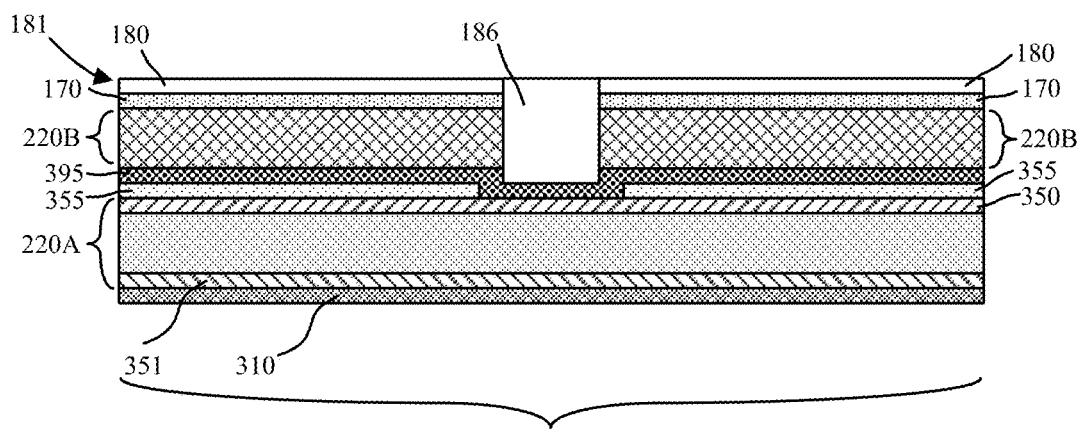
Figure 19F:
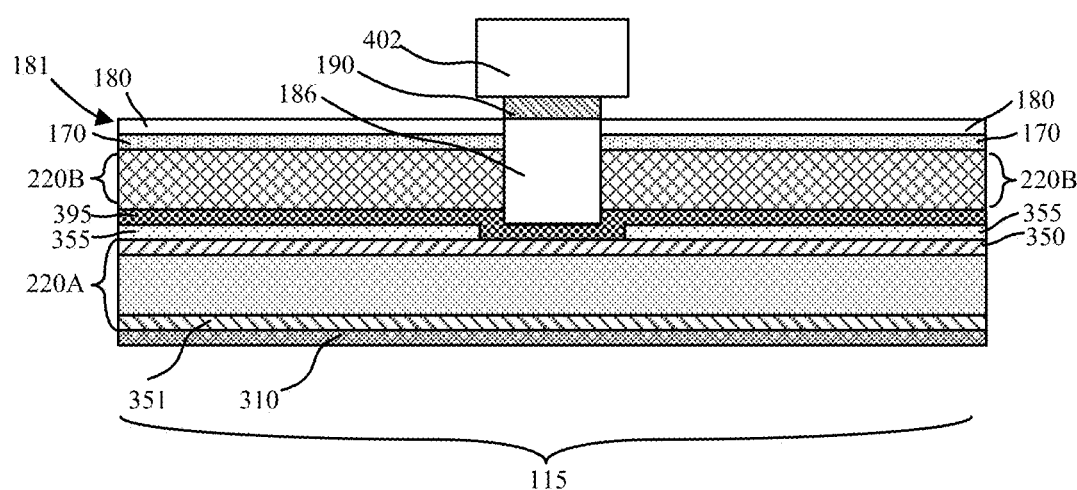

FIG. 18 is a flow chart and FIGS. 19A-19F are schematic cross-sectional side view illustrations of a method of forming an exemplary solar cell module 100 according to the embodiment in FIG. 17. In the interest of clarity and conciseness, the method of FIG. 18 is described concurrently with the illustrations of FIGS. 19A-19F. At operation 1810, FIG. 19A shows the formation of a patterned line opening 193 in a conductive recombination layer 355 in order to expose the lower silicon subcell 220A, or more particularly the n-type silicon layer 350 of the lower silicon subcell 220A. At operation 1820, FIG. 19B shows the deposition of the junction layer 395, such as a p-type metal oxide layer, that spans a top surface of the solar cell, including an interior of the patterned line opening 193 so that the junction layer 395 contacts the n-doped silicon layer 350 of the first lower silicon subcell 220A in order to form a diode. In operation 1830, FIG. 19C shows the deposition of the upper perovskite subcell 220B and the transparent top electrode layer 170, resulting in a tandem subcell wafer 101. In operation 1840, FIG. 19D shows patterning of the upper perovskite subcell 220B and a portion of the transparent top electrode layer 170 to form a trench 191, which may expose the junction layer 395. In an embodiment width of trench 191 may be less than a width of patterned line opening 193 so that the trench 191 (and electrically conductive support 186) can be laterally confined within an outline of the patterned line opening 193 (when viewed from above). In operation 1850, FIG. 19E shows the deposition of the electrically conductive support 186 into the trench 191. The electrically conductive support 186 may be a part of a top metal pattern 181 including a plurality of metal finger 180 electrodes spanning over the top perovskite subcell 220B. In some embodiments, the electrically conductive support 186 may come into direct contact with the upper perovskite subcell 220B. In such embodiments, the electrically conductive support 186 can be formed of a material(s) that do not react with the tandem solar cell layers, such as carbon or a carbon/polymer blend, printed ITO nanoparticles or other TCO nanoparticles. In other embodiments, an additional barrier may be deposited between the electrically conductive support 186 and the upper perovskite subcell 220B to passivate the upper perovskite subcell 220B. Further, in operation 1860, FIG. 19F shows the back side 421 of ribbon/wire 402 bonded to the electrically conductive support 186 with the electrically conductive bonding material 190.

Figure 20:
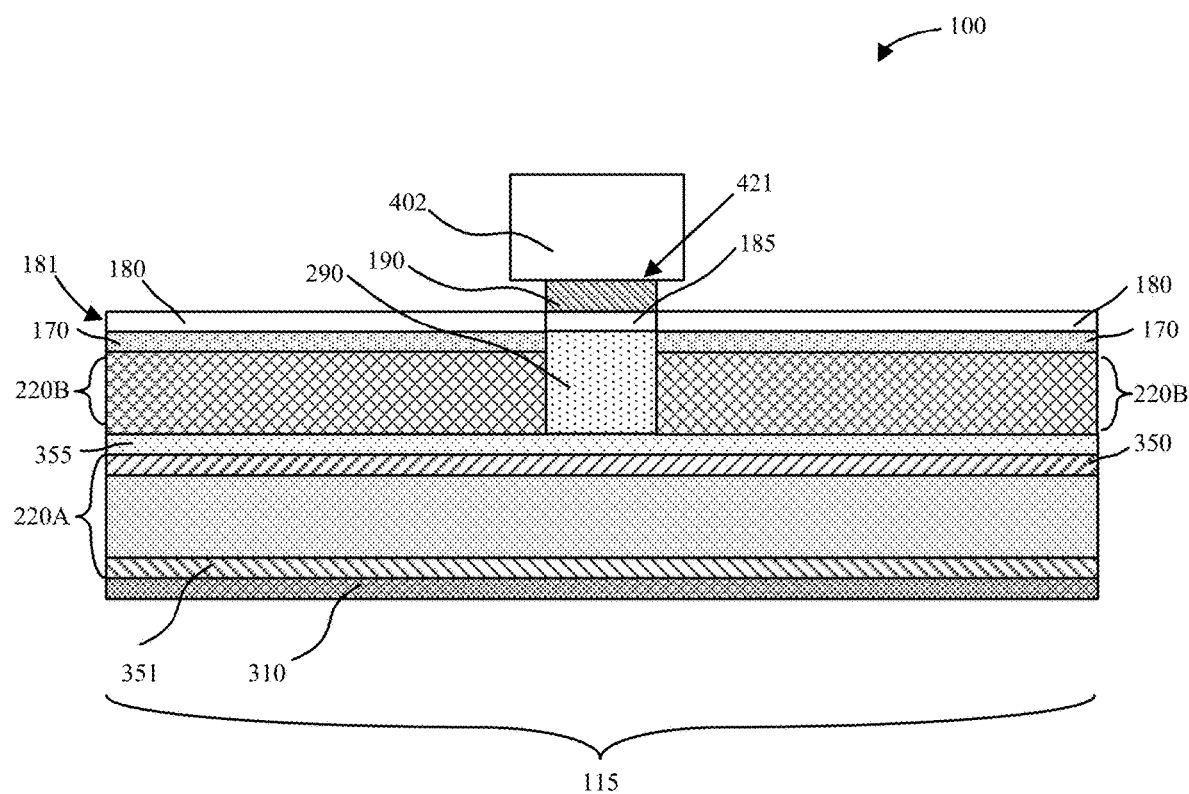
FIG. 20 is a schematic cross-sectional side view illustration of an exemplary solar cell module with a ribbon connection in accordance with an embodiment.

Referring now to FIG. 20, a schematic cross-sectional side view illustration is provided for a tandem solar cell 115 in accordance with an embodiment. The example of FIG. 20 is substantially similar to the example described in FIG. 17, with one difference being the formation of an insulator support to function as a support structure in the trench of the tandem solar cell rather than an electrically conductive support. In addition, since the insulator support is not electrically conductive the embodiment described in FIG. 20 does not include a junction layer to prevent shunting. The embodiment illustrated in FIG. 20 furthermore is similar to the arrangement of FIG. 5A, though designed for ribbon/wire attachment rather than overlapping tandem solar cells. As shown, tandem solar cell 115 includes a lower silicon subcell 220A, and an upper perovskite subcell 220B, a trench formed in the upper perovskite subcell 220B, and an insulator support 290 at least partially filling the trench. Furthermore, a top metal pattern 181 may span over the upper perovskite subcell 220B and the insulator support 290. The top metal pattern 181 may include a plurality of metal finger 180 electrodes spanning over the upper perovskite subcell 220B and a busbar 185, that may optionally be substantially located over the insulator support 290. In addition, the tandem solar cell 115 can include a conductive recombination layer 355 located below the upper perovskite subcell 220B, a transparent top electrode layer 170 located over the upper perovskite subcell 220B and underneath the top metal pattern 181. As shown, the back side 421 of ribbon/wire 402 can be bonded to the busbar 185 with an electrically conductive bonding material 190. In this way, rather than "stacking" solar cells, the ribbon/wire connection described can leverage the robust mechanical connection between the insulator support 290 and the electrically conductive bonding material 190, which can be positioned directly above the insulator support 290 so as to reduce or absorb any stresses placed on the perovskite subcells during assembly or handling.

Figure 21:
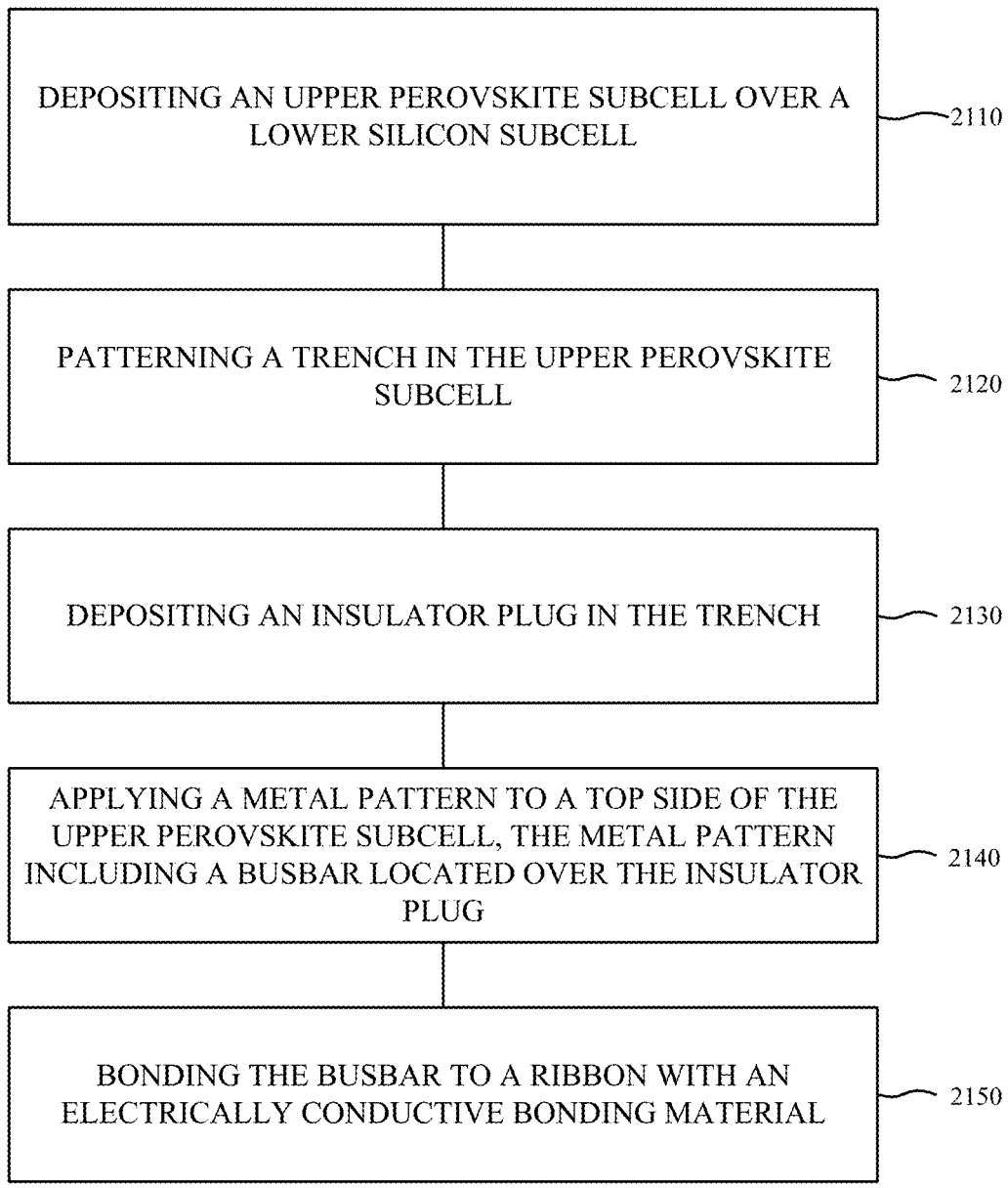
FIG. 21 is a flow chart of a method of forming an exemplary solar cell module with a ribbon connection in accordance with an embodiment.
Figure 22A:
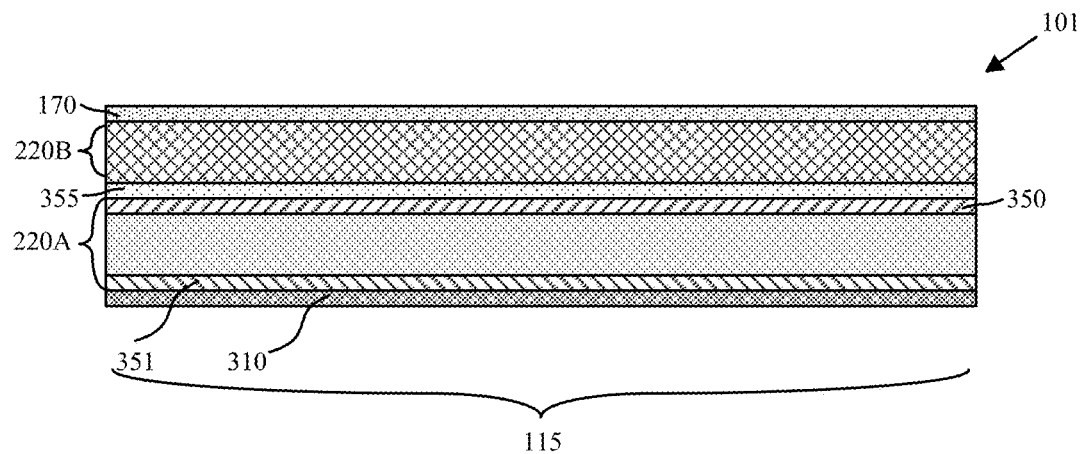
FIGS. 22A-22E are schematic cross-sectional side view illustrations of a method of forming an exemplary solar cell module with a ribbon connection in accordance with an embodiment.
Figure 22B:
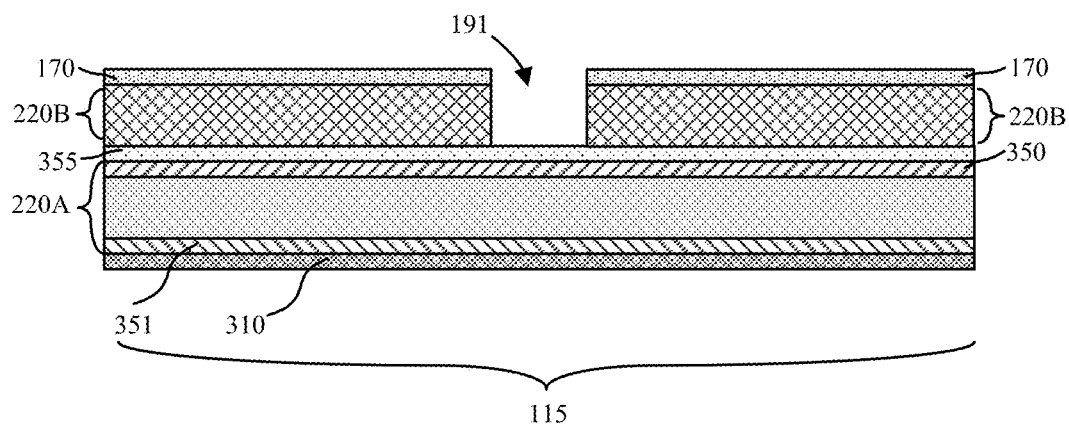
Figure 22C:
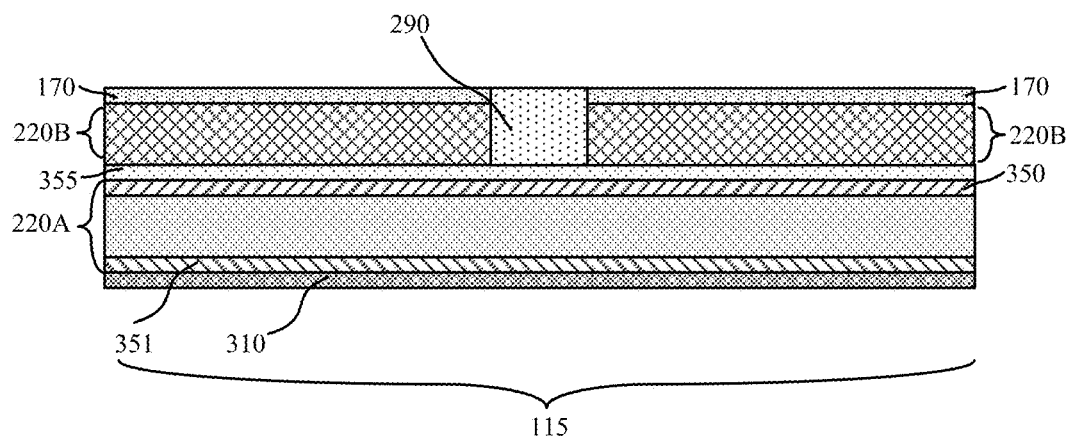
Figure 22D:
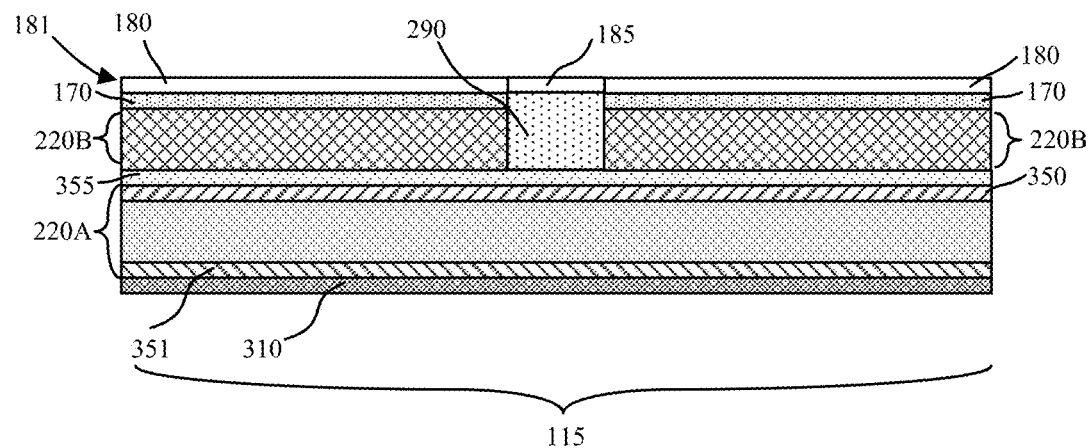
Figure 22E:
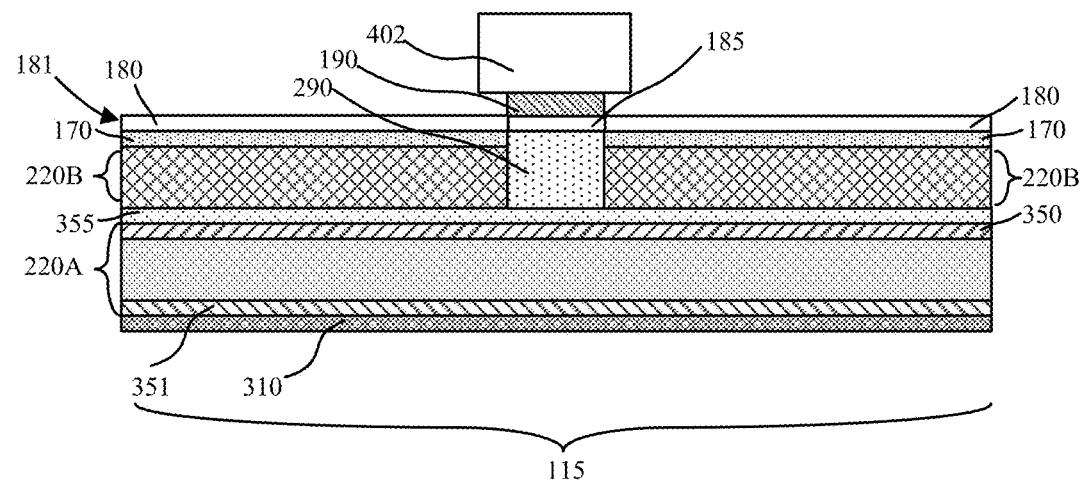

FIG. 21 is a flow chart and FIGS. 22A-22E are schematic cross-sectional side view illustrations of a method of forming an exemplary solar cell module 100 according to the embodiment in FIG. 20. In the interest of clarity and conciseness, the method of FIG. 21 is described concurrently with the illustrations of FIGS. 22A-22E. At operation 2110, FIG. 22A shows the deposition of the upper perovskite subcell 220B and the transparent top electrode layer 170, forming tandem solar cell wafer 101. At operation 2120, FIG. 22B shows patterning of a trench 191 in the upper perovskite subcell 220B that exposes the conductive recombination layer 355. In other embodiments, the conductive recombination layer 355 can be additionally removed, exposing the n-type layer 350 of the lower silicon subcell 220A. In operation 2130, FIG. 22C shows the deposition of the insulator support 290 into the trench. In some embodiments, the insulator support can be level with or slightly above the level of the perovskite subcell 220B. In operation 2140, FIG. 22D shows the deposition of a top metal pattern 181 including metal finger 180 electrodes and busbar 185 over the transparent top electrode layer 170 and insulator support 290, respectively. In operation 2150, FIG. 22E shows the back side 421 of ribbon/wire 402 bonded to the busbar 185 with the electrically conductive bonding material 190 as previously described.

Figure 23:
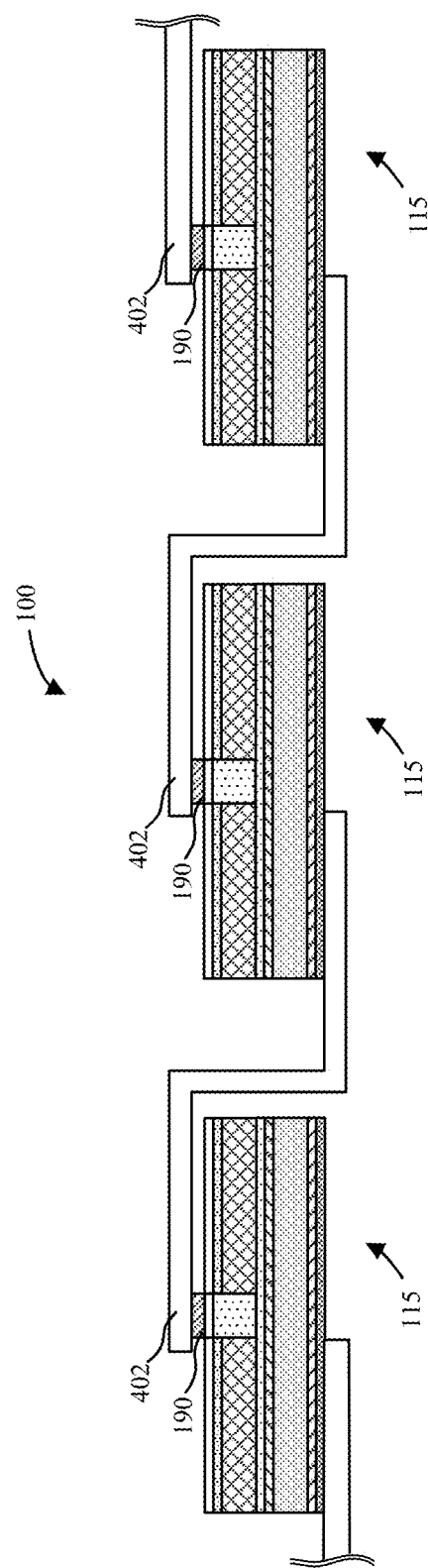
FIG. 23 is a schematic cross-sectional side view illustration of an exemplary solar cell module including a plurality of serially connected solar cells in accordance with an embodiment.

FIG. 23 is a schematic cross-sectional side view illustration of a solar module 100 including a plurality of tandem solar cells 115 serially connected with ribbons/wires 402 in accordance with an embodiment. For convenience, the solar module 100 of FIG. 23 illustrates serially connected solar cell module 100 of FIG. 20, however it is to be appreciated that this is merely exemplary and that the solar module 100 can include any of the solar cell modules described herein connected with ribbons/wires 402, such as FIG. 17. Further, in practice, ribbons/wires 402 and their associated support structures (e.g., insulator support 290, electrically conductive support 186, etc.) would be aligned parallel to each another, but for simplicity FIG. 23 shows ribbons/wires 402 and their associated support structures aligned orthogonally to each another. As shown, the tandem solar cells 115 are connected front to back with serial connection between the electrically conductive bonding material 190 and back side contact 310 (bottom electrode layer) by way of ribbon/wire 402. In one embodiment, ribbons/wires 402 can be coated with an electrically conductive thermoplastic or thermoset that is melted/bonded at low temperature to hold and make contact with the metallization of the solar cell module. In another embodiment, ribbons/wires 402 can be coated with an insulating thermoplastic or thermoset adhesive that, when the ribbons/wires are heated and pressed, can make ohmic contact with the metallization and can then be held in place when the adhesive sets.

Figure 24A:
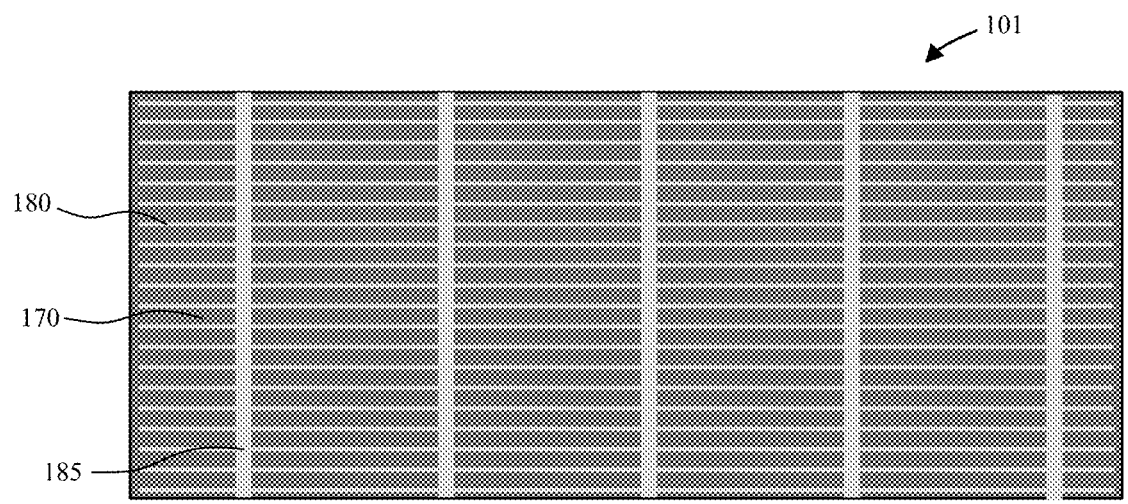
FIG. 24A a schematic top view illustration of an exemplary solar cell wafer in accordance with an embodiment.
Figure 24B:
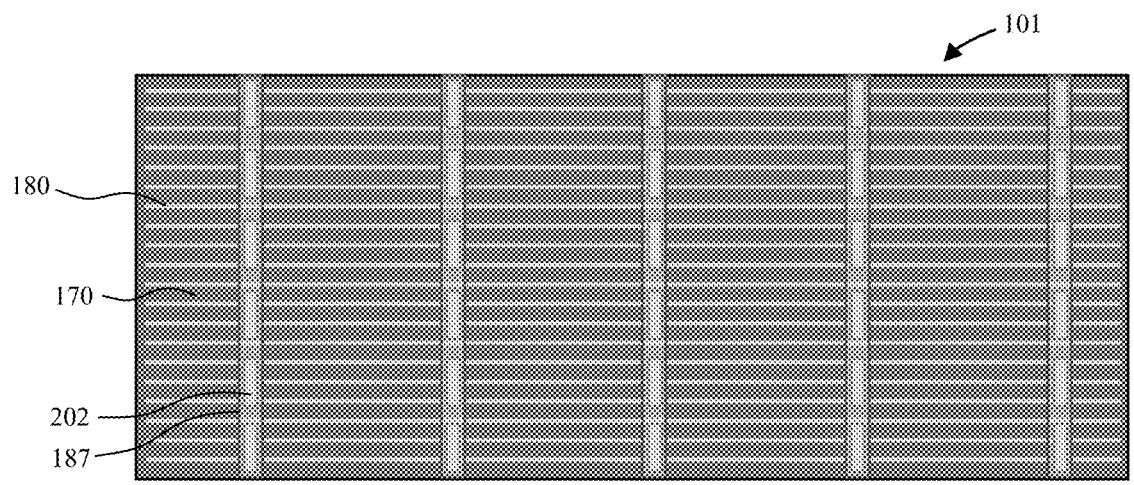
FIG. 24B is a schematic top view illustration of an exemplary solar cell wafer in accordance with a variation.
Figure 24C:
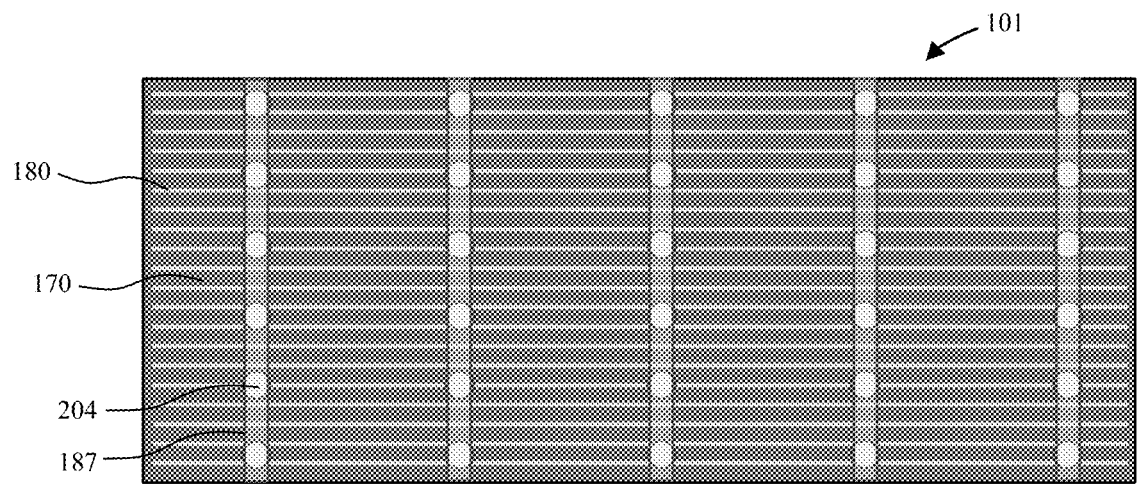
FIG. 24C is a schematic top view illustration of an exemplary solar cell wafer in accordance with another variation.

FIG. 24A is a top view of an exemplary solar cell wafer 101 in accordance with the embodiments illustrated in FIG. 17 and FIG. 20. FIG. 24A includes a top electrode layer 170, metal finger 180 electrodes and busbars 185. Further, FIGS. 24B-24C illustrate variations on the embodiment illustrated in FIG. 24A. For example, rather than a trench and its corresponding support structure (e.g., insulator support 290, electrically conductive support 186, etc.) that can be located along the top surface of solar cell wafer 101 in a continuous manner, FIGS. 24B-24C include a plurality of slits/slots and vias, respectively, that can be located at various intervals along the top surface of the solar cell wafer 101 in an intermittent manner. In further reference to FIGS. 24B-24C, the plurality of slits/slots 202 or vias 204 can be formed to approximate the dimensions of trench 191 in FIG. 19D and FIG. 22B and can then be filled with the same insulators and metallizations described herein to form the support structures (e.g., insulator support 290, electrically conductive support 186, etc.). Further, an additional busbar, busbar 187, can be applied (e.g., screen-printed, sputtered, etc.) to an area over the slits/slots 202 or vias 204 as depicted in FIGS. 24B-24C in order to facilitate an electrical connection between the individual slits/slots 202 and vias 204.

In each of the above embodiments tandem solar cells are either stacked or a ribbon/wire is bonded using an electrically conductive bonding material. As previously described this may help avoid exposure of the perovskite material to high temperature processes. Solder materials can also be reflowed at lower temperatures, for example with focused laser or ultraviolet (UV) exposure. Furthermore, it is envisioned that the various described support structure configurations may not only help absorb stress, but also can absorb heat, allowing use of higher temperature bonding materials, including solder. In some embodiments, the electrically conductive bonding material described with the above embodiments may be replaced with another suitable electrically conductive bonding material, such as solder.

In utilizing the various aspects of the embodiments, it would become apparent to one skilled in the art that combinations or variations of the above embodiments are possible for forming a solar cell module with overlapping tandem solar cells or tandem solar cells connected by ribbons/wires. While embodiments have been described herein with regard to silicon-perovskite tandem solar cells, this is exemplary, and embodiments can be applied to alternative tandem solar cell compositions. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A solar cell module comprising:
   a tandem solar cell including:
      a lower silicon subcell;
      an upper perovskite subcell;
      a plurality of intermittent trenches in the upper perovskite subcell;
      a plurality of intermittent insulator supports, each intermittent insulator support at least partially filling a corresponding intermittent trench; and
      a top metal pattern spanning over the upper perovskite subcell and the plurality of intermittent insulator supports; and
   a ribbon or wire bonded to the top metal pattern with an electrically conductive bonding material, the electrically conductive bonding material positioned substantially over the plurality of intermittent insulator supports.

2. The solar cell module of claim 1, further comprising a recombination layer between the lower silicon subcell and the upper perovskite subcell.

3. The solar cell module of claim 1, further comprising a transparent top electrode layer over the upper perovskite subcell.

4. The solar cell module of claim 1, wherein the top metal pattern spans over a transparent top electrode layer, the top metal pattern including a plurality of metal finger electrodes and a busbar.

5. The solar cell module of claim 4, wherein the electrically conductive bonding material includes an electrically conductive adhesive layer, an electrically conductive tape, or a low-temperature solder paste.

6. The solar cell module of claim 5, wherein the ribbon or wire serially connects the tandem solar cell to another tandem solar cell.

7. The solar cell module of claim 1, wherein the plurality of intermittent trenches is a plurality of slits or slots located intermittently along a top surface of the tandem solar cell.

8. The solar cell module of claim 1, wherein the plurality of intermittent trenches is a plurality of vias located intermittently along a top surface of the tandem solar cell.

9. The solar cell module of claim 1, wherein the upper perovskite subcell includes a perovskite absorber layer, and each intermittent insulator support completely fills a volume of its corresponding intermittent trench covering the perovskite absorber layer and below.

10. A method for processing a solar cell module comprising:
    patterning a plurality of intermittent trenches in an upper perovskite subcell, the upper perovskite subcell located over a lower silicon subcell;
    depositing a plurality of intermittent insulator supports, each intermittent insulator support at least partially filling a corresponding intermittent trench;
    applying a top metal pattern to a top side of the upper perovskite subcell and the plurality of intermittent insulator supports; and
    bonding a ribbon or wire to the top metal pattern with an electrically conductive bonding material, the electrically conductive bonding material positioned substantially over the plurality of intermittent insulator supports.

11. The method of claim 10, wherein the top metal pattern includes a plurality of metal finger electrodes and a busbar located over the plurality of intermittent insulator supports, and bonding the ribbon or wire to the top metal pattern comprises bonding the ribbon or wire to the busbar with the electrically conductive bonding material.

* * * * *